(12) United States Patent
Sato et al.

(10) Patent No.: US 12,376,312 B1
(45) Date of Patent: Jul. 29, 2025

(54) METHODS OF FABRICATING PLANAR CAPACITORS ON A SHARED PLATE ELECTRODE

(71) Applicant: Kepler Computing Inc., San Francisco, CA (US)

(72) Inventors: Noriyuki Sato, Hillsboro, OR (US); Tanay Gosavi, Portland, OR (US); Rafael Rios, Austin, TX (US); Amrita Mathuriya, Portland, OR (US); Niloy Mukherjee, San Ramon, CA (US); Mauricio Manfrini, Heverlee (BE); Rajeev Kumar Dokania, Beaverton, OR (US); Somilkumar J. Rathi, San Jose, CA (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 549 days.

(21) Appl. No.: 17/655,433

(22) Filed: Mar. 18, 2022

Related U.S. Application Data

(63) Continuation of application No. 17/654,917, filed on Mar. 15, 2022.

(51) Int. Cl.
*H10B 53/50* (2023.01)
*H10D 1/68* (2025.01)
(Continued)

(52) U.S. Cl.
CPC ............ *H10B 53/50* (2023.02); *H10D 1/682* (2025.01); *H10D 1/684* (2025.01); *H10D 1/688* (2025.01);
(Continued)

(58) Field of Classification Search
CPC ........ H10B 53/50; H10B 51/00; H10B 63/82; H01L 28/55; H01L 28/56; H10N 70/8836;
(Continued)

(56) References Cited

U.S. PATENT DOCUMENTS 5,086,412 A    2/1992   Jaffe et al.
5,539,279 A    7/1996   Takeuchi et al.
(Continued)

FOREIGN PATENT DOCUMENTS

JP    H0982907 A    3/1997
JP    H10242426 A    9/1998
(Continued)

OTHER PUBLICATIONS

D. Takashima and I. Kunishima, "High-density chain ferroelectric random access memory (chain FRAM)," in IEEE Journal of Solid-State Circuits, vol. 33, No. 5, pp. 787-792, May 1998, doi: 10.1109/4.668994. (Year: 1998).*

(Continued)

*Primary Examiner* — Ratisha Mehta
*Assistant Examiner* — Brad A Knudson
(74) *Attorney, Agent, or Firm* — MUGHAL GAUDRY & FRANKLIN PC

(57) ABSTRACT

A device structure comprises a first conductive interconnect, an electrode structure on the first conductive interconnect, an etch stop layer laterally surrounding the electrode structure; a plurality of memory devices above the electrode structure, where individual ones of the plurality of memory devices comprise a dielectric layer comprising a perovskite material. The device structure further comprises a plate electrode coupled between the plurality of memory devices and the electrode structure, where the plate electrode is in direct contact with a respective lower most conductive layer of the (Continued)

individual ones of the plurality of memory devices. The device structure further includes an insulative hydrogen barrier layer on at least a sidewall of the individual ones of the plurality of memory devices; and a plurality of via electrodes, wherein individual ones of the plurality of via electrodes are on a respective one of the individual ones of the plurality of memory devices.

21 Claims, 42 Drawing Sheets

(51) Int. Cl.
*H10N 70/00* (2023.01)
*H10N 79/00* (2023.01)
*G11C 11/22* (2006.01)
*H10B 63/00* (2023.01)

(52) U.S. Cl.
CPC ............. *H10D 1/696* (2025.01); *H10D 1/711* (2025.01); *H10N 70/8836* (2023.02); *H10N 79/00* (2023.02); *G11C 11/221* (2013.01); *H10B 63/82* (2023.02)

(58) Field of Classification Search
CPC ........ H10N 79/00; H10D 1/682; H10D 1/684; H10D 1/688; H10D 1/71; H10D 1/69; H10D 1/711
See application file for complete search history.

(56) References Cited

U.S. PATENT DOCUMENTS

| | | | |
|---|---|---|---|
| 5,739,563 A | 4/1998 | Kawakubo et al. | |
| 6,180,976 B1* | 1/2001 | Roy | H01L 28/55 438/149 |
| 6,365,927 B1* | 4/2002 | Cuchiaro | H01L 28/55 257/295 |
| 6,368,910 B1 | 4/2002 | Sheu et al. | |
| 6,656,301 B2 | 12/2003 | Kirby | |
| 6,798,686 B2 | 9/2004 | Takashima | |
| 6,873,536 B2 | 3/2005 | Komatsuzaki | |
| 6,906,944 B2 | 6/2005 | Takeuchi et al. | |
| 7,075,134 B2 | 7/2006 | Araujo et al. | |
| 7,169,621 B2 | 1/2007 | Hasegawa et al. | |
| 7,405,959 B2 | 7/2008 | Koide et al. | |
| 7,791,922 B2 | 9/2010 | Doumae et al. | |
| 8,300,446 B2 | 10/2012 | Qidwai | |
| 8,865,628 B2 | 10/2014 | Manabe et al. | |
| 9,472,560 B2 | 10/2016 | Ramaswamy et al. | |
| 9,899,085 B1 | 2/2018 | Yan | |
| 10,847,201 B2 | 11/2020 | Manipatruni et al. | |
| 10,998,025 B2 | 5/2021 | Manipatruni et al. | |
| 11,107,516 B1 | 8/2021 | Rabkin et al. | |
| 11,335,391 B1 | 5/2022 | Ocker et al. | |
| 11,482,270 B1 | 10/2022 | Dokania et al. | |
| 2002/0079520 A1 | 6/2002 | Nishihara et al. | |
| 2003/0006439 A1* | 1/2003 | Bailey | H10B 53/30 257/295 |
| 2003/0012984 A1 | 1/2003 | Ueda | |
| 2003/0112650 A1 | 6/2003 | Kang | |
| 2003/0119271 A1* | 6/2003 | Aggarwal | H01L 21/31691 438/575 |
| 2003/0174553 A1 | 9/2003 | Saito et al. | |
| 2004/0089854 A1 | 5/2004 | Chen et al. | |
| 2004/0173827 A1* | 9/2004 | Hasegawa | H10B 53/00 257/295 |
| 2004/0245547 A1 | 12/2004 | Stipe | |
| 2005/0128663 A1* | 6/2005 | Yamazaki | H01L 28/65 257/E21.664 |
| 2006/0002170 A1 | 1/2006 | Kumura et al. | |
| 2008/0025063 A1 | 1/2008 | Kang | |
| 2012/0127776 A1 | 5/2012 | Kawashima | |
| 2017/0069735 A1 | 3/2017 | Oh et al. | |
| 2017/0179139 A1* | 6/2017 | Nakao | H01L 21/7687 |
| 2017/0277459 A1 | 9/2017 | Rodriguez et al. | |
| 2018/0331113 A1 | 11/2018 | Liao et al. | |
| 2020/0051607 A1 | 2/2020 | Pan et al. | |
| 2020/0251551 A1* | 8/2020 | Okita | H01L 28/57 |
| 2021/0035993 A1* | 2/2021 | Chen | G11C 11/221 |
| 2021/0142837 A1 | 5/2021 | Yu et al. | |
| 2021/0193209 A1 | 6/2021 | Swami et al. | |
| 2022/0069131 A1 | 3/2022 | Pesic | |
| 2023/0016628 A1* | 1/2023 | Song | H10B 43/40 |

FOREIGN PATENT DOCUMENTS

| | | |
|---|---|---|
| JP | H1174488 A | 3/1999 |
| JP | 2000174224 A | 6/2000 |
| JP | 2001237393 A | 8/2001 |
| JP | 2002026256 A | 1/2002 |
| JP | 2002158339 A | 5/2002 |
| JP | 2005142322 A | 6/2005 |
| JP | 2005322925 A | 11/2005 |
| JP | 2008210955 A | 9/2008 |
| JP | 2010021544 A | 1/2010 |
| JP | 2011151370 A | 8/2011 |
| JP | 2017518632 A | 7/2017 |
| KR | 100481867 B1 | 4/2005 |
| KR | 20050105695 A | 11/2005 |
| KR | 100895740 B1 | 4/2009 |
| WO | 2018125024 A1 | 7/2018 |

OTHER PUBLICATIONS

Restriction Requirement notified Aug. 26, 2022 for U.S. Appl. No. 17/390,796.
Gupta et al., "Buried Power Rail Integration with Si FinFETs for CMOS Scaling beyond the 5 nm Node," 2020 IEEE Symposium on VLSI Technology, Jun. 16-19, 2020, Honolulu, HI, US. 2 pages. DOI: 10.1109/VLSITechnology18217.2020.9265113.
Gupta et al., "Buried Power Rail Scaling and Metal Assessment for the 3 nm Node and Beyond," 2020 IEEE International Electron Devices Meeting (IEDM), Dec. 12-18, 2020, San Francisco, CA, US. 4 pages. DOI: 10.1109/IEDM13553.2020.9371970.
Mathur et al., "Buried Bitline for sub-5nm SRAM Design," 2020 IEEE International Electron Devices Meeting (IEDM), San Francisco, CA, US. 4 pages. DOI: 10.1109/IEDM13553.2020.9372042.
Ryckaert et al., "Extending the Roadmap Beyond 3nm Through System Scaling Boosters: A Case Study on Buried Power Rail and Backside Power Delivery," 2019 Electron Devices Technology and Manufacturing Conferences (EDTM), IEEE. pp. 50-52 (3 pages).
Salahuddin et al., "Buried Power SRAM DTCO and System-Level Benchmarking in N3," 2020 Symposium on VLSI Technology Digest of Technical Papers—JFS3.3 IEEE. 2 pages.
Salahuddin et al., "SRAM with Buried Power Distribution to Improve Write Margin and Performance in Advanced Technology Nodes," IEEE Electron Device Letters, vol. 40, Issue: 8, Aug. 2019. 4 pages. DOI: 10.1109/LED.2019.2921209.
Yeh et al. "Fabrication and Investigation of Three-Dimensional Ferroelectric Capacitors for the Application of FeRAM," AIP Advances 6, 035128 (2016); https://doi.org/10.1063/1.4945405, Published Online: Mar. 30, 2016, 13 pages.
Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.
Decision of Rejection notified Feb. 1, 2024 for Taiwan Patent Application No. 111150380.
Examination Report notified Jun. 21, 2023 for German Patent Application No. 112020000955.6.
Final Office Action notified Aug. 15, 2022 for U.S. Appl. No. 17/346,083.
Final Office Action notified Sep. 12, 2022 for U.S. Appl. No. 17/367,217.
First Office Action notified Jul. 5, 2023 for Taiwan Patent Application No. 111150380.

(56) References Cited

OTHER PUBLICATIONS

Non-Final Office Action notified Aug. 16, 2022 for U.S. Appl. No. 17/367,217.
Non-Final Office Action notified Dec. 28, 2023 for U.S. Appl. No. 17/805,665.
Non-Final Office Action notified Dec. 29, 2023 for U.S. Appl. No. 17/805,664.
Non-Final Office Action notified Feb. 2, 2023 for U.S. Appl. No. 17/516,594.
Non-Final Office Action notified Jan. 2, 2024 for U.S. Appl. No. 17/653,811.
Non-Final Office Action notified May 9, 2023 for U.S. Appl. No. 18/061,270.
Non-Final Office Action notified May 16, 2023 for U.S. Appl. No. 17/532,647.
Non-Final Office Action notified Nov. 4, 2022 for U.S. Appl. No. 17/530,362.
Non-Final Office Action notified Nov. 21, 2022 for U.S. Appl. No. 7/532,657.
Non-Final Office Action notified Nov. 28, 2022 for U.S. Appl. No. 17/532,552.
Non-Final Office Action notified Oct. 12, 2022 for U.S. Appl. No. 17/530,363.
Non-Final Office Action notified Oct. 26, 2022 for U.S. Appl. No. 17/531,577.
Non-Final Office Action notified Sep. 1, 2022 for U.S. Appl. No. 17/339,850.
Non-Final Office Action notified Sep. 7, 2022 for U.S. Appl. No. 17/530,360.
Notice of Allowance notified Apr. 4, 2023 for U.S. Appl. No. 17/532,552.
Notice of Allowance notified Aug. 17, 2022 for U.S. Appl. No. 17/346,087.
Notice of Allowance notified Aug. 22, 2022 for U.S. Appl. No. 17/390,791.
Notice of Allowance notified Aug. 25, 2022 for U.S. Appl. No. 17/367,101.
Notice of Allowance notified Aug. 31, 2022 for U.S. Appl. No. 17/359,325.
Notice of Allowance notified Jan. 5, 2024 for Korean Patent Application No. 10-2021-7027261.
Notice of Allowance notified Jan. 18, 2024 for U.S. Appl. No. 17/654,383.
Notice of Allowance notified Jan. 20, 2023 for U.S. Appl. No. 17/532,657.
Notice of Allowance notified Jan. 30, 2023 for U.S. Appl. No. 17/531,535.
Notice of Allowance notified Jun. 16, 2023 for U.S. Appl. No. 17/532,652.
Notice of Allowance notified Jun. 26, 2023 for U.S. Appl. No. 18/061,270.
Notice of Allowance notified Mar. 13, 2023 for U.S. Appl. No. 17/516,577.
Notice of Allowance notified Mar. 15, 2023 for U.S. Appl. No. 17/516,293.
Notice of Allowance notified Mar. 17, 2023 for U.S. Appl. No. 17/532,545.
Notice of Allowance notified May 2, 2023 for U.S. Appl. No. 17/532,556.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Oct. 20, 2022 for Taiwan Patent Application No. 110129115.
Notice of Allowance notified Oct. 31, 2022 for U.S. Appl. No. 17/390,796.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Allowance notified Sep. 27, 2022 for U.S. Appl. No. 17/346,083.
Notice of Preliminary Rejection notified Jul. 18, 2023 for Korean Patent Application No. 10-2021-7027261.
Notice of Preliminary Rejection notified Oct. 28, 2022 for Korean Patent Application No. 10-2021-7027303.
Notice of Reasons for Rejection notified Dec. 6, 2022 for Japanese Patent Application No. 2021-546823.
Notice of Reasons for Rejection notified Jun. 20, 2023 for Japanese Patent Application No. 2021-546823.
Notice of Reasons for Rejection notified Nov. 22, 2022 for Japanese Patent Application No. 2021-546864.
Office Action notified May 16, 2023 for Japanese Patent Application No. 2021-546864.
Official Communication notified Jun. 22, 2023 for German Patent Application No. 112020000956.4.

* cited by examiner

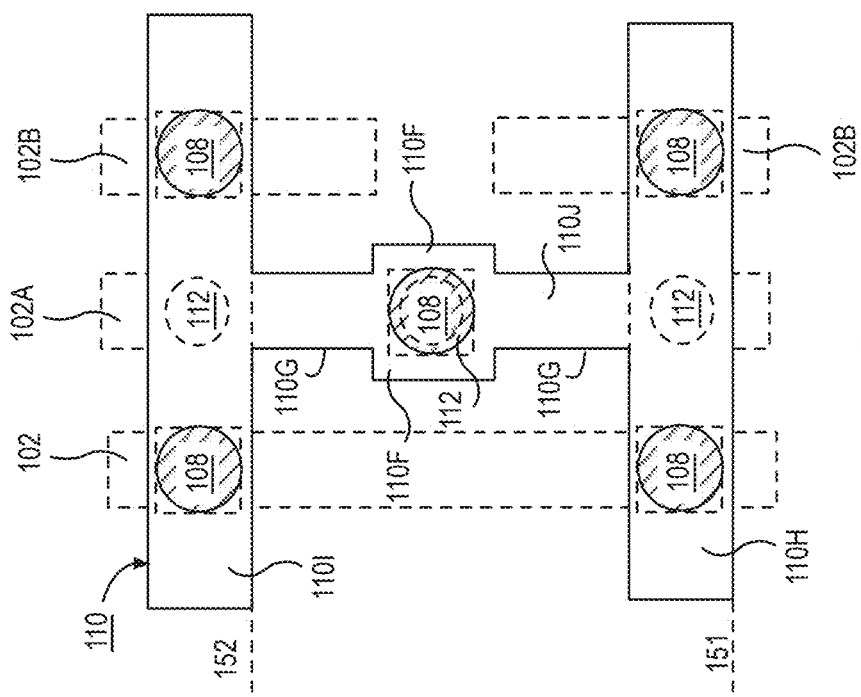
FIG. 1D
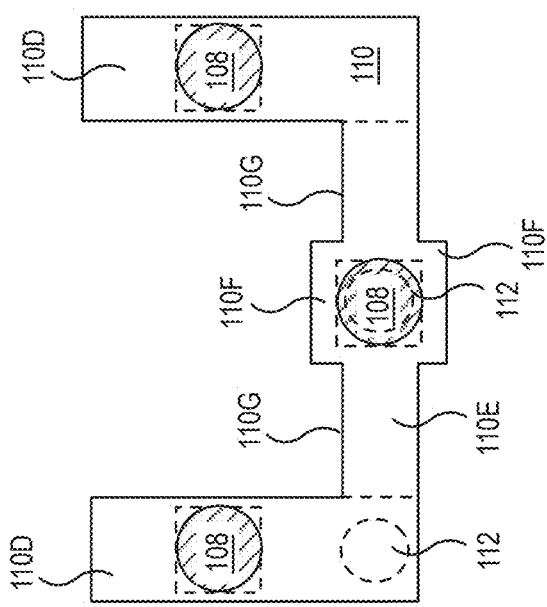
FIG. 1C
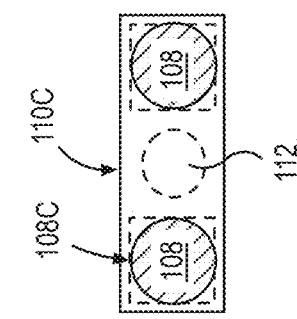
FIG. 1B
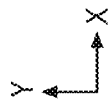

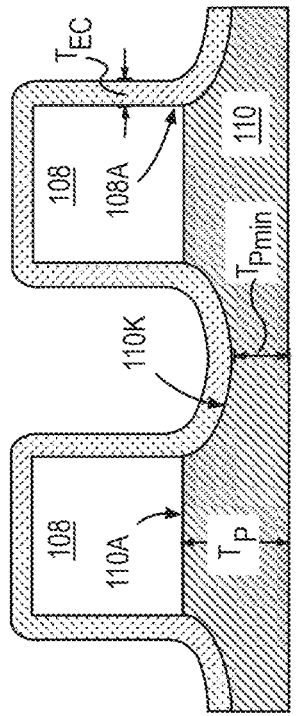
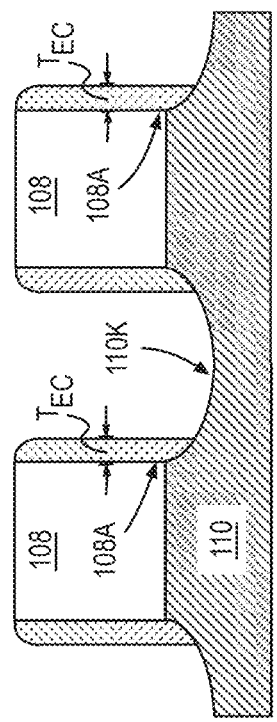
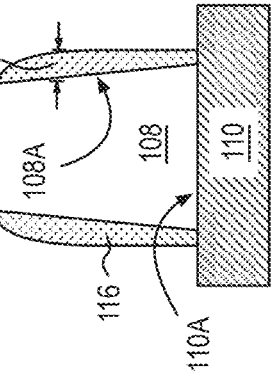
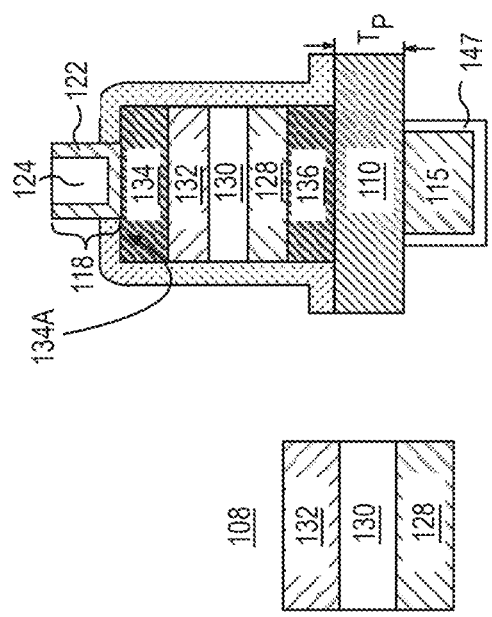
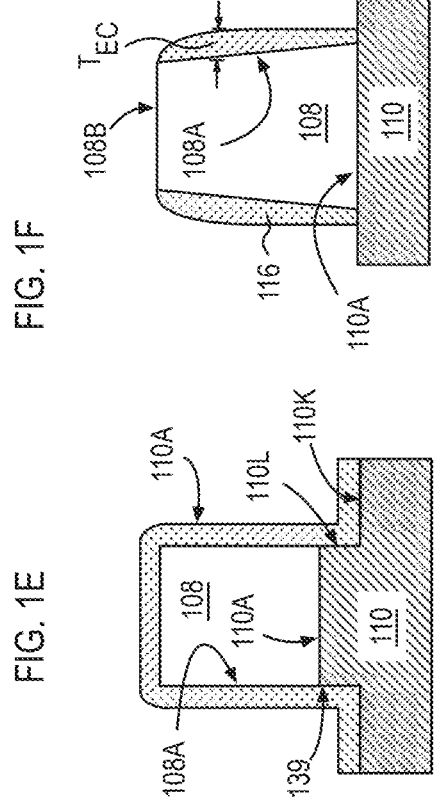
FIG. 1E
FIG. 1F
FIG. 1G
FIG. 1H
FIG. 1I
FIG. 1J

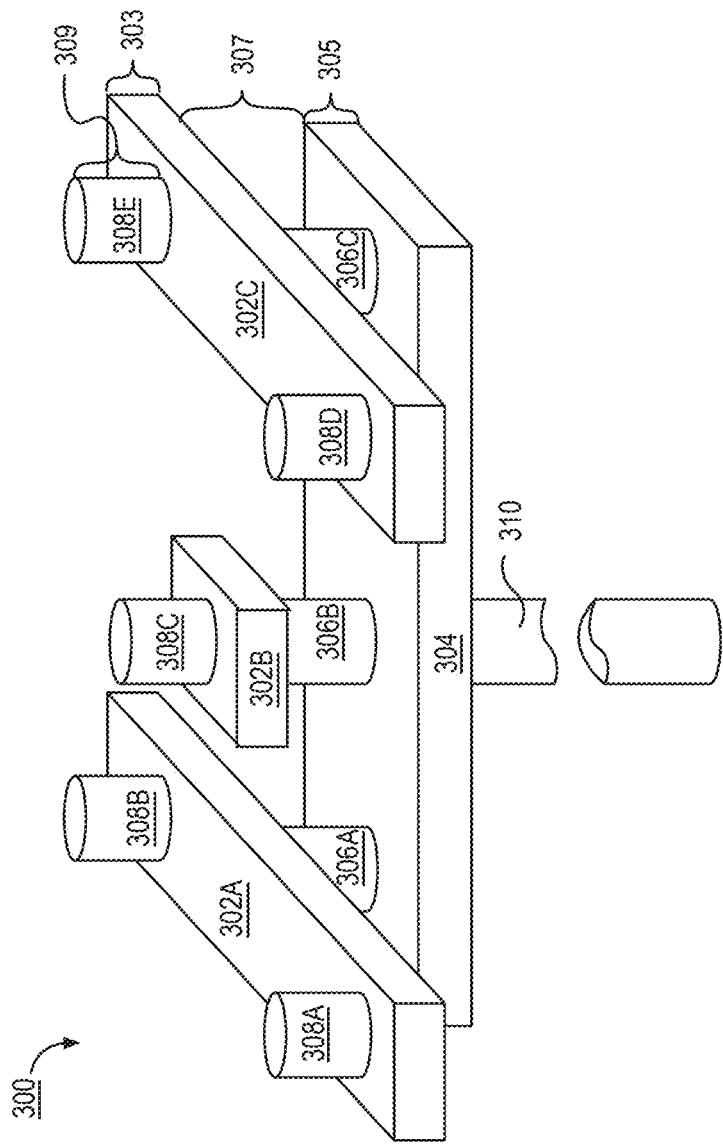
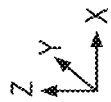
FIG. 3

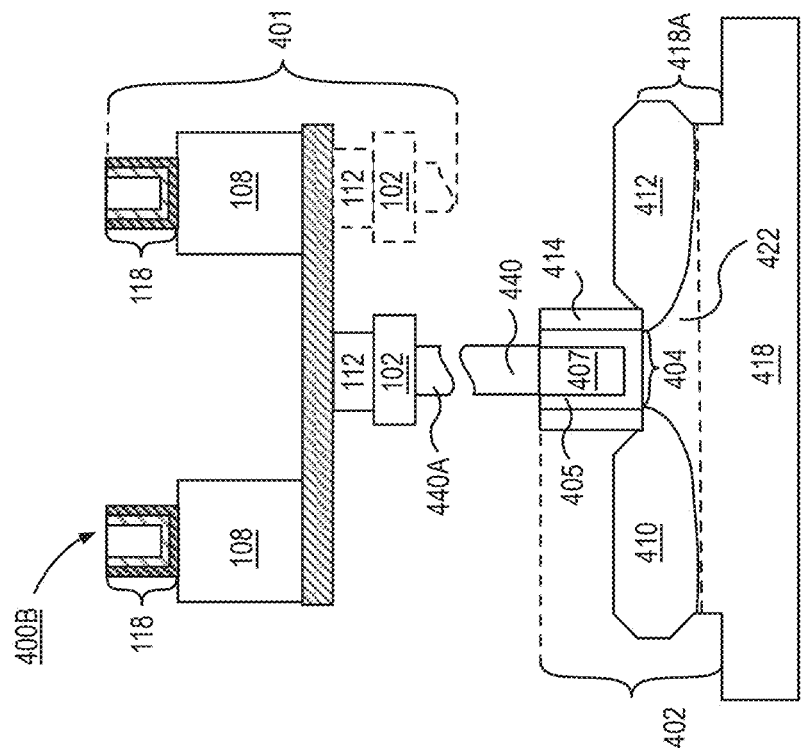
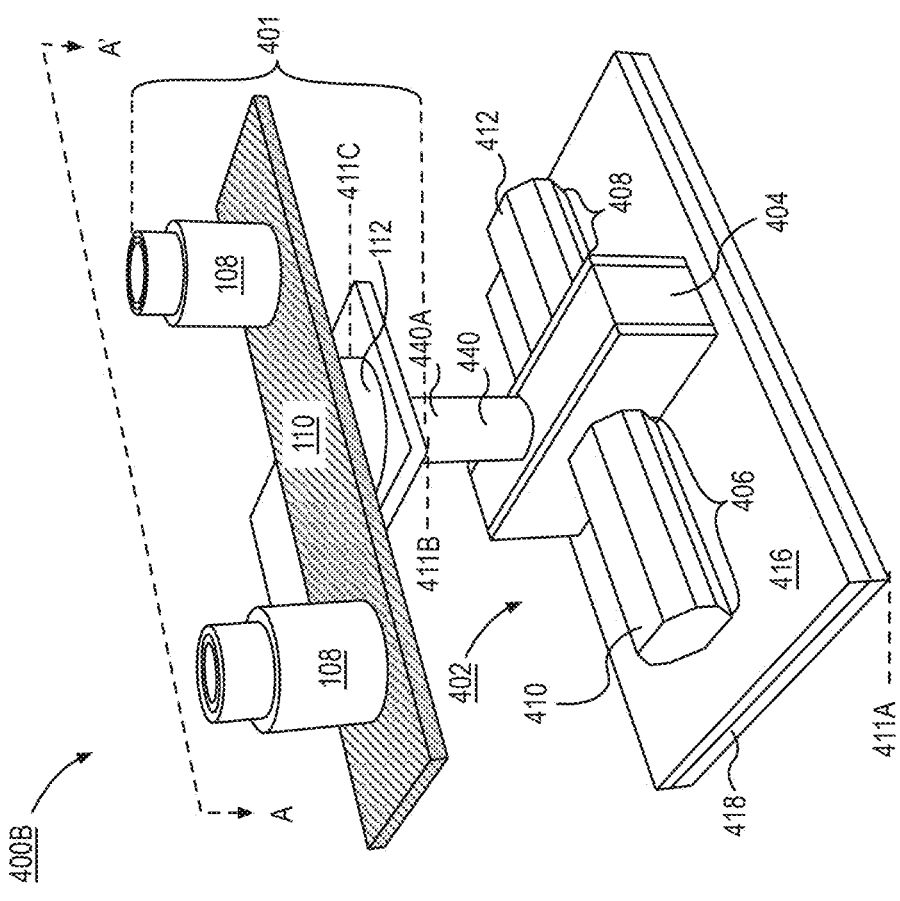

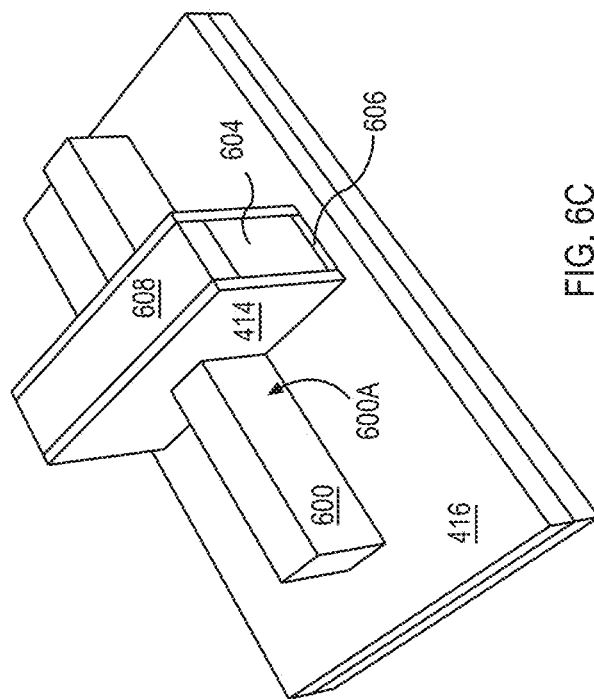
FIG. 6A
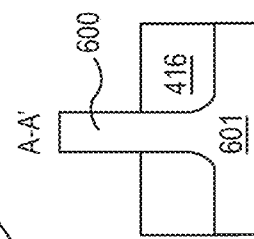
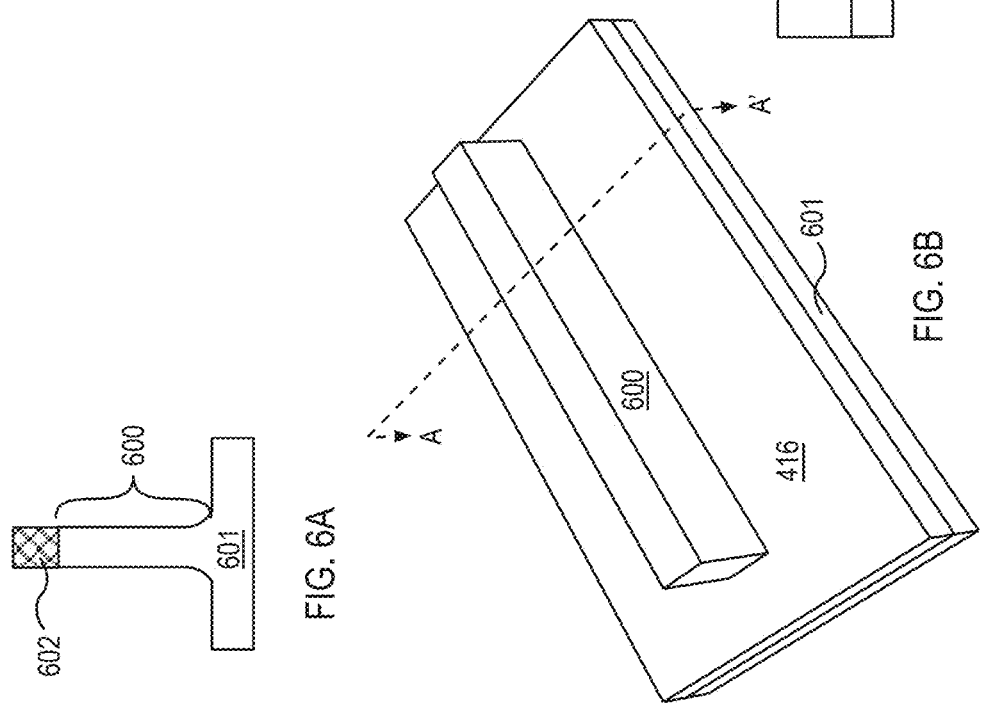
FIG. 6B
FIG. 6C

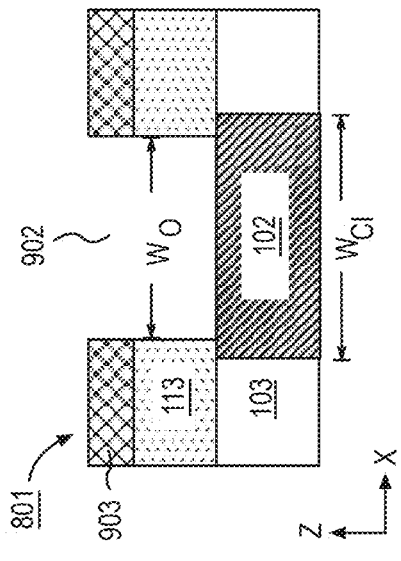
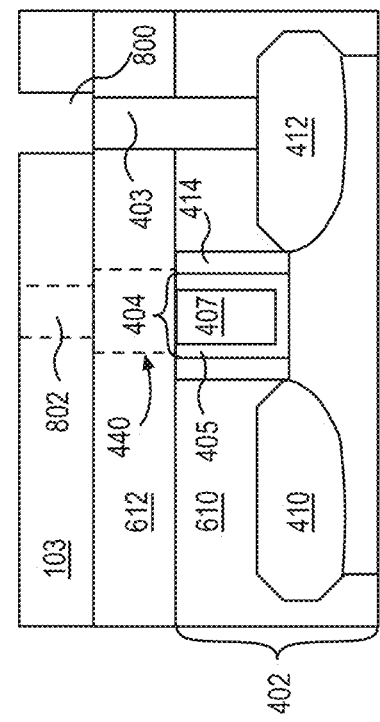
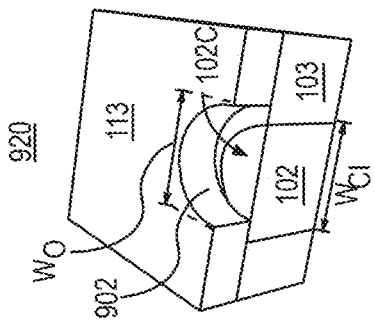
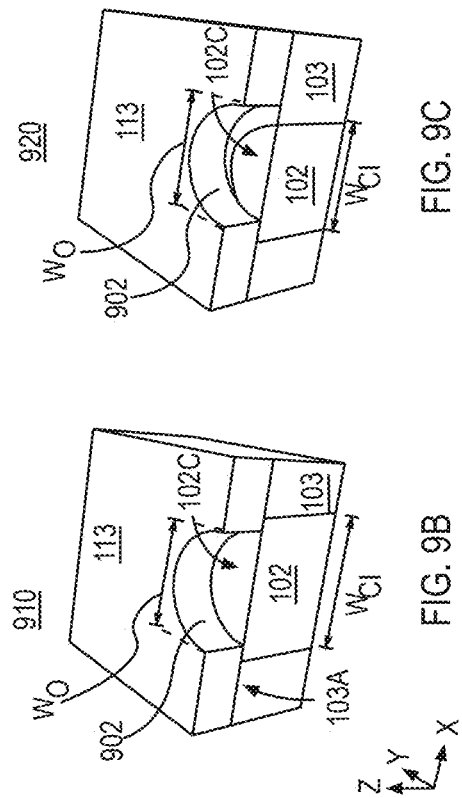
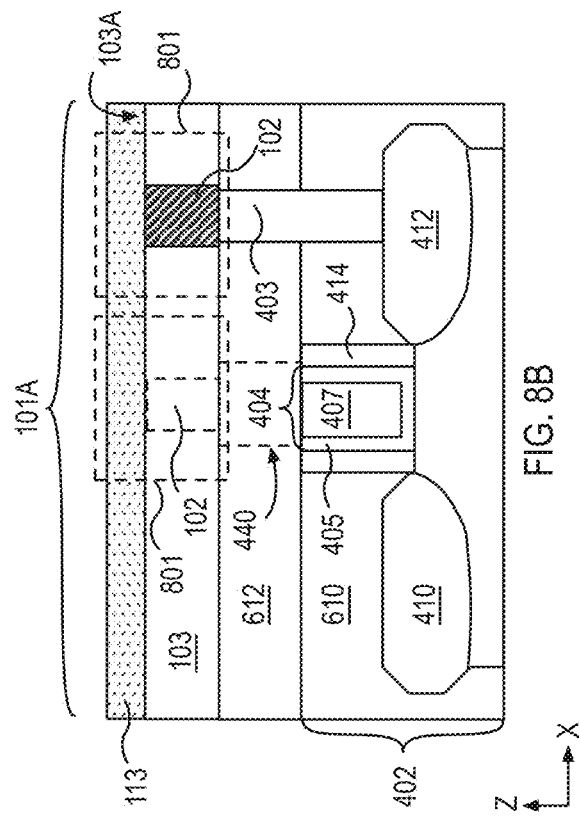

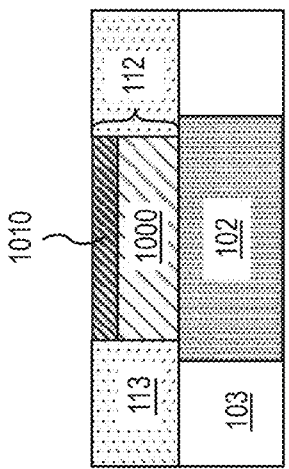
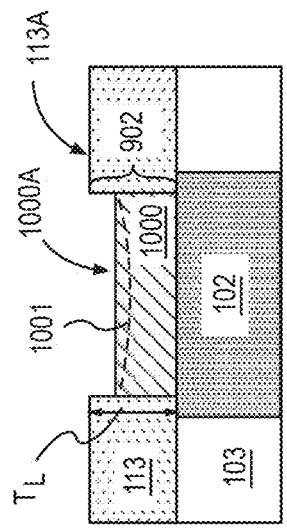
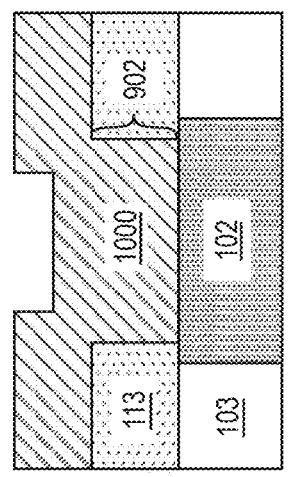
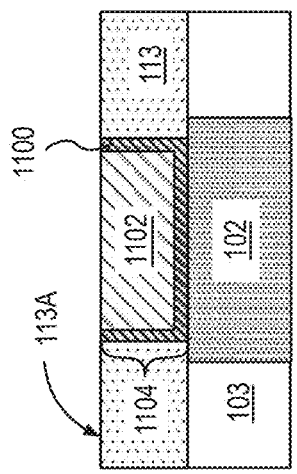
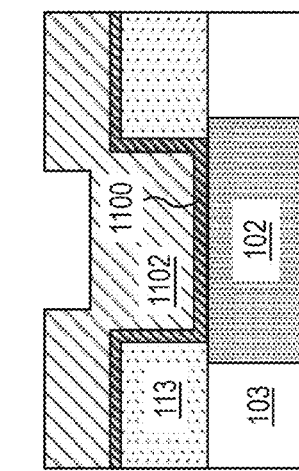
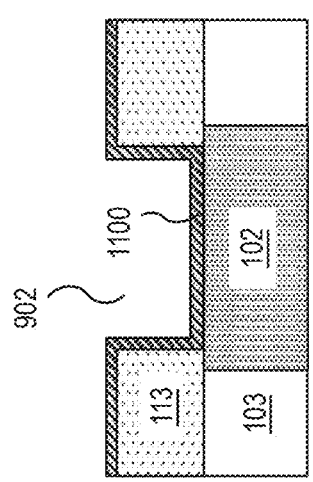

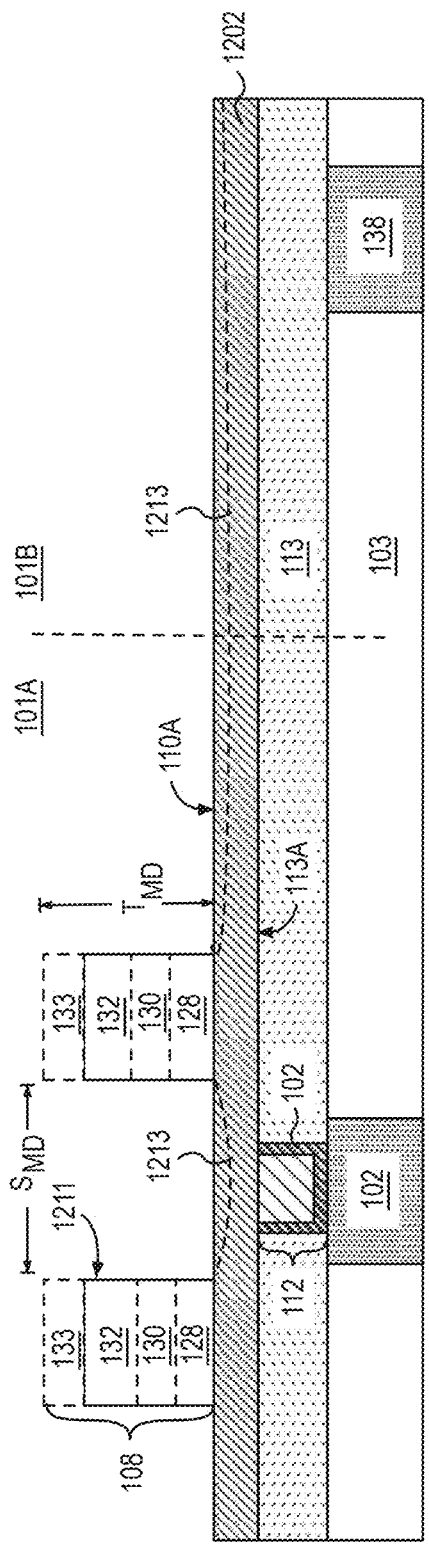
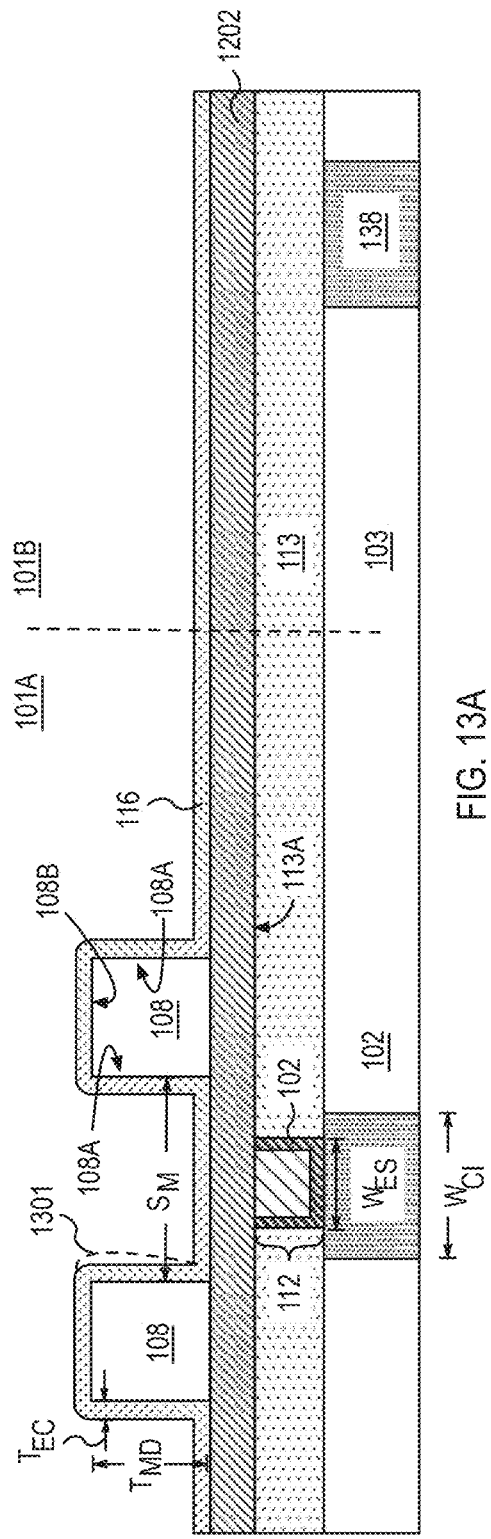
FIG. 12D
FIG. 13A

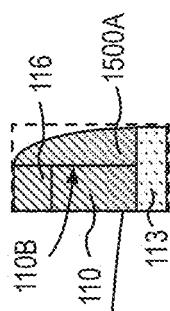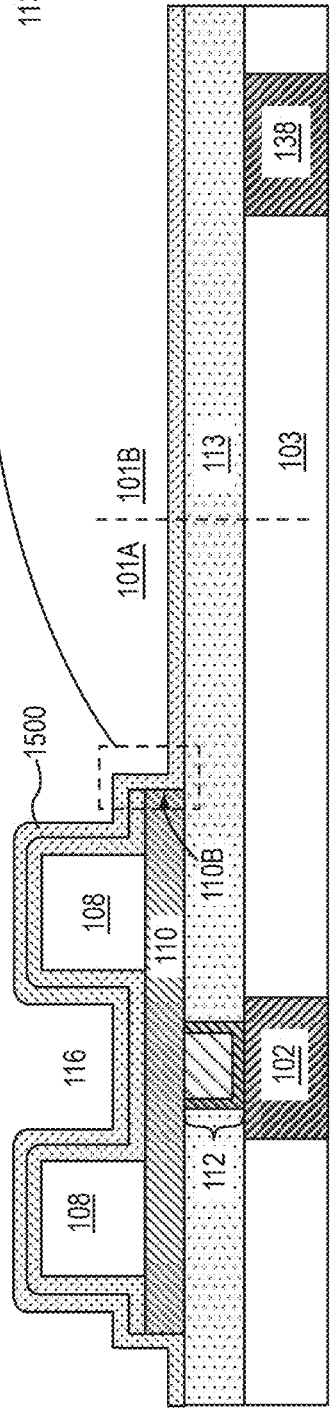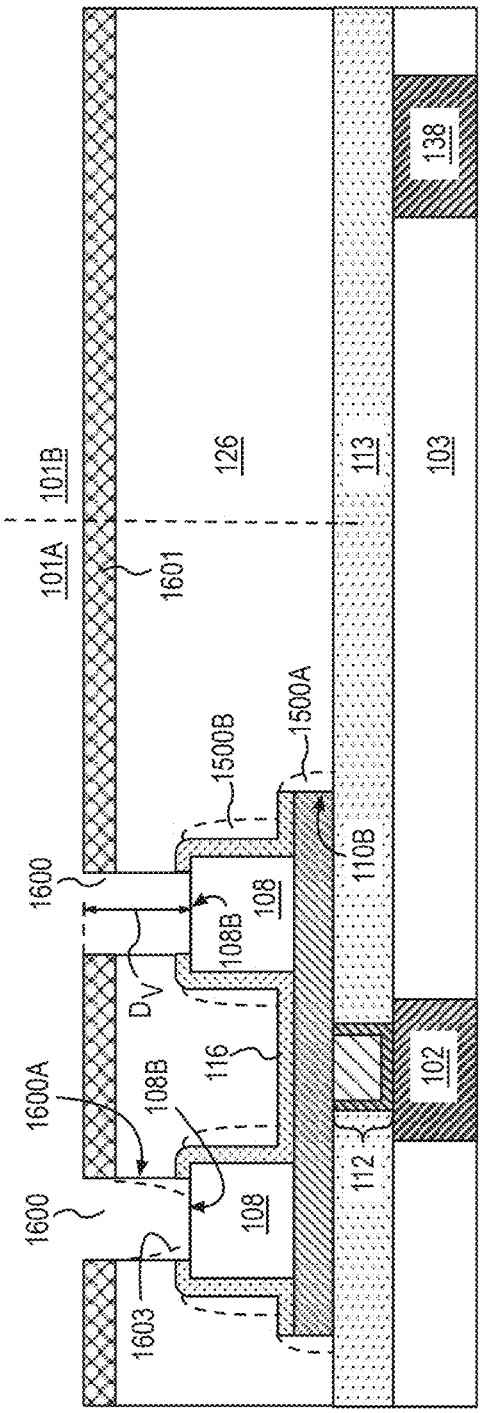

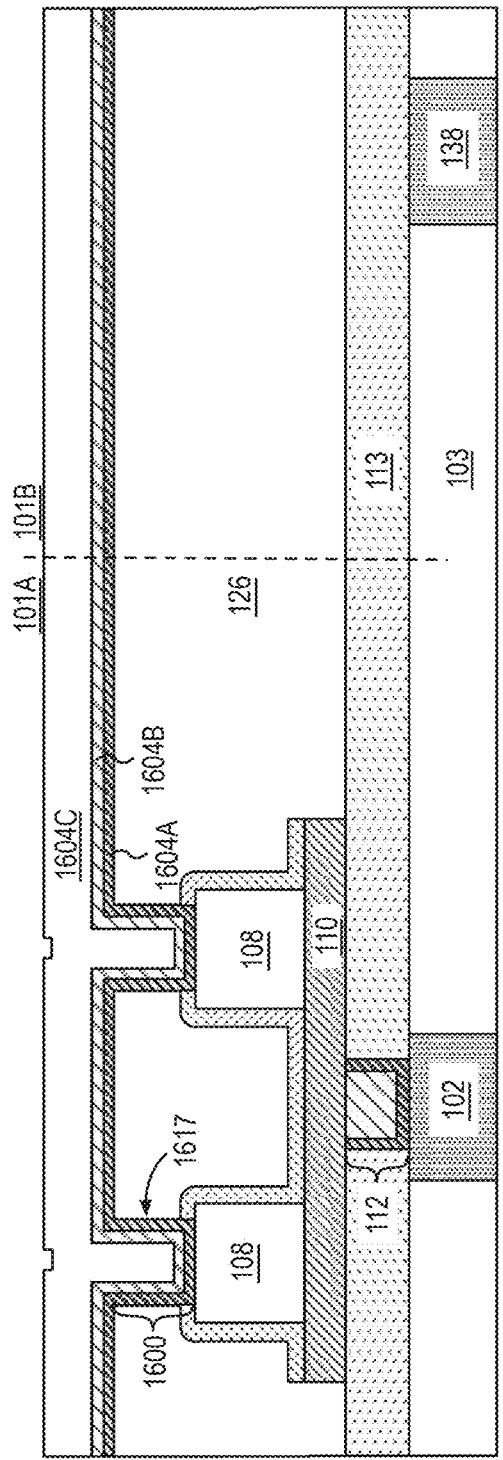
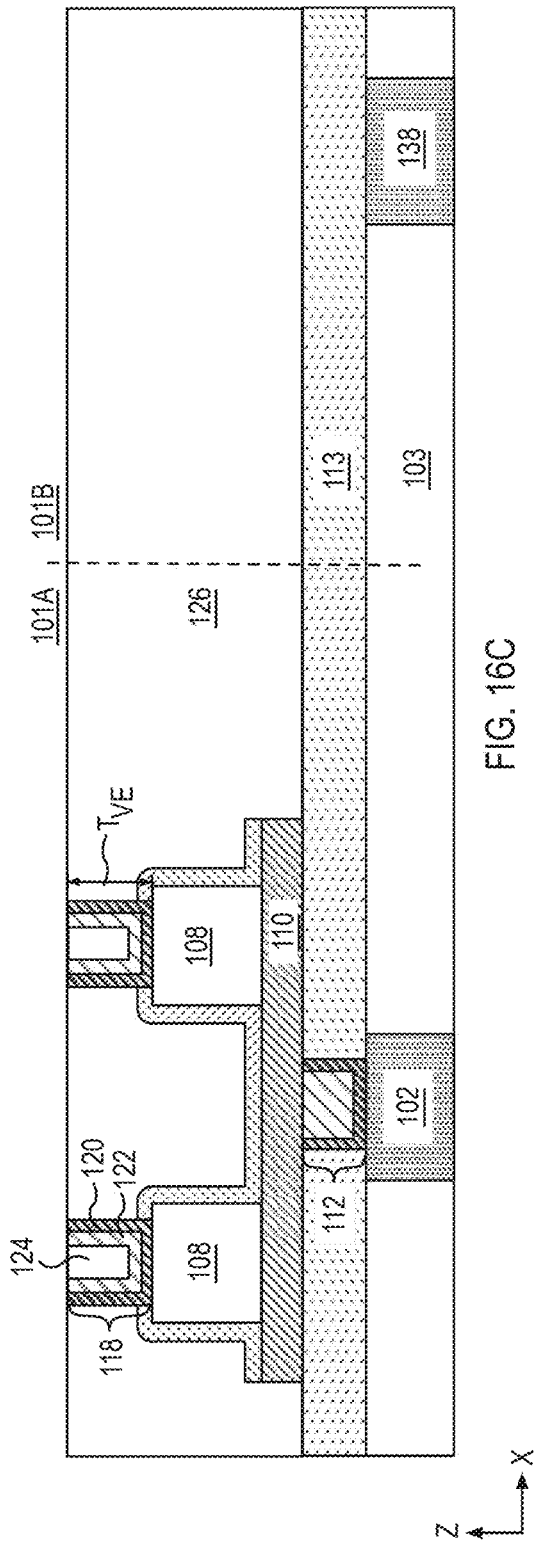

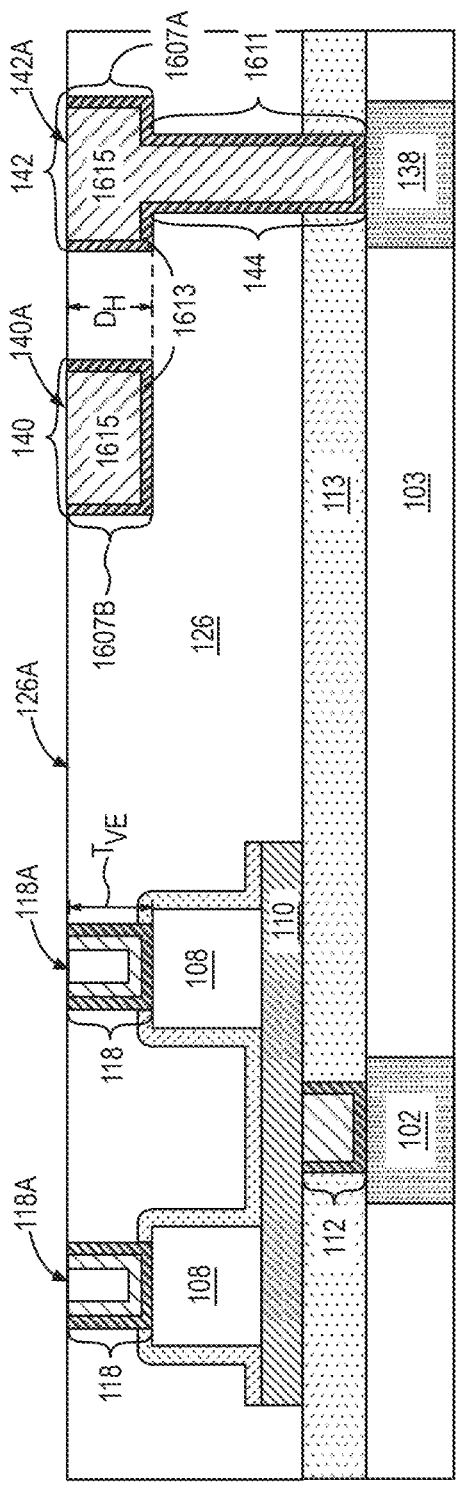
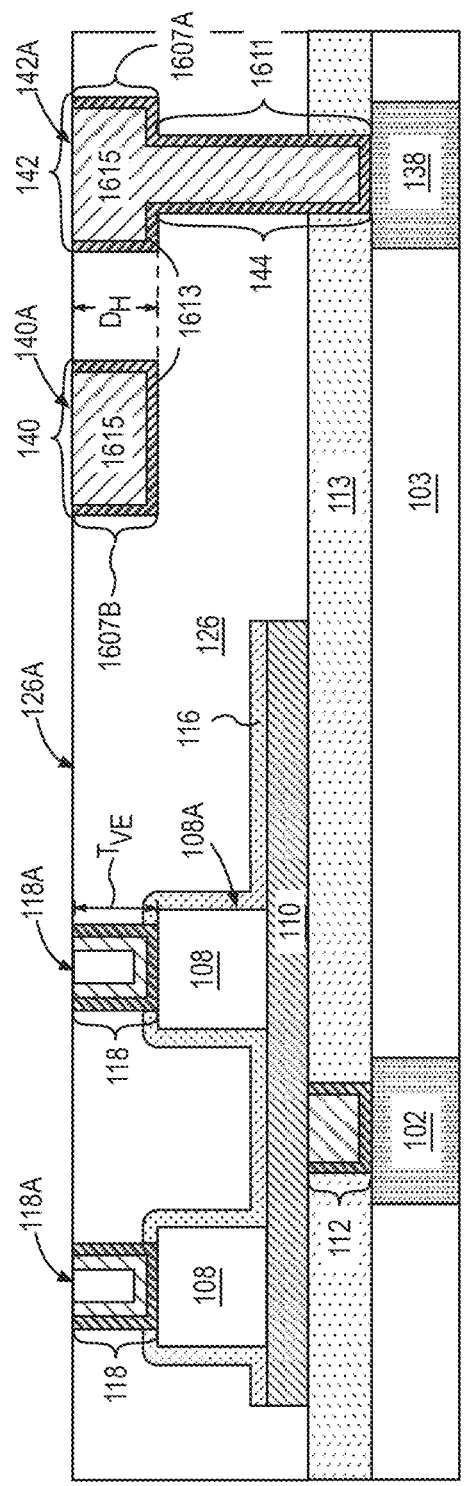

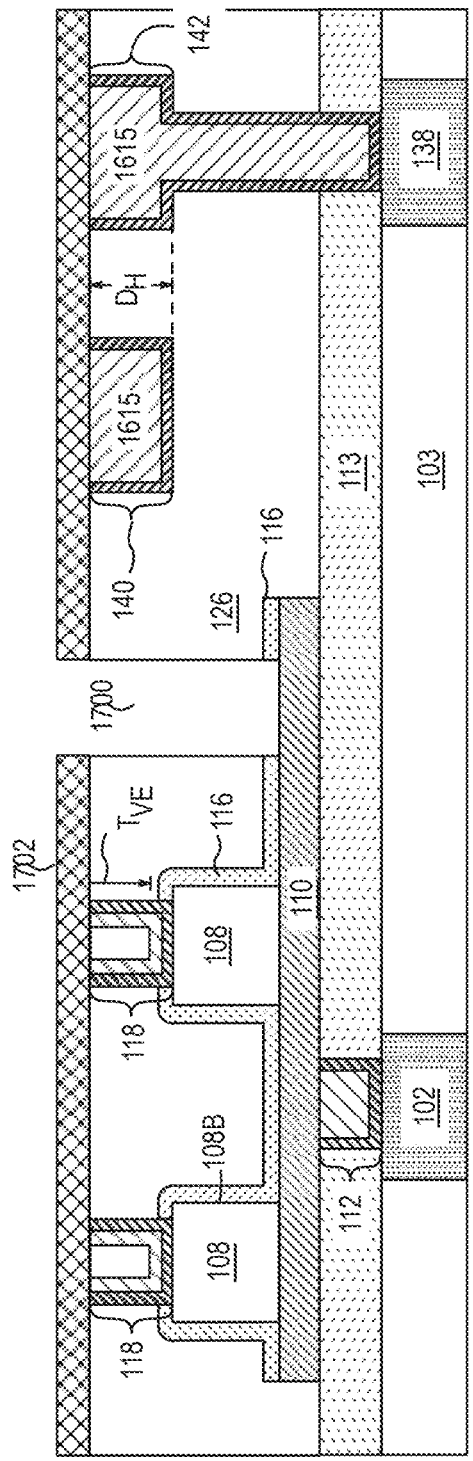
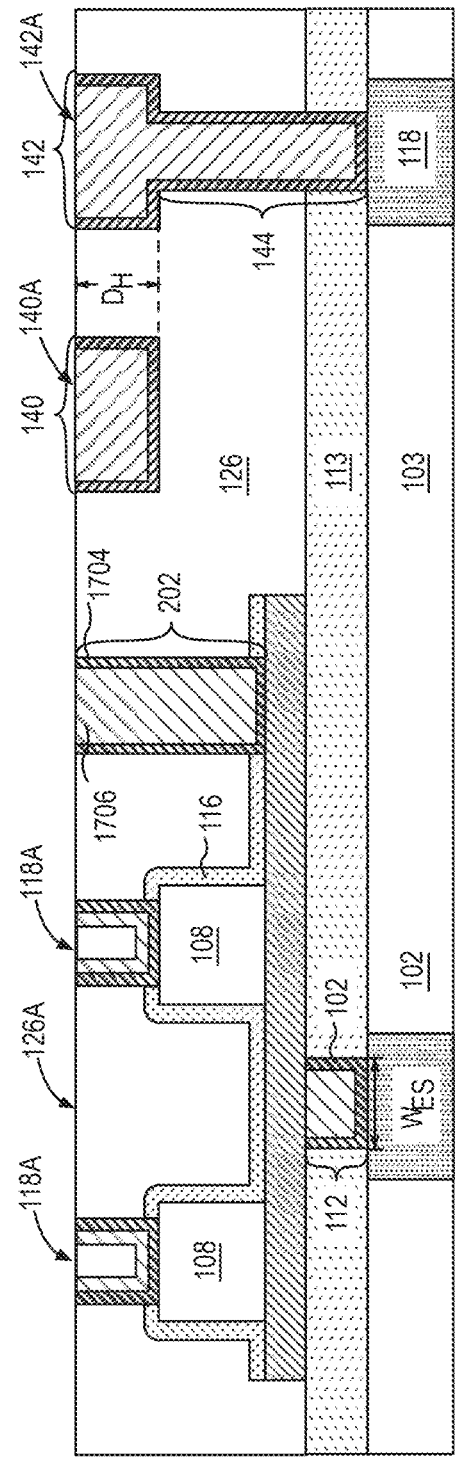
FIG. 17B
FIG. 17C

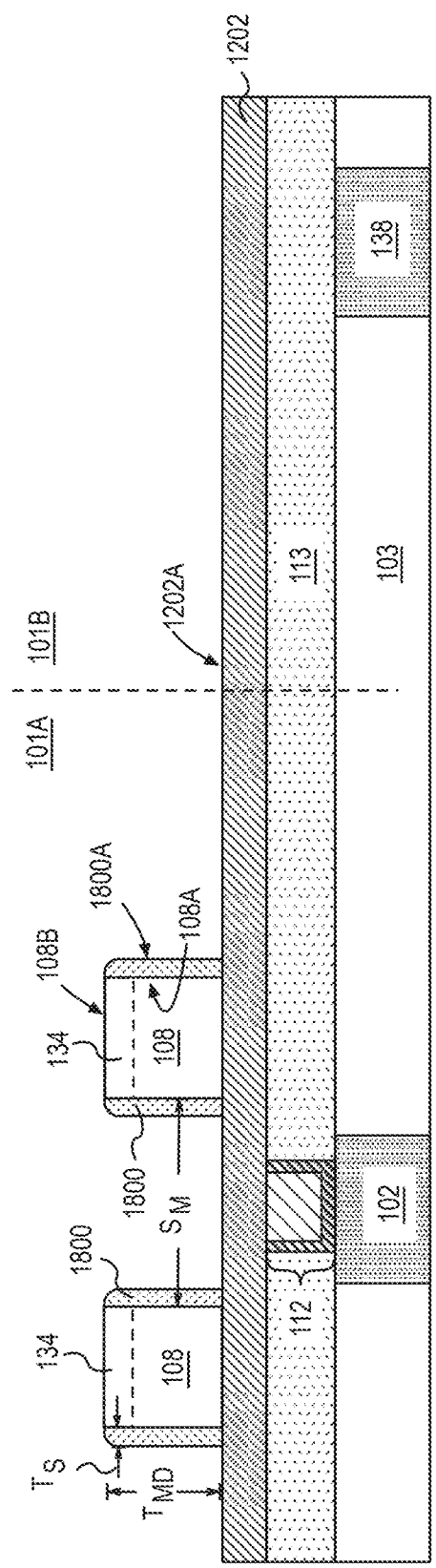
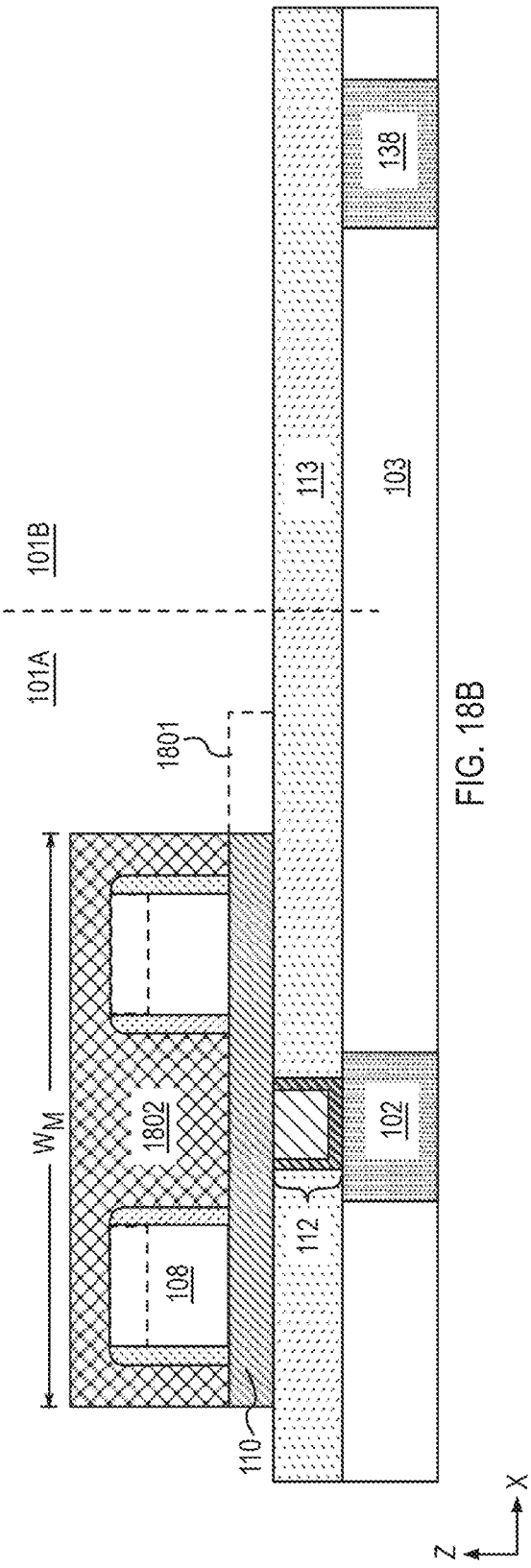
FIG. 18A
FIG. 18B

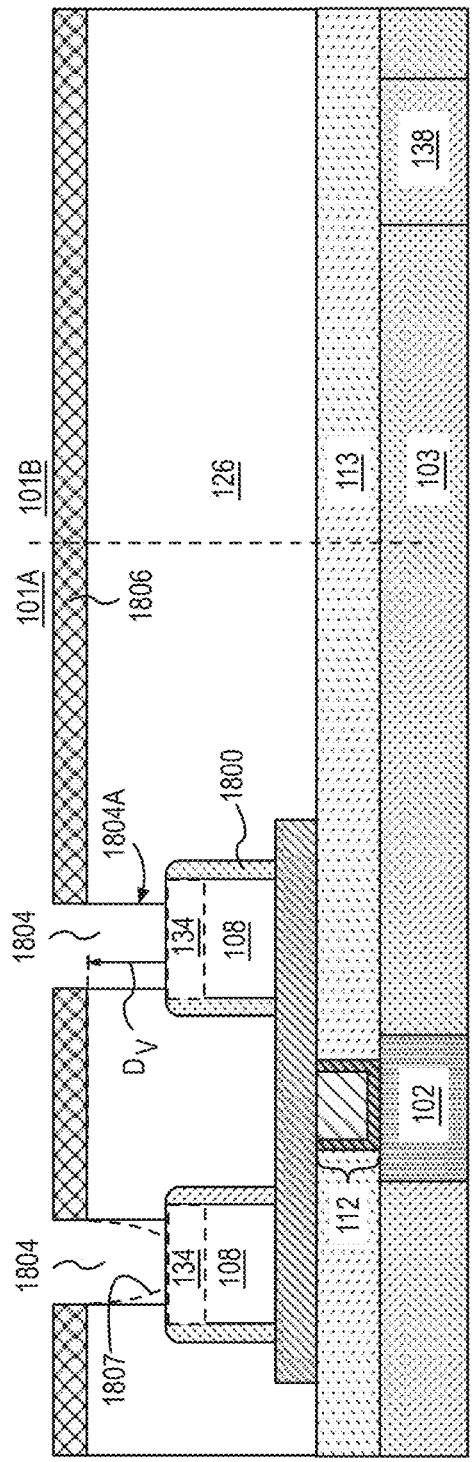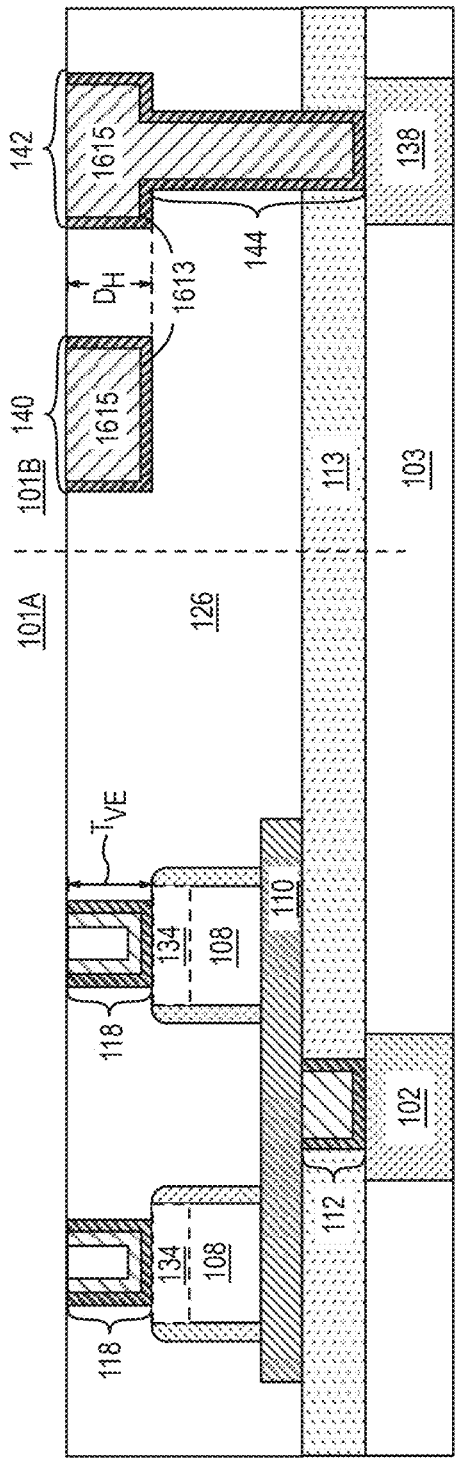
FIG. 18C
FIG. 18D

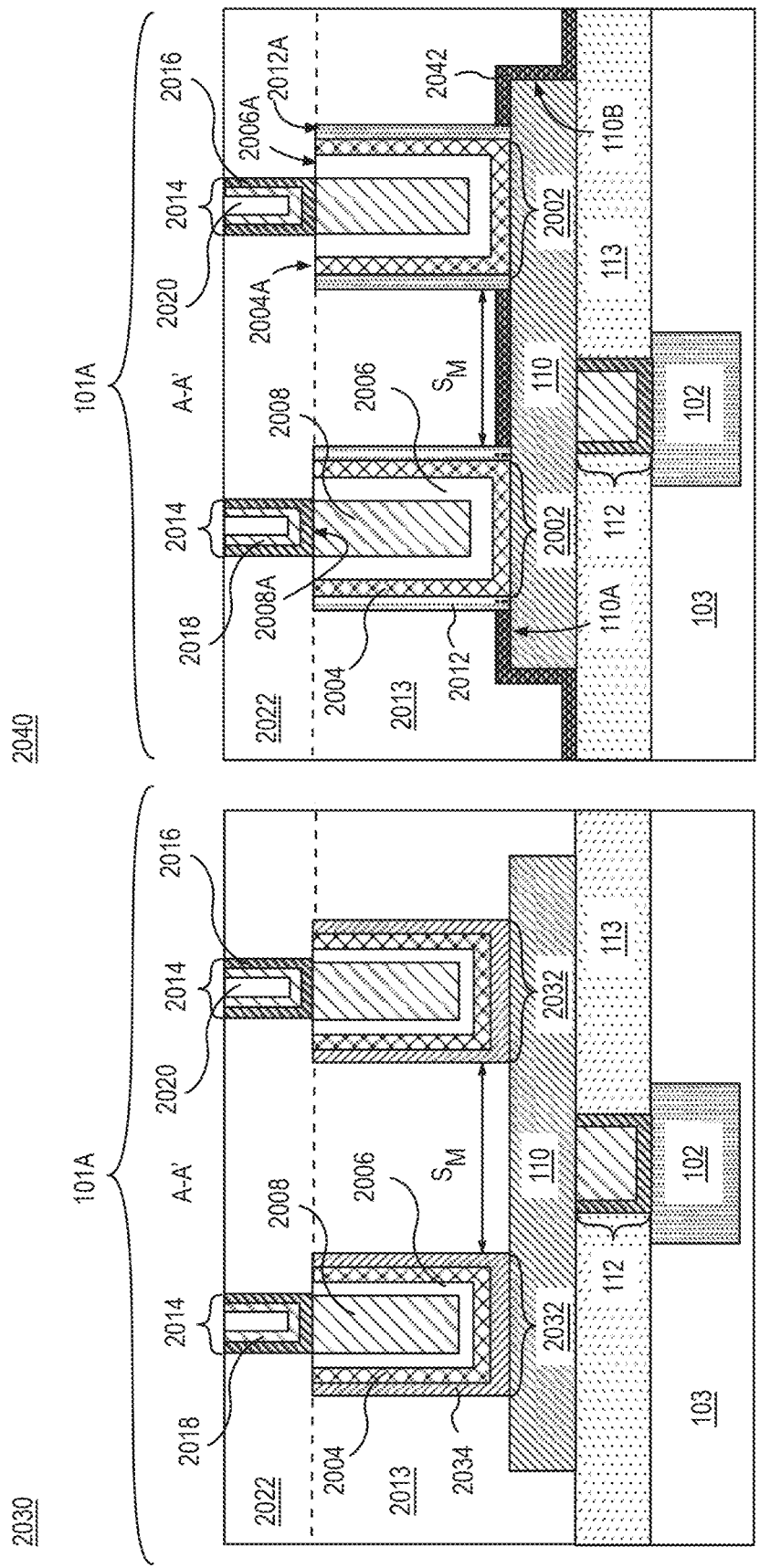

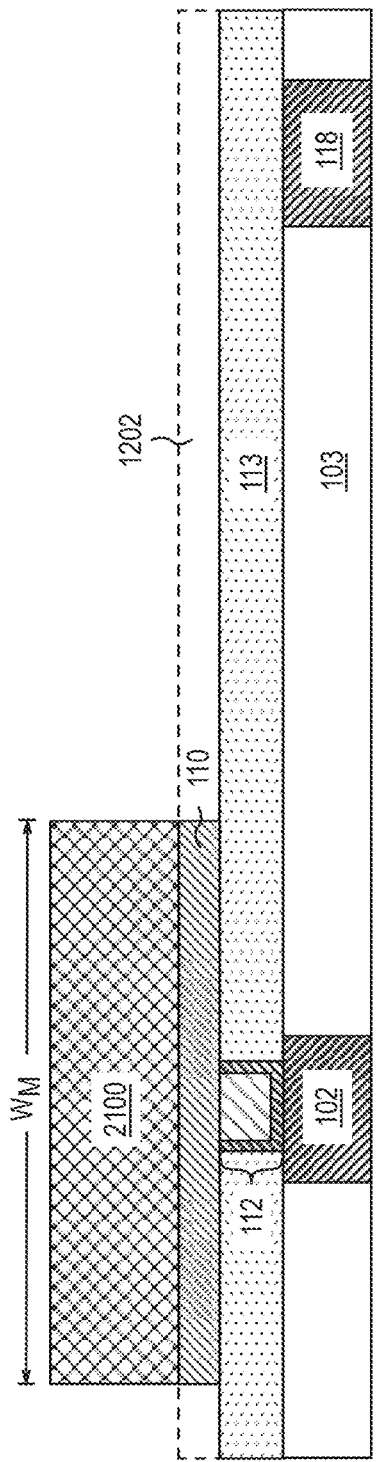
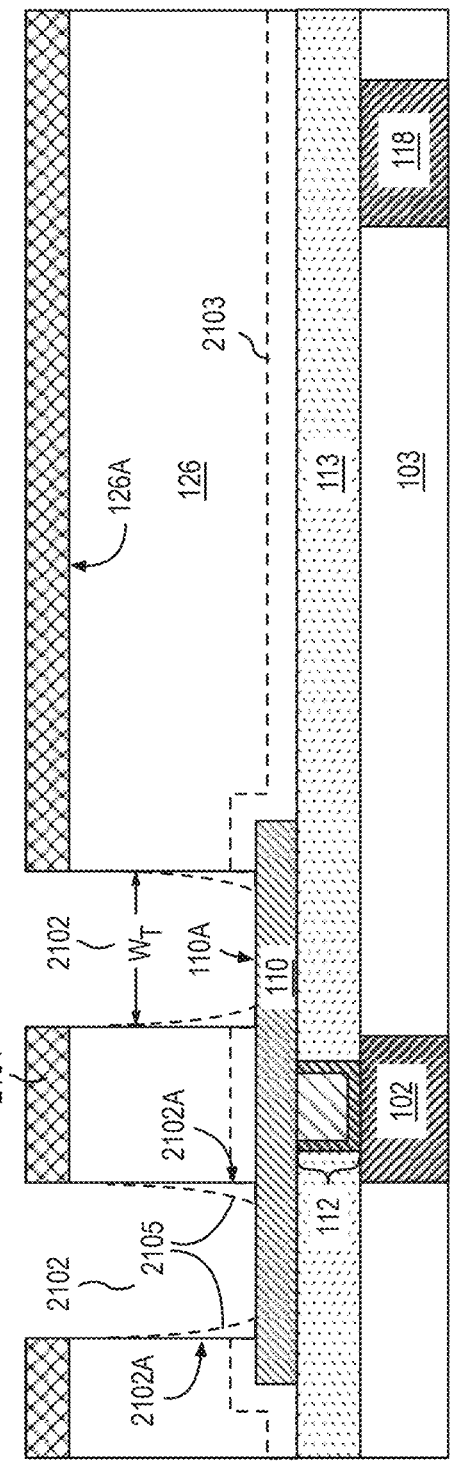
FIG. 21A
FIG. 21B

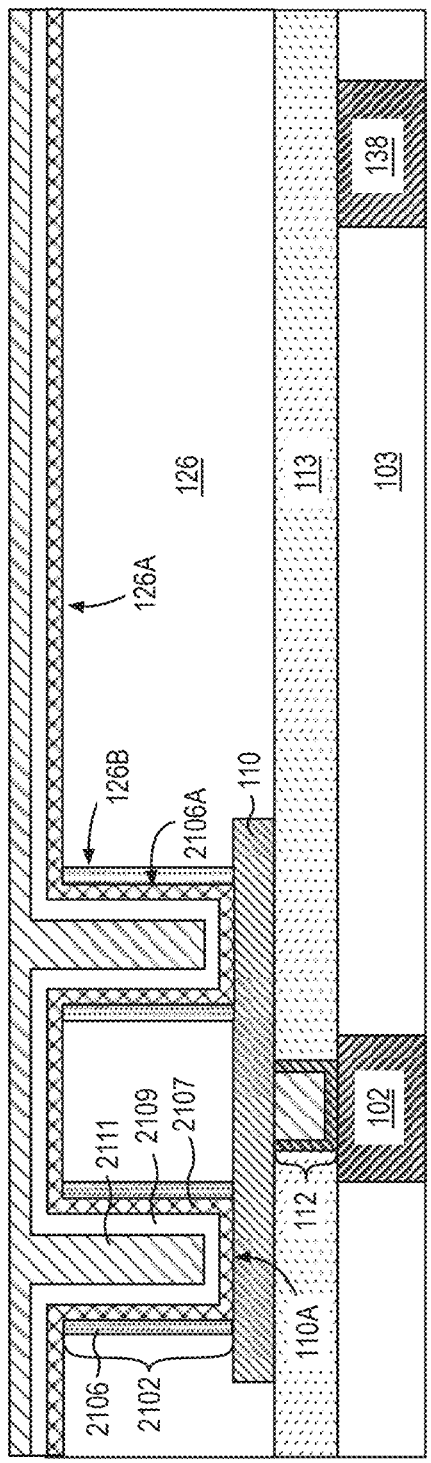
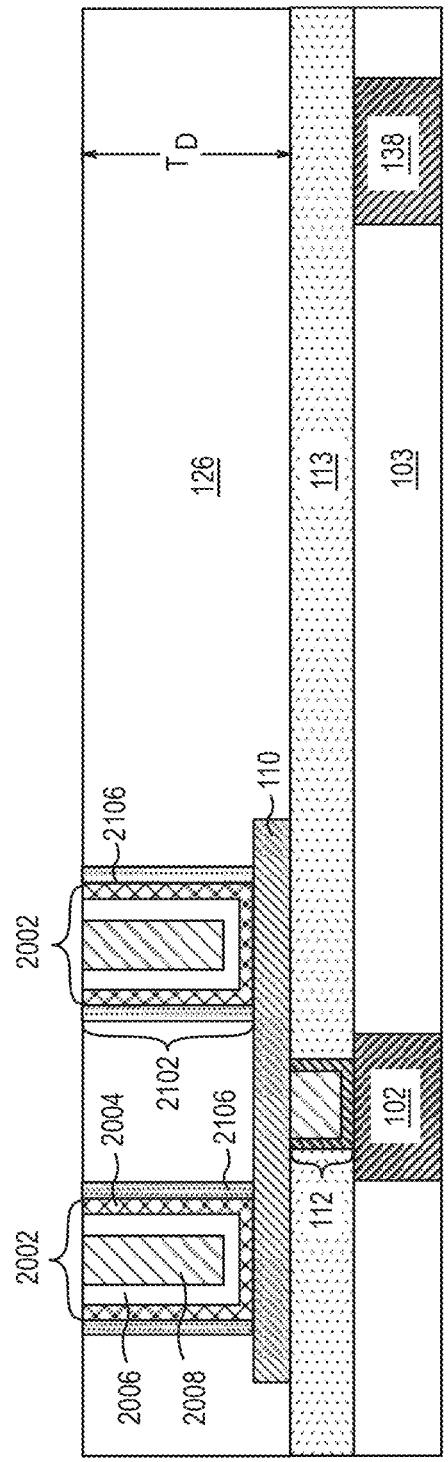
FIG. 21C
FIG. 21D

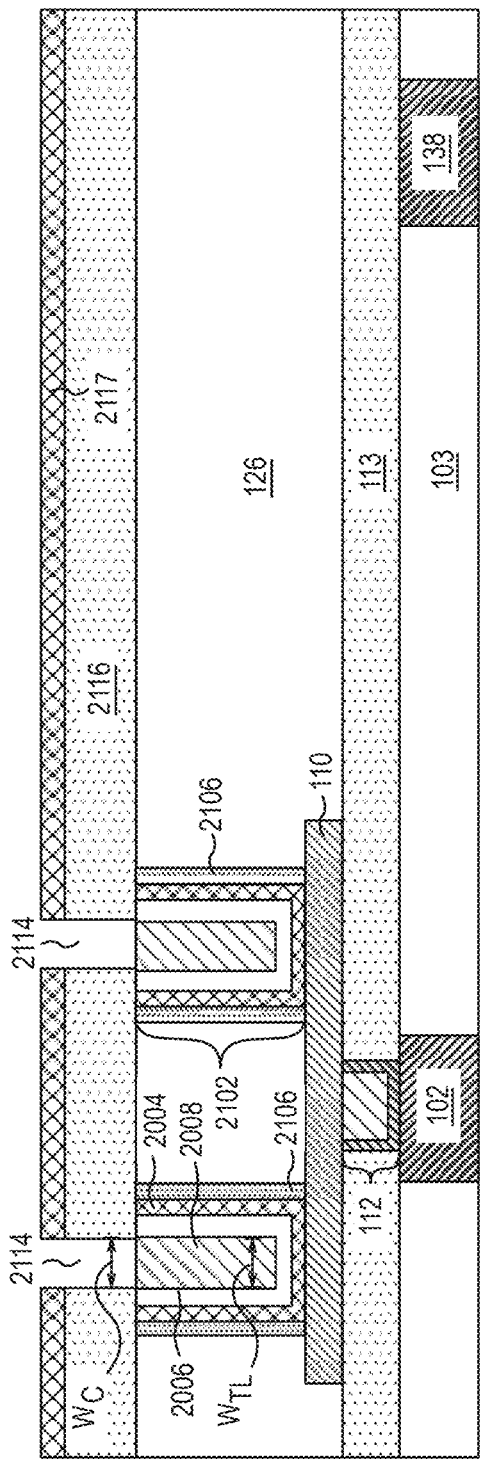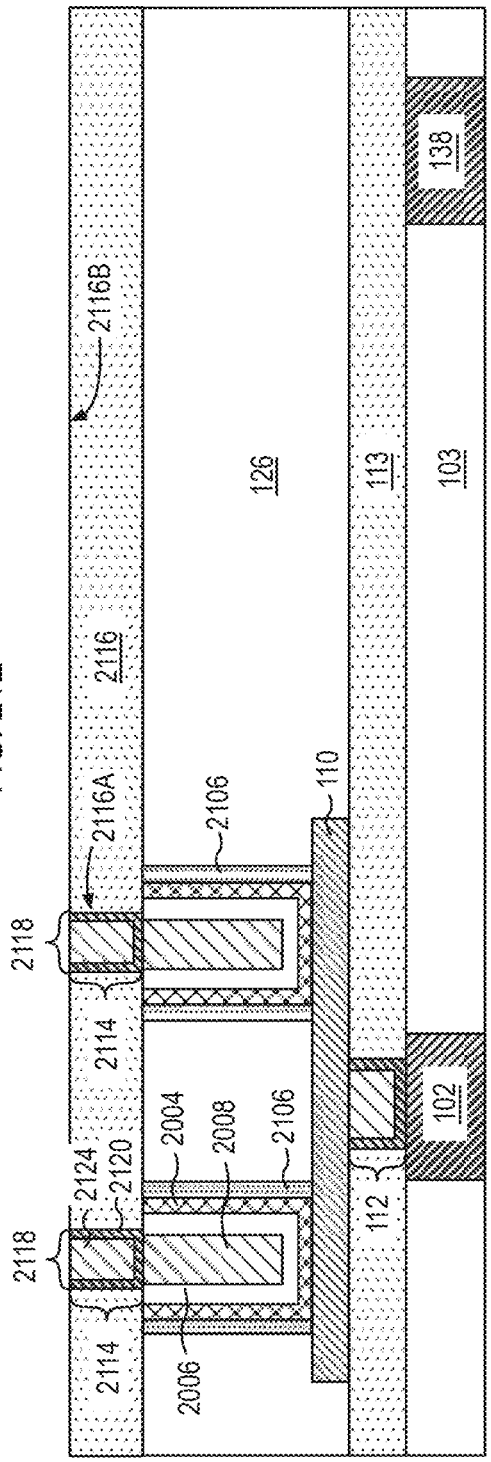

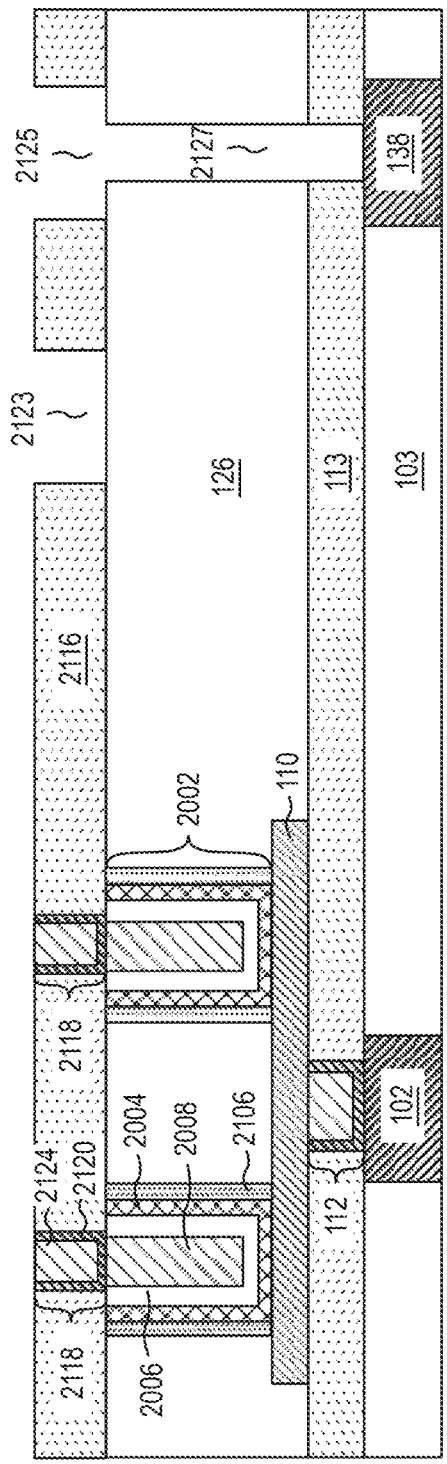
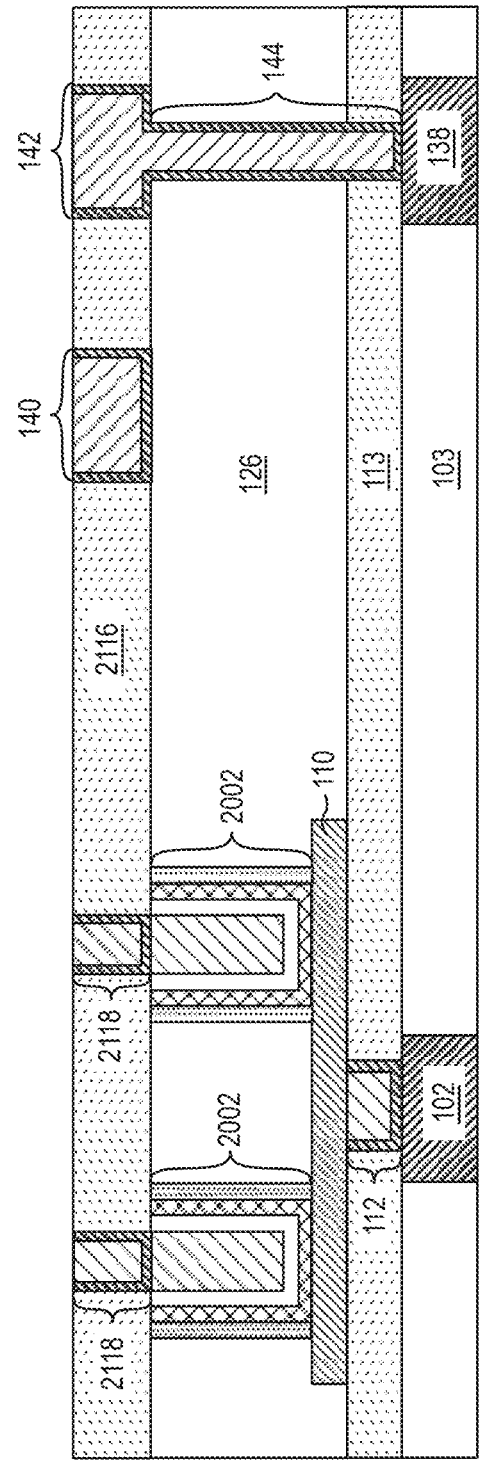
FIG. 21G
FIG. 21H

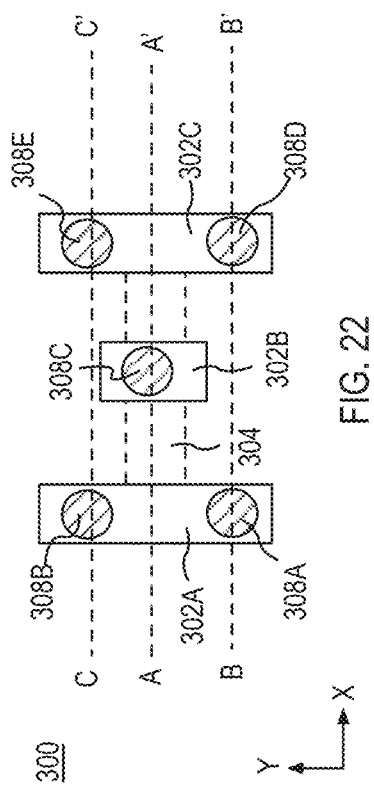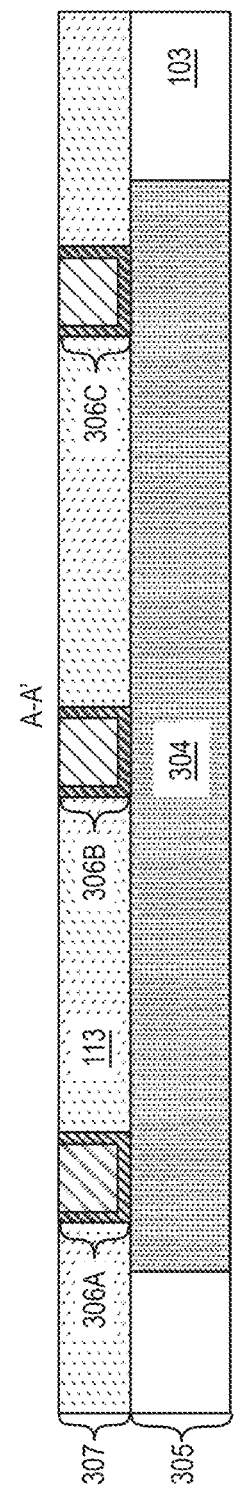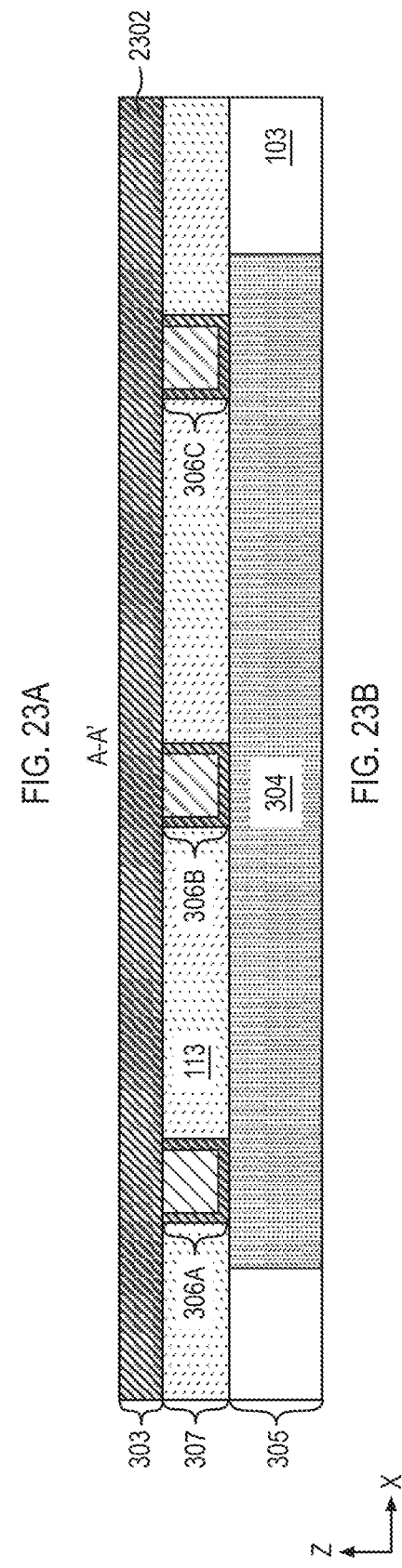

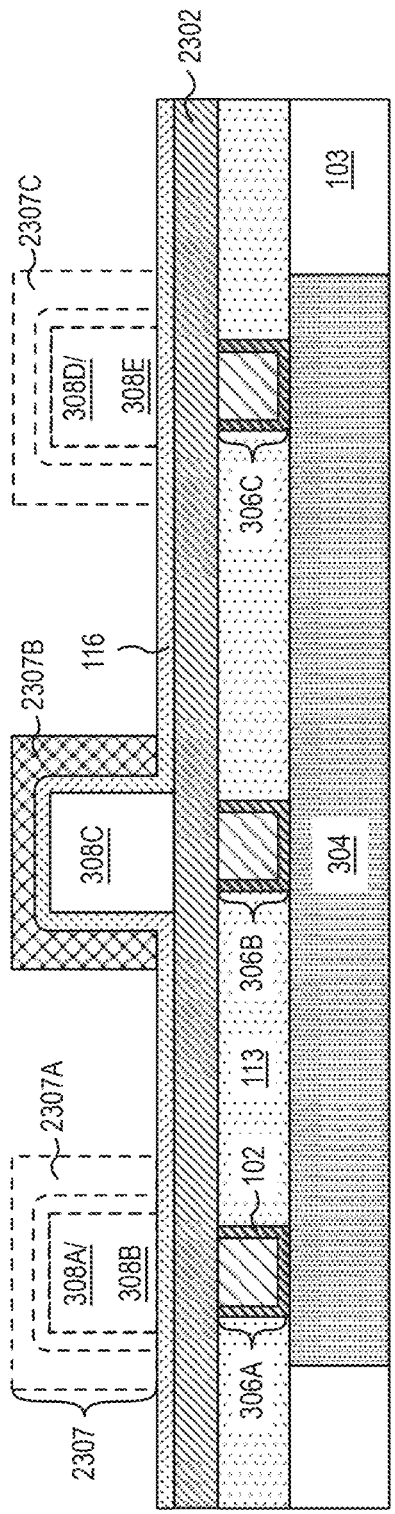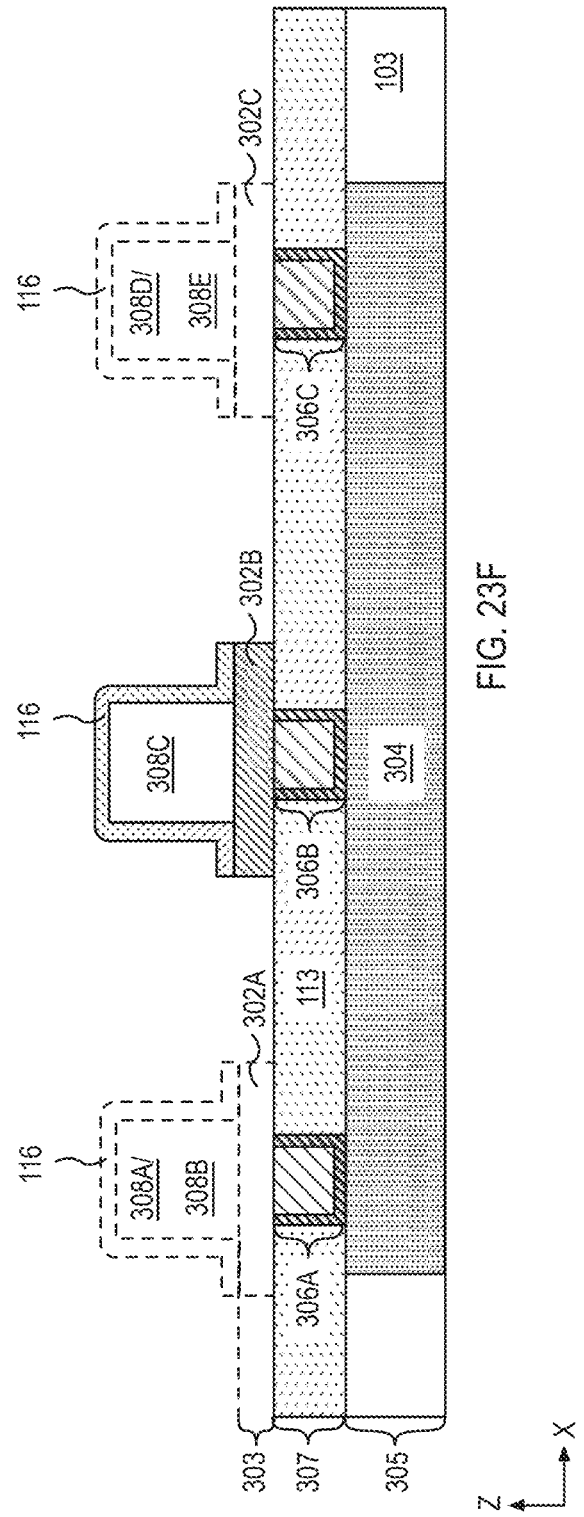
FIG. 23E
FIG. 23F

METHODS OF FABRICATING PLANAR CAPACITORS ON A SHARED PLATE ELECTRODE

CLAIM FOR PRIORITY

This application is a Continuation of, and claims the benefit of priority to, U.S. patent application Ser. No. 17/654,917, filed on Mar. 15, 2022, and which is incorporated by reference in its entirety.

BACKGROUND

Integration of capacitors including ferroelectric or paraelectric materials on a same plane as interconnects of logic devices can be challenging. When spacing between capacitors are scaled, integrating connections between transistors and routing interconnects can be challenging. As such, alternate methods to form structures that can couple two or more capacitors are desirable to increase charge storage and facilitate operation of memory and logic devices based on capacitors.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1B is a plan-view illustration of a plate electrode that has a rectangular profile, in accordance with an embodiment of the present disclosure.

FIG. 1C is a plan-view illustration of a plate electrode that has a substantially U-shaped plan view profile, in accordance with an embodiment of the present disclosure.

FIG. 1D is a plan-view illustration of a plate electrode that has a substantially "I" or "H" shaped plan view profile, in accordance with an embodiment of the present disclosure.

FIG. 1E is a cross-sectional illustration of layers within the memory device, in accordance with an embodiment of the present disclosure.

FIG. 1F is a cross-sectional illustration of layers within a memory device, where the memory device is protected by a combination of conductive and insulative hydrogen barriers, in accordance with an embodiment of the present disclosure.

FIG. 1G is a cross-sectional illustration of a plurality of memory devices above a plate electrode, where the plate electrode has a variable thickness along a lateral direction.

FIG. 1H is a cross-sectional illustration of a plate electrode, where an uppermost surface of the plate electrode in an immediate vicinity of memory device is substantially uniformly recessed.

FIG. 1I is a cross-sectional illustration of a memory device comprising tapered sidewalls, where a spacer on sidewalls of the tapered sidewalls has a variable thickness, in accordance with an embodiment of the present disclosure.

FIG. 1J is a cross-sectional illustration of a plurality of memory devices above a plate electrode, where the plate electrode has a variable thickness along a lateral direction, and where memory devices have a spacer on sidewalls, in accordance with embodiments of the present disclosure.

FIG. 3 is an isometric illustration of device structure 300 that includes one or more features of plate electrode in FIG. 1D, in accordance with an embodiments of the present disclosure.

FIG. 4C is an isometric illustration of system that includes device structure including a pair of memory devices on a plate electrode that is coupled with a gate contact of a transistor, in accordance with an embodiment of the present disclosure.

FIG. 4D is a cross-sectional illustration of the system in FIG. 4C through a midplane.

FIG. 6A is a cross-sectional illustration of a fin structure formed on a substrate.

FIG. 6B is an isometric illustration of the structure in FIG. 6A following the process to form a dielectric adjacent to a portion of the fin structure.

FIG. 6C is an isometric illustration of the structure in FIG. 6B following the formation of a dummy gate on the fin.

FIG. 8A is a cross-sectional illustration of the structure in FIG. 7 following the process to form a conductive interconnect opening above the via electrode, in accordance with an embodiment of the present disclosure.

FIG. 8B is a cross-sectional illustration of the structure in FIG. 8A following the process to form a conductive interconnect to couple with the via electrode followed by the process to deposit an etch stop layer on the conductive interconnect.

FIG. 9A is a cross-sectional illustration of a portion of the structure in FIG. 8 following the process to etch an opening in the etch stop layer to form an electrode structure.

FIG. 9B is an isometric illustration of an opening in the etch stop layer, in accordance with an embodiment of the present disclosure.

FIG. 9C is an isometric illustration of an opening in the etch stop layer, in accordance with an embodiment of the present disclosure.

FIG. 10A is a cross-sectional illustration of the structure in FIG. 9A following the process to deposit conductive fill material within the opening, in accordance with an embodiment of the present disclosure.

FIG. 10B is a cross-sectional illustration of the structure in FIG. 10A following the process to form the conductive fill material within a portion of the opening, on the etch stop layer.

FIG. 10C is a cross-sectional illustration of the structure in FIG. 10B following the process to form a conductive hydrogen barrier on the conductive fill material, in the opening, to form an electrode structure, in accordance with an embodiment of the present disclosure.

FIG. 11A is a cross-sectional illustration of the structure in FIG. 9A following the process to deposit one or more electrode materials including a conductive hydrogen barrier material on a conductive interconnect and on the etch stop layer.

FIG. 11B is a cross-sectional illustration of the structure in FIG. 11A following the process to deposit a fill material in the remaining portions of opening, on the conductive hydrogen barrier material.

FIG. 11C is a cross-sectional illustration of the structure in FIG. 11B following the process to planarize the fill material and the conductive hydrogen barrier material to form an electrode structure, in accordance with an embodiment of the present disclosure.

FIG. 12D is a cross-sectional illustration of the structure in FIG. 12C following the process to pattern the material layer stack to form a plurality of memory devices.

FIG. 13A is a cross-sectional illustration of the structure in FIG. 12D following the formation of an encapsulation layer on the plurality of memory devices, in accordance with an embodiment of the present disclosure.

FIG. 15A is a cross-sectional illustration of the structure in FIG. 14 following the process to deposit a second encapsulation layer on a first encapsulation layer, and on exposed portions of etch stop layer in memory and logic regions, in accordance with an embodiment of the present disclosure.

FIG. 15B is a cross-sectional illustration of a portion of the structure in FIG. 15A, following the process to etch the second encapsulation layer and form a spacer adjacent to sidewalls of the plate electrode, in accordance with an embodiment of the present disclosure.

FIG. 16A is a cross-sectional illustration of the structure in FIG. 14 following the process to form openings in a dielectric where individual openings expose a respective memory device.

FIG. 16B is a cross-sectional illustration of the structure in FIG. 16A following the process to deposit conductive materials into the openings.

FIG. 16C is a cross-sectional illustration of the structure in FIG. 16A following the process to planarize the conductive materials to form via electrodes.

FIG. 16F is a cross-sectional illustration of the structure in FIG. 16E following the process to form via structure in the via opening and metal structures in the hanging trenches, in accordance with an embodiment of the present disclosure.

FIG. 17A is a cross-sectional illustration of the structure in FIG. 16F where the plate electrode extends beyond a side wall of one of the memory devices.

FIG. 17B is a cross-sectional illustration of the structure in FIG. 17A following the process to form a via opening in the dielectric and in the encapsulation layer.

FIG. 17C is a cross-sectional illustration of the structure in FIG. 17B following the process to form a via electrode on the plate electrode, in accordance with an embodiment of the present disclosure.

FIG. 18A is a cross-sectional illustration of the structure in FIG. 13A, following the process to form a spacer adjacent to sidewall of a plurality of memory devices.

FIG. 18B is a cross-sectional illustration of the structure in FIG. 18A following the process to mask and etch the electrode layer.

FIG. 18C is a cross-sectional illustration of the structure in FIG. 18B following the process to form a via opening above a respective memory device.

FIG. 18D is a cross-sectional illustration of the structure in FIG. 18C following the process to form a via electrode above a respective memory device, form metal structures or lines, and a via structure in logic region.

FIG. 20C is a cross-sectional illustration of a device structure including a plurality of trench capacitors including a conductive hydrogen barrier, above a shared plate electrode in a memory region, in accordance with an embodiment of the present disclosure.

FIG. 20D is a cross-sectional illustration of a device structure including a plurality of trench capacitors above a shared plate electrode in a memory region, in accordance with an embodiment of the present disclosure.

FIG. 21A is a cross-sectional illustration of the structure in FIG. 12B following the process to mask, and etch to form plate electrode, in accordance with an embodiment of the present disclosure.

FIG. 21B is a cross-sectional illustration of the structure in FIG. 21A following the process to form openings in a first dielectric formed on plate electrode, in accordance with an embodiment of the present disclosure.

FIG. 21C is a cross-sectional illustration of the structure in FIG. 21B following the process to deposit layers to form trench capacitors into respective openings.

FIG. 21D is a cross-sectional illustration of the structure in FIG. 21C following the process to form trench capacitors by planarizing and removing the layers above the first dielectric.

FIG. 21E is a cross-sectional illustration of the structure in FIG. 21D following the process to form openings in a second dielectric above a respective trench capacitor and above the first dielectric.

FIG. 21F is a cross-sectional illustration of the structure in FIG. 21E following the process to form via electrode in the second dielectric on a respective trench capacitor.

FIG. 21G is a cross-sectional illustration of the structure in FIG. 21F following the process to form hanging trench openings and a via opening in one of the hanging trench openings in the logic region, in accordance with an embodiment of the present disclosure.

FIG. 21H is a cross-sectional illustration of the structure in FIG. 21G following the process to form metal lines or structures and a via structure, in the logic region.

FIG. 22 is a plan view illustration of device structure in FIG. 3, in accordance with some embodiments of the present disclosure.

FIG. 23A is a cross-sectional illustration of a plurality of electrode structures formed above a conductive interconnect, in accordance with an embodiment of the present disclosure.

FIG. 23B is a cross-sectional illustration of the structure in FIG. 23A following the process to deposit an electrode layer on the plurality of electrode structures, in accordance with an embodiment of the present disclosure.

FIG. 23E is a cross-sectional illustration of the structure in FIG. 23D following the process to form an encapsulation layer on the memory devices and on the electrode layer.

FIG. 23F is a cross-sectional illustration of the structure in FIG. 23E following the process to mask and etch the electrode layer to form a plurality of separated plate electrodes in accordance with an embodiment of the present disclosure.

DETAILED DESCRIPTION

Figure 1A:
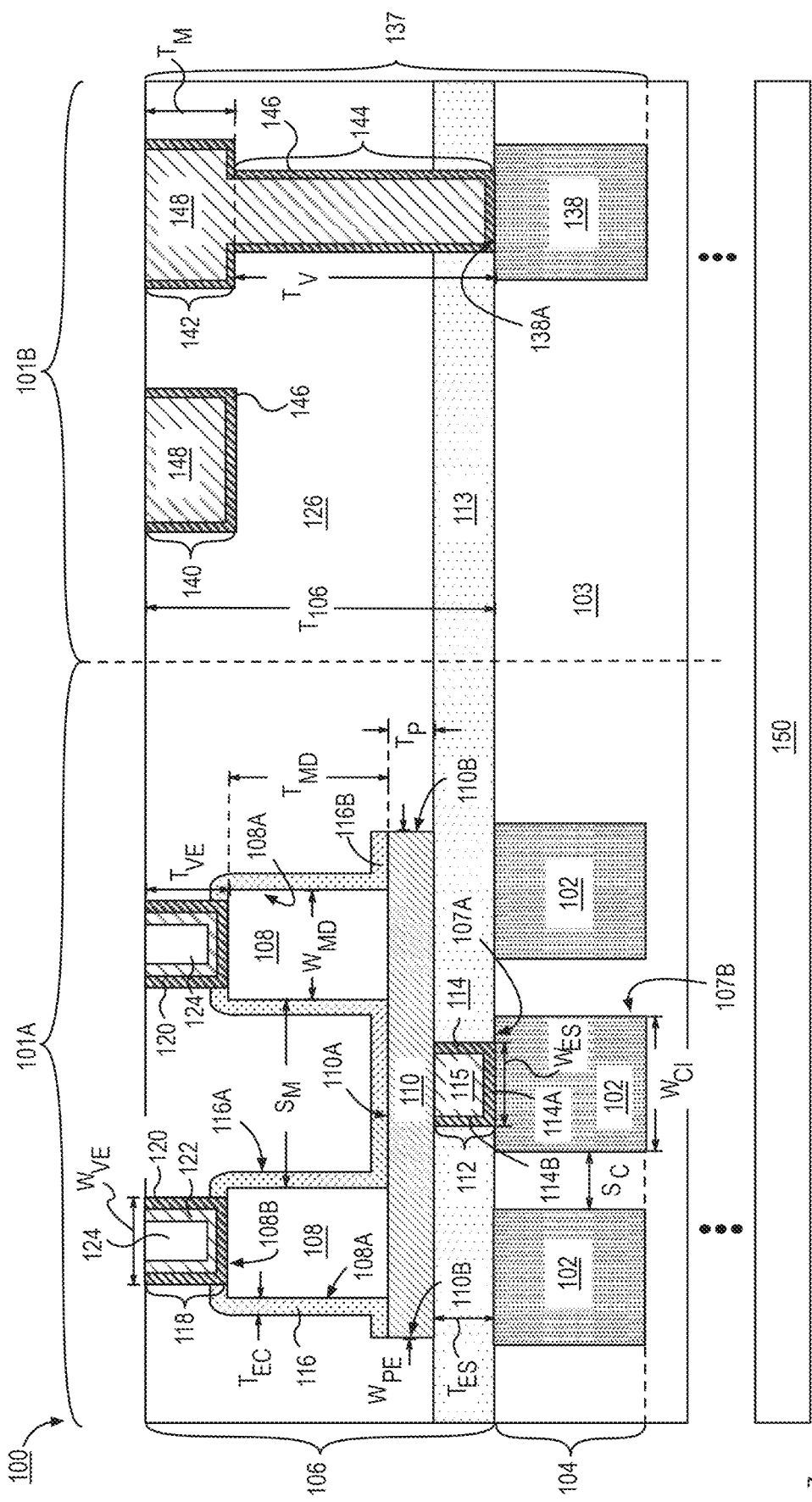
FIG. 1A is a cross-sectional illustration of a device structure including a plurality of memory devices coupled by a shared plate electrode in a memory region adjacent to interconnect structures in a logic region, in accordance with an embodiment of the present disclosure.

Capacitors with shared electrode are described. While various embodiments are described with reference to FeRAM or paraelectric RAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a," "an," and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to current signal, voltage signal, magnetic signal, or data/clock signal.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Unless otherwise specified in the explicit context of their use, the terms "substantially equal," "about equal," and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. Similar distinctions are to be made in the context of component assemblies.

The term "between" may be employed in the context of the z-axis, x-axis, or y-axis of a device. A material that is between two other materials may be in contact with one or both of those materials. In another example, a material that is between two or other materials may be separated from both of the other two materials by one or more intervening materials. A material "between" two other materials may therefore be in contact with either of the other two materials. In another example, a material "between" two other materials may be coupled to the other two materials through an intervening material. A device that is between two other devices may be directly connected to one or both of those devices. In another example, a device that is between two other devices may be separated from both of the other two devices by one or more intervening devices.

Capacitors with a wide variety of materials have been implemented for memory (random-access memory or RAM) applications. Perovskite materials have been implemented in capacitors for high density FeRAM applications owing to their low power consumption and high on/off ratio. Perovskite FeRAM devices (herein FeRAM devices) are also desirable over other forms of memory, such as magnetic tunnel junction (MTJ)-based devices, due to the relatively low number of layers within a device compared to the MTJ. A typical FeRAM device may be fully operational with three layers, where a ferroelectric dielectric is contained between two electrode layers. The electrode layers may also include perovskite materials to enable lattice matching and reduction in electrical resistance. Introduction of lead-free perovskite materials offer additional environmental benefits without sacrificing device performance.

The ferroelectric capacitors may be integrated with transistors in a first region of a substrate. In some examples the first region may be a memory region. For example, ferroelectric capacitors may be on a memory level above a transistor level. There may be one or more layers of conductive interconnects between the ferroelectric capacitors (herein ferroelectric devices) and transistors in the transistor level.

To facilitate individual programing of capacitors while connecting to a single transistor architecture, such as cross point memory, has been used elsewhere. However, the cell size in such architectures is dependent on the size of transistors and increase in device density drives shrinking of transistor size. In some applications it is beneficial to simultaneously couple multiple capacitors in the memory level with a single transistor directly below. However, coupling two or more capacitors on a single plane with a single transitory below can present challenges. The immediate vicinity of the transistor is often replete with interconnect circuitry comprising intersecting lines that present tight spaces to route multiple lines to capacitors above.

This problem has been partially overcome by inserting an electrode structure between metal lines and the capacitors. Two or more electrode structures can be utilized to couple multiple capacitors to a single metal line, below, to a single transistor, but the number of capacitors and the arrangement of capacitors is limited by this method. The limitation being that capacitors to be coupled to a single metal line need to be arranged along a direction parallel to the metal line.

The presence of multiple metal lines within a given level can create further complications because often metal lines can run parallel within a given level. The shape of the electrode structures cannot be changed arbitrarily to add two or more capacitors in any direction other than parallel, because the electrode structure can intersect with unwanted metal lines leading to shorts.

This is overcome by devising a structure that couples two or more capacitors by a plate electrode that is within the immediate vicinity of the capacitors. The two or more capacitors can then be coupled through the plate electrode via at least a single routing connection to the transistor below. Fabricating the plate electrode at the level of the capacitors offers additional flexibility. The advantage of this approach is that the shape and size of the plate electrode can be determined just before or after fabricating the capacitors. The shape and size can also be adjusted by the number of capacitors to be coupled and the arrangement of the capacitors. A single electrode structure can be positioned between the plate electrode and the metal line. In other embodiments, multiple electrode structures can be positioned between the plate electrode and the metal line to reduce resistance, as long as the electrode structures do not intersect with neighboring metal lines.

The presence of the electrode structures between the plate electrode and the metal lines is additionally advantageous because electrode structures are within a level that provides capacitance shielding between the metal lines and capacitors above. The electrode structures are laterally surrounded by an etch stop layer which limits capacitance between metal lines and the plate electrodes. Furthermore, thickness of the etch stop layer is maintained at a nominal value that limits this capacitance. Additionally, the etch stop layer thickness may also be determined by an etch margin required to pattern the electrode structure. A thicker etch stop layer offers a greater etch margin.

In an embodiment, the plate electrode may be patterned by a plasma etch process utilized to pattern and form planar capacitors. The plasma etch process may etch portions of the plate electrode and create recessed portions. In other implementations, forming a trench capacitor does not recess regions outside the trench capacitor. Trench capacitors are typically formed after forming an opening in a dielectric. Hence, regions of plate electrode outside of a periphery of the trench capacitor are not exposed and are not recessed.

While a single transistor may be coupled with the plate electrode in one embodiment, in other embodiments, two transistors can be simultaneously coupled to the plate electrode. As such the plate electrode may extend over both transistors. In some such embodiments, a gate contact of one transistor may be coupled with a drain contact of another transistor, where the gate and drain contacts are physically connected by a bridge structure. Transistors may be in close proximity, such as side by side and on the same horizontal plane to minimize electrical resistance. In some embodiments, two transistors can be coupled to as many as 128 capacitors.

To enable high density FeRAM devices, non-lead-based perovskite materials can be utilized, which are environmentally friendly for mass production. A stack for ferroelectric capacitors can include one or more hardmask materials. The one or more hardmask materials can include dielectric materials, metallic materials, or a combination thereof. Implementation of an etch with high selectivity (such as a reactive ion etching, or plasma etch process) between the hardmask and device layers can advantageously enable patterning.

However, FeRAM devices, including lead-free perovskite materials, are prone to damage from reaction with hydrogen during processing. Specifically, the damage may be the result of hydrogen traveling along grain boundaries between or along electrodes coupled with two terminals of a FeRAM device. Hydrogen can cause reduction when it reacts with the one or more materials of the FeRAM device, such as the electrodes or the ferroelectric material itself. Sources of hydrogen during fabrication arise from anneal operations carried to tie up dangling bonds. However, FeRAM devices can lose their polarization hysteresis characteristics as a result of hydrogen reduction.

In some embodiments, the capacitor devices have a planar structure where the individual layers are sequentially layered, one on top of another, where the layers are patterning into cylindrical (circular or elliptical) or rectangular shapes. Thus, it is highly desirable to protect capacitor sidewalls, top, and bottom surfaces from reacting with hydrogen. In some embodiments, solutions against hydrogen diffusion include forming an encapsulation layer that includes an insulating material, such as silicon nitride, to protect sidewalls, and top surfaces. The encapsulation layer can provide protection against hydrogen diffusion into the capacitor. A contact or via electrode at a top of the FeRAM device may be formed by piercing through the insulating barrier layer and exposing one or more top electrode materials. The barrier layer itself may be further surrounded by additional insulating material such as an interlayer dielectric (ILD). ILD materials such as silicon oxide or silicon oxide doped with carbon in general do not act as a hydrogen diffusion barrier and are less desirable directly in contact with one or more layers of the memory device.

In other examples, hydrogen may diffuse through one or more materials of the contact electrode towards the FeRAM device stack through a top electrode. To protect against hydrogen diffusion through a top surface of the top electrode, noble metals have been implemented as part of the contact electrode structure. However, noble metals normally have crystalline structures due to strong metallic bonding. Hence their amorphous phase is thermodynamically unstable favoring transformation into a crystalline phase.

Furthermore, it is to be appreciated that hydrogen can also diffuse from layers below a bottom electrode of the ReRAM device. Typically, the bottom electrode is physically isolated from a conductive interconnect by at least one electrode structure. The conductive interconnect may be laterally surrounded by an ILD. The electrode structure may be laterally surrounded by an insulator layer that can act as a barrier against hydrogen diffusion as well as provide etch stop capability while patterning the ReRAM stack. The insulator layer is typically formed above the ILD and the conductive interconnect. The interface between the electrode structure and the conductive interconnect can be a pathway for hydrogen diffusion. Depending on a width of the electrode structure relative to the conductive interconnect. the electrode structure may be in contact with the ILD adjacent to the conductive interconnect.

A dual hydrogen barrier is devised, that includes an insulative hydrogen barrier material directly adjacent to the memory device and a conductive hydrogen barrier that is integrated as part of the contact electrode. In some embodiments, the contact electrode may have the shape of a via that includes a conductive hydrogen barrier having a first portion directly in contact with the memory device and a second portion that laterally surrounds a conductive (contact) material. The conductive contact material may further include one or more layers. The contact electrode may extend over a portion or an entire uppermost surface of the memory device.

To provide a barrier against hydrogen diffusion towards a bottom electrode, the electrode structure may also include a conductive hydrogen barrier material. The structure of the electrode structure may depend on the size of the memory device relative to the electrode structure. In embodiments, the electrode structure may include a conductive hydrogen barrier laterally surrounding a conductive material. In other embodiments, the electrode structure may include conductive hydrogen barrier directly across a top portion and in direct contact with the memory device.

To provide a barrier against hydrogen diffusion directly into sidewalls of the memory device, a dielectric that is amorphous, having a high film density (a film density above 90% of theoretical material density or film density) and is electrically insulating, may be directly in contact with the sidewalls of the memory device, in embodiments where no encapsulation layer is present. Furthermore, when memory devices are integrated in a high density array, the space between the devices may not be large enough to deposit an encapsulation layer as well as an ILD. In some such instances the high film density-dielectric is present over the entire memory region. In other embodiments, the encapsulation layer between two adjacent memory devices may merge together. Memory devices in the first region may be directly adjacent to a second region within a memory level, for system functionality. In particular, the capacitors may be in close proximity to routing interconnects in the logic region. Routing interconnects may be implemented to route voltage and signals between circuit elements in the second region. To minimize line capacitance, the routing interconnects are embedded within a low dielectric constant interlayer dielectric (ILD), where the ILD has a low film density (less than 90% film density) or a high porosity material.

FIG. 1A is a cross-sectional illustration of device structure 100, including region 101A, adjacent to region 101B above substrate 150. The region 101A and 101B may be, for example, a memory region and a logic region, respectively or vice versa. In the illustrative embodiment, region 101A is a memory region and region 101B is a logic region. Memory region 101A may include a plurality of conductive interconnects within level 104 as shown. Conductive interconnects 102 may be lines or vias. The Figure reference 102 may also be used herein to refer to a single conductive interconnect 102. Conductive interconnects 102 may be substantially identical within level 104 with regards to material composition. Conductive interconnects 102 are spaced apart by a distance, $S_C$. Conductive interconnects 102 are laterally surrounded by dielectric 103. Dielectric 103 includes a material having a low film density, such as density less than 90% of theoretical material density. A low density film can help to minimize capacitance between conductive interconnects 102. In some embodiments, dielectric 103 includes a material having a dielectric constant that is below 3.5. Dielectric 103 may include $SiO_2$, SiOC, SiC, or $SiO_2$ doped with F. The device structure 100 further includes level 106 above level 104. Level 106 includes an electrode structure 112 on at least a portion of one of conductive interconnects 102. Electrode structure 112 is in contact with one of conductive interconnects 102, as illustrated.

Device structure 100 further includes a plurality of memory devices 108 above electrode structure 112, where individual ones of the plurality of memory devices 108 include one or more ferroelectric materials, one or more paraelectric materials or one or more anti ferroelectric material. In the illustrative embodiment, memory devices 108 within device structure 100 are substantially structurally identical. While two memory devices 108 are illustrated, an array can have any number of memory devices 108 that are substantially identical. As shown, a pair of memory devices 108 is above and electrically coupled with conductive interconnect 102. The reference label 108 may also be used herein to refer to single memory device 108.

Plate electrode 110 is coupled between memory devices 108 and electrode structure 112. Plate electrode 110 extends on a single plane (X-Y in the Figure). Plate electrode 110 is designed to couple a plurality of memory devices 108 to at least one transistor (such as illustrated FIG. 4A). Plate electrode 110 is in contact with and extends continuously under memory devices 108. In some embodiments, single plate electrode 110 can couple as many as 128 memory devices 108. The number of devices can depend on a variety of factors, such as but not limited to, dielectric constant, polarization density, and thickness of a dielectric layer in memory device 108, as well as on circuit parameters such as sense margin requirements and parasitic capacitance within the device structure 100. Plate electrode 110 extends at least beyond respective sidewall 108A of memory devices 108. In an exemplary embodiment, plate electrode 110 extends beyond a perimeter of memory devices 108. Plate electrode 110 may cover at least a portion or all of electrode structure 112. Extent of coverage of plate electrode 110 depends on shape and size of plate electrode 110 relative to shape and size of electrode structure 112. In the illustrative embodiment, plate electrode 110 extends beyond a perimeter of the electrode structure 112. Sense margin may be understood to be an ability of an electrical circuit to differentiate between the signature of a stored value of 1 or 0, factoring in the sense-amplifier's offset variation, storage element's signal variation and reference signal generators variation.

Plate electrode 110 has a lateral thickness $W_{PE}$ that extends over a plurality of conductive interconnects 102, as shown. $W_{PE}$ can be a length or width depending on a plan view shape of plate electrode 110. In the illustrative embodiment, plate electrode 110 enables electrical coupling between multiple memory devices 108 and chosen conductive interconnect 102 through electrode structure 112, without shorting with other conductive interconnects 102. Plate electrode 110 may include a material such as TaN, TiAlN, TiAlO, Pt, Ir, Co, Mo, W, Ru, Al, Ta, Ti, AlCu, Nb, or Cr.

FIGS. 1B-1D are plan view illustrations of various embodiments of plate electrode 110. Plate electrode 110 is designed to couple at least a pair of memory devices 108. In some configurations plate electrode 110 is designed to configure 16 devices within a bit-cell. A bit-cell may generally be regarded as a repeating cell structure that can have one or more storage elements and is addressed by a combination of signals in an array.

FIG. 1B is a plan-view illustration of plate electrode 110 that has a rectangular profile, in accordance with an embodiment of the present disclosure. As shown, plate electrode 110 extends beyond sidewalls 108A of memory devices 108. Depending on embodiments, memory devices 108 can have a circular, rectangular, or a square (dashed lines) plan view profile. Electrode structure 112, indicated by dashed lines is substantially between a pair of memory devices 108. In alternative embodiments, electrode structure 112 can be under one of memory devices 108. As shown, electrode structure 112 is also substantially confined within a perimeter 110C of plate electrode 110.

FIG. 1C is a plan-view illustration where plate electrode 110 has a structure that is dictated by footprint of transistors and conductive interconnects. In the illustrative embodiment, plate electrode 110 has a substantially U-shaped plan view profile, where a plurality of plate electrode portions 110D that are substantially rectangular are joined by a central plate electrode portion 110E.

As shown, plate electrode portions 110D and 110E include respective memory device 108, where plate electrode portions 110D and 110E extend beyond perimeter 108C of respective memory device 108. In the illustrative embodiment, plate electrode portion 110E includes protruded portions 110F and a plurality of recessed portions 110G. Plate electrode 110 can have a shape that may be influenced by the number of devices to be coupled as well as on shapes of structures such as contacts and conductive interconnects, above and below plate electrode 110.

In some embodiments, electrode structure 112 is under one of memory devices 108, as shown. In other embodiments, electrode structure 112 can be under plate electrode 110 but not directly under memory device 108. Location of electrode structure 112 is influenced by shape and position of underlying conductive interconnect 102. Generally, electrode structure 112 overlaps with at least a portion of conductive interconnect 102. As shown in the cross-sectional illustration, electrode structure 112 overlaps completely with conductive interconnect 102.

In some embodiments, conductive interconnect 102 (not shown) may be an isolated island structure or a line. The line may extend parallel to a length of plate electrode portion 110D, or to a length of plate electrode portion 110E in the Y direction. Conductive interconnect 102 may also extend parallel to plate electrode portion 110E along the X-direction. In some such embodiments, two or more electrode structures 112 may couple plate electrode 110.

FIG. 1D is a plan-view illustration where plate electrode 110 has a complex structure that is dictated by footprint of transistors and conductive interconnects. As shown plate electrode 110 has a substantially "I" or "H" shaped plan view profile. In the illustrative embodiment, plate electrode 110 includes a plate electrode portion 110H that extends along a first direction (X-direction) on plane 151, plate electrode portion 110I that extends parallel to the first direction, where plate electrode portion 110I is on a second plane 152 behind plane 151 (above in the Figure). Plate electrode 110 further includes plate electrode portion 110J that extends orthogonally from plate electrode portion 110H to plate electrode portion 110I and is joined with plate electrode portion 110H to plate electrode portion 110I.

As shown, plate electrode 110 has a substantially I-shaped plan view profile, where plate electrode portion 110J is connected to a midpoint of plate electrode portion 110H and to a midpoint of plate electrode portion 110I. In other embodiments, plate electrode portion 110I is not connected symmetrically to plate electrode portions 110H and 110J. Symmetry between plate electrode portions may not be required for device functionality.

As shown, plate electrode portions 110H and 110I include a pair of memory devices 108, and plate electrode portion 110J includes a single memory device 108. Plate electrode portion 110J has one or more features of the plate electrode portion 110E (FIG. 1C), such as protruded portions 110F and recessed portions 110G. Recessed portions 110G may be recessed relative to protruded portions 110F, as shown. Plate electrode portions 110H, 110I, and 110J extend beyond a perimeter of a respective memory device 108 contained within each plate electrode portion.

In some embodiments, electrode structure 112 is under one of memory devices 108, as shown. In other embodiments, electrode structure 112 is under plate electrode 110 but not directly under any of the memory devices 108. In an embodiment, a single electrode structure 112 may be utilized to couple plate electrode 110 to a gate or a drain of a transistor on a plane vertically below (into the plane of the Figure) the plane of plate electrode 110.

In some embodiments, conductive interconnects 102 may be an isolated island structure or a line. In the illustrative embodiment, conductive interconnects 102 are lines indicated by dashed lines. Conductive interconnects 102 may extend parallel to a length of plate electrode portion 110J, or a length of plate electrode portion 110H in the Y or X directions, respectively. In the illustrative embodiment, conductive interconnect 102 extends along a direction parallel to a length of plate electrode portion 110J. In one such embodiment, a plurality of electrode structures 112 may be positioned along a length of conductive interconnect 102A. A single electrode structure 112 may be advantageous from a perspective of alignment between plate electrode 110 and conductive interconnect 102 during fabrication. However, a plurality of electrode structures 112 may be utilized to lower electrical resistance. The number of electrode structures 112 can be designed to advantageously facilitate electrical requirements while minimizing processing complexities.

In some embodiments, conductive interconnects 102 may be segmented lines such as conductive interconnect 102B, where portions of conductive interconnect 102B may be under different portions of plate electrode 110.

Referring again to FIG. 1A, device structure 100 further includes encapsulation layer 116 on respective sidewall 108A of memory devices 108. Encapsulation layer 116 is a dielectric that is designed to protect layers within memory devices 108 by providing a hermetic seal. Encapsulation layer 116 may also be an example of an insulative hydrogen barrier layer. In the illustrative embodiment, encapsulation layer 116 extends contiguously on sidewalls 108A, uppermost surface 108B and on uppermost surface 110A of plate electrode 110. Encapsulation layer 116 fills a space between adjacent memory devices 108. Encapsulation layer 116 includes portion 116B that is substantially aligned with a perimeter of plate electrode 110. As shown, encapsulation layer 116 is substantially aligned with sidewalls 110B of plate electrode 110. Alignment may be indicative of a process utilized to fabricate device structure 100. In an embodiment, encapsulation layer 116 includes metal and oxygen, such as, for example, $Al_xO_y$, $HfO_x$, $ZrO_x$, $TaO_x$, $TiO_x$, $AlSiO_x$, $HfSiO_x$, or $TaSiO_x$, or a mixture including silicon and nitrogen, or silicon, nitrogen, and carbon, where x is equal to 2 and y is equal to 3.

Electrode structure 112 is laterally surrounded by etch stop layer 113. In exemplary embodiments, etch stop layer 113 includes a dielectric material. In exemplary embodiments, the dielectric material of etch stop layer 113 does not include a metal. Electrode structure 112 may cover an entire top surface or at least a portion of the top surface of conductive interconnect 102, depending on lateral thickness (or width), $W_{ES}$, of electrode structure 112 compared to lateral thickness, $W_{CI}$, of conductive interconnect 102. In the illustrative embodiment, $W_{ES}$ is less than $W_{CI}$. In some embodiments, $W_{ES}$ is greater than $W_{CI}$. To avoid shorting between multiple conductive interconnects 102, electrode structure 112 has lateral thickness $W_{CI}$, that is less than a combined sum of lateral thickness $W_{CI}$, and two times the spacing $S_C$.

Hydrogen may diffuse from dielectric 103 to memory device 108. For example, interface 107A between etch stop layer 113 and conductive interconnect 102, and interface 107B between conductive interconnect 102 and dielectric 103 may provide pathways for hydrogen diffusion. To prevent hydrogen diffusion through interfaces 107A and 107B, electrode structure 112 can include a hydrogen barrier layer along interfaces 107A and 107B. The hydrogen barrier layer may have various structural embodiments as will be presented below.

In the illustrative embodiment, electrode structure 112 includes conductive hydrogen barrier 114 and conductive fill material 115 adjacent to conductive hydrogen barrier 114. As shown, conductive hydrogen barrier 114 extends along interfaces 107A and 107B and is in contact with uppermost surface of conductive interconnect 102. In the illustrative embodiment, conductive hydrogen barrier 114 includes portion 114A, which is below conductive fill material 115 and portion 114B that laterally surrounds conductive fill material 115. Portion 114B is directly between conductive fill material 115 and etch stop layer 113. Portion 114A is directly between conductive fill material 115 and conductive interconnect 102. In the illustrative embodiment, where $W_{ES}$ is less than $W_{CI}$, portion 114A is fully contained within conductive interconnect 102. In other embodiments, $W_{ES}$ is greater than $W_{CI}$, and portion 114A is in contact with dielectric 103. Conductive hydrogen barrier 114 and etch stop layer 113 form a dual hydrogen barrier from below memory device 108.

Conductive hydrogen barrier 114 includes a material that is amorphous. Amorphous materials lack defined grain boundaries that can facilitate hydrogen diffusion and are thus desirable. Embodiments of the conductive hydrogen barrier 114 include materials such as, but not limited to: TiAlN, with >30 atomic percent AlN; TaN, with >30 atomic percent $N_2$; TiSiN, with >20 atomic percent SiN; Ta carbide, TaC, Ti carbide; TiC; tungsten carbide; WC; tungsten nitride; WN; carbonitrides of Ta, Ti, W, i.e., TaCN, TiCN, WCN; titanium monoxide; TiO; $Ti_2O$; Tungsten oxide; WO3,Tin oxide; $SnO_2$; indium tin oxide; ITO; iridium oxide; indium gallium zinc oxide; IGZO; and zinc oxide or METGLAS series of alloys, e.g., $Fe_{40}Ni_{40}P_{14}B_6$. In some embodiments, conductive hydrogen barrier 114 has a thickness that is less than 5 nm.

In some embodiments, plate electrode 110 includes a material that provides a barrier against hydrogen and oxygen diffusion. In such embodiments, the conductive hydrogen barrier 114 may not be included within electrode structure 112.

In the illustrative embodiment, level 106 further includes a plurality of via electrodes 118 that are coupled to respective memory device 108. In an exemplary embodiment, via electrodes 118 are substantially identical. As shown, individual ones of the plurality of via electrodes 118 are on respective memory device 108.

Via electrode 118 may include different structural arrangements of two or more conductive layers. In some embodiments, memory devices 108 do not include a conductive hydrogen barrier above a ferroelectric dielectric layer. In such embodiments, via electrode 118 includes at least one conductive hydrogen barrier, such as conductive hydrogen barrier 120 on an uppermost surface of memory device 108. Depending on the material of conductive hydrogen barrier 120, via electrode 118 may or may not include a liner layer. In the illustrative embodiment, via electrode 118 further includes liner layer 122 directly adjacent to conductive hydrogen barrier 120 and conductive fill material 124 adjacent to liner layer 122. Liner layer 122 may include Ti, Ta, TiN, TaN, Ru, or any other conductive material that can provide adhesion to conductive fill material 124.

In the illustrative embodiment, conductive hydrogen barrier 120 laterally surrounds liner layer 122, and liner layer 122 laterally surrounds conductive fill material 124. Conductive fill material 124 may include material such as tantalum, titanium, ruthenium, tungsten, molybdenum, or copper.

In the illustrative embodiment, conductive hydrogen barrier 120 is on a portion of uppermost surface 108B and directly adjacent to encapsulation layer 116. As such, surface 108B is substantially protected from diffusion of hydrogen into portions of memory device 108.

Embodiments of conductive hydrogen barrier 120 include a material that is amorphous. Amorphous materials lack defined grain boundaries that can facilitate hydrogen diffusion. Embodiments of conductive hydrogen barrier 120 include materials such as, but not limited to: TiAlN, with >30 atomic percent AlN; TaN, with >30 atomic percent N2; TiSiN, with >20 atomic percent SiN; Ta carbide; TaC; Ti carbide; TiC; tungsten carbide; WC; tungsten nitride; WN; carbonitrides of Ta, Ti, W, i.e., TaCN, TiCN; WCN; titanium monoxide; TiO; $Ti_2O$; Tungsten oxide; $WO_3$; Tin oxide; $SnO_2$; indium tin oxide; ITO; iridium oxide; indium gallium zinc oxide; IGZO; Zinc Oxide, or METGLAS series of alloys, e.g., $Fe_{40}Ni_{40}P_{14}B_6$. In some embodiments, conductive hydrogen barrier 120 has a thickness that is dependent on $W_{VE}$. In some embodiments, conductive hydrogen barrier 120 has a thickness that is less than 5 nm. It is to be appreciated that conductive hydrogen barrier 120 may include a material that is the same or different from the material of conductive hydrogen barrier 114.

The extent to which encapsulation layer 116 is on memory device 108 is dependent on a lateral width $W_{MD}$, of memory device 108 compared to a width $W_{VE}$, of via electrode 118. In some embodiments, as is illustrated, memory device 108 has width $W_{MD}$, that is greater than width $W_{VE}$. In some such embodiments, encapsulation layer 116 covers at least a portion of uppermost surface 108B.

In some embodiments, such as is shown, device structure 100 further includes dielectric 126 spanning the entire memory region 101A and logic region 101B. As shown, dielectric 126 laterally surrounds memory devices 108 and is in direct contact with sidewalls 116A of encapsulation layer 116. Dielectric 126 also laterally surrounds via electrodes 118. In particular, dielectric 126 is directly adjacent to conductive hydrogen barrier 120.

In the illustrative embodiment, dielectric 126 spans an entire space between any pair of adjacent memory devices 108. In some embodiments, dielectric 126 includes a low density $SiO_x$, SiN, SiCN, SiC, or SiON. A low density material has film density less than 90% of theoretical material density.

With an intervening plate electrode 110, conductive interconnect 102, electrode structure 112, and memory devices 108 can have widths that are substantially independent of each other. Additionally, misalignment between conductive interconnect 102, electrode structure 112, and plate electrode 110 may not affect operation as long as there is at least 50% overlap between them. Spacing $S_M$, between adjacent memory devices 108 depends on desired density of memory devices 108, as well as on a required minimum thickness of encapsulation layer 116. Reducing $S_M$ can advantageously increase the density of memory devices per unit plan view area of device structure 100. As will be discussed below, $S_M$ can also depend on spacing required for routing vias. In some embodiments, $S_M$ ranges between 20 nm and 100 nm. While two memory devices 108 are shown, the memory region 101A can include over 1000 memory devices 108 arranged in an array. The number of plate electrodes 110 can be selected based on number of memory devices 108 that are coupled to single plate electrode 110.

As shown, plate electrode 110 is in direct contact with a respective, lower-most conductive layer of memory devices 108. Referring to FIG. 1E, a cross section of memory device 108 is illustrated in accordance with an embodiment of the present disclosure. Depending on embodiments, memory device 108 can have three or more layers. An embodiment of memory device 108 including three layers is shown in the Figure. As shown, memory device 108 includes bottom electrode 128, dielectric layer 130, and top electrode 132.

In an embodiment, bottom electrode 128 and top electrode 132 include a conductive ferroelectric oxide (when memory device 108 is a ferroelectric memory device 108). The conductive ferroelectric oxide includes one of non-Pb perovskite metal oxides, such as but not limited to, La—Sr—CoO$_3$, SrRuO$_3$, La—Sr—MnO$_3$, YBa$_2$Cu$_3$O$_7$, Bi$_2$Sr$_2$CaCu$_2$O$_8$, or LaNiO$_3$.

In an embodiment, dielectric layer 130 is a ferroelectric dielectric layer that includes non-Pb perovskite material in the form ABO$_3$, where A and B are two cations of different sizes and O is oxygen. A is generally larger than B in size. In some embodiments, non-Pb perovskites can also be doped, e.g., by La or lanthanides. The non-Pb perovskite material can include one or more of La, Sr, Co, Cr, K, Nb, Na, Sr, Ru, Y, Fe, Ba, Hf, Zr, Cu, Ta, Bi, Ca, Ti, and Ni.

In other embodiments, ferroelectric dielectric layer 130 includes low voltage ferroelectric material sandwiched between top electrode 132 and bottom electrode 128. These low voltage FE materials can be of the form AA'BB'O$_3$, where A' is a dopant for atomic site A and can be an element from the lanthanides series, where B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. Voltage below 2-Volts is sufficiently low to be characterized as low voltage.

In some embodiments, dielectric layer 130 includes a paraelectric material, the paraelectric material comprises SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

In some embodiments, dielectric layer 130 includes an anti-ferroelectric material. The antiferroelectric material may include one of: PZT with >30% Zr doping or Sn doping >25%, La-doped PZT with >30% Zr doping and or Sn doping >20%, HfSiO2 and HfZrOx with >30% Si and >30% Zr doping, ZrO2, NaNbO3, or >5% K doped NaNbO3.

In some embodiments, ferroelectric dielectric layer 130 can dictate a choice of encapsulation layer 116. Encapsulation layer 116 may be chosen to have a Young's modulus similar to a Young's modulus of ferroelectric dielectric layer 130. Furthermore, encapsulation layer 116 may be chosen to have a low probability of presence of defects at the interface between encapsulation layer 116 and ferroelectric dielectric layer 130. Additionally, encapsulation layer 116 has a lower dielectric constant than the dielectric constant of ferroelectric dielectric layer 130 to enable field lines to be concentrated between top electrode 132 and bottom electrode 128.

For example, in some embodiments, where ferroelectric dielectric layer 130 includes a $Pb_xZr_{1-x}Ti_yO_3$ group of families, encapsulation layer 116 can include $Al_xO_y$, $HfO_x$, $ZrO_x$, $TaO_x$, or $TiO_x$. In some embodiments, where ferroelectric dielectric layer 130 includes a $La_xBi_{1-x}Fe_yO_3$ group of families, encapsulation layer 116 can include $Al_xO_y$, $HfO_x$, $ZrO_x$, $TaO_x$, or $TiO_x$. In some embodiments, where ferroelectric dielectric layer 130 includes a BaTiO$_3$ group of families, encapsulation layer 116 can include $Al_xO_y$, $HfO_x$, $ZrO_x$, $TaO_x$, or $TiO_x$. In some embodiments, where ferroelectric dielectric layer 130 includes a BiFeO$_3$ group of families, encapsulation layer 116 can include $Al_xO_y$, $HfO_x$, $ZrO_x$, $TaO_x$, or $TiO_x$.

In other embodiments, memory device 108 may include one or more layers with hydrogen barrier properties, as illustrated in FIG. 1F. Memory device 108 may include a conductive hydrogen barrier 134 directly on top electrode 132 and conductive layer 136 with hydrogen barrier properties directly below and in contact with bottom electrode 128. In some such embodiments, electrode structure 112 and via electrode 118 may not need to include a conductive hydrogen barrier. In the illustrative embodiment, electrode structure 112 includes liner layer 147 and conductive fill material 115 within bounds of liner layer 147. Liner layer 147 may include Ti, Ta, TiN, TaN, Ru, or any other conductive material that can provide adhesion to conductive fill material 115.

In some such embodiments, via electrode 118 is directly in contact with uppermost surface 134A of conductive hydrogen barrier 134.

FIG. 1G is a cross-sectional illustration of a plurality of memory devices 108 above plate electrode 110, where plate electrode 110 has a variable thickness along a lateral direction (X-direction). Plate electrode 110 has a thickness $T_P$, that depends on a choice of material as well as on the material of the lower-most layer of memory device 108, such as conductive layer 136 (FIG. 1F) or electrode 128 (FIG. 1E). In some embodiments, $T_P$, has a thickness between 5 nm and 20 nm. As shown, plate electrode 110 has a maximum thickness, $T_P$, under memory devices 108. Surface 110K of plate electrode 110 that is within an immediate vicinity of memory devices 108 may be recessed. In some embodiments, surface 110K is recessed and curved, as shown. Plate electrode 110 has a min thickness, $T_{Pmin}$, that may be between 50-90% of $T_P$. A ratio between $T_{Pmin}$:$T_P$ of at least 1:2 is sufficient to not increase resistance of plate electrode 110. $T_{Pmin}$ may depend on a number of memory devices 108, number of routing connections that may be coupled with it and signal frequency. In most embodiments $T_{Pmin}$ can be more than 5 nm.

When surface 110K is curved, encapsulation layer 116 may follow a contour of surface 110K, such as is shown. In one or more embodiments, encapsulation layer 116 can have a thickness, $T_{EC}$, that is between 1 nm and 5 nm. Encapsulation layer 116 may be substantially conformal with sidewalls 108A and uppermost surface 110K, as illustrated.

In other embodiments, plate electrode surface 110K in an immediate vicinity of memory device 108 is recessed uniformly from uppermost surface 110A, as shown in FIG. 1H. In some such embodiments, encapsulation layer 116 is also deposited on a sidewall portion 110L of plate electrode 110, as shown. encapsulation layer 116 covers an interface 139 between memory device 108 and plate electrode 110. In the illustrative embodiment, surface 110K is substantially planar. A ratio of $T_{Pmin}$:$T_P$ of at least 1:2 can provide adequate electrical conductivity, in some such embodiments.

In some embodiments, encapsulation layer 116 is substantially limited to sidewalls 108A of memory device 108 as shown in FIG. 1I. In the illustrative embodiment, sidewalls 108A of memory device 108 are substantially tapered relative to uppermost surface 110A. In some such embodiments, encapsulation layer 116 or spacer can have a thickness, $T_{EC}$, that varies with height. In the illustrative embodiment, $T_{EC}$ increases with height to a maximum thickness and then decreases adjacent to uppermost surface 108B. In one or more embodiments, $T_{EC}$, is at least 1 nm.

In other embodiments, encapsulation layer 116 is adjacent to sidewalls 108A and on a portion of the surface 110K that is curved and recessed, as shown in the cross-sectional illustration of FIG. 1J.

Referring again to FIG. 1A, via electrode 118 has a vertical thickness, $T_{VE}$. Level 106 has a vertical thickness, $T_{106}$, that is substantially equal to a combined sum of $T_{ES}$, $T_{MD}$, $T_P$, and $T_{VE}$. It is to be appreciated that individual thicknesses $T_{ES}$, $T_{MD}$, $T_P$, and $T_{VE}$ may be co-dependently chosen to optimize performance of memory device 108. For example, $T_{MD}$ may range between 20 nm and 90 nm and $T_P$, $T_{ES}$ and $T_{VE}$ may be adjusted co-dependently to balance $T_{106}$.

In the illustrative embodiment, logic region 101B includes an interconnect structure 137 spanning levels 104 and 106. Interconnect structure 137 includes one or more conductive interconnects in level 104 and one or more vias and metal lines in level 106, that are coupled with the one or more conductive interconnects. In the illustrative embodiment, interconnect structure 137 includes conductive interconnect 138 in level 104 and a plurality of metal structures 140 and 142, where metal structure 142 is coupled with conductive interconnect 138 through via structure 144. Metal structure 140 may be coupled with a conductive interconnect through a via on a different plane, behind the plane of the illustration. In some embodiments, metal structure 140 and/or metal structure 142 can be a metal line that extends into the plane of the Figure.

In the illustrative embodiment, dielectric 103, etch stop layer 113 and dielectric 126 further extend continuously from memory region 101A to logic region 101B. Dielectric 126 includes a material that is designed to minimize electrical impact to logic circuitry, for example, signal delays such as RC delays. Such electrical impact can arise due to scaling in feature sizes of metallic interconnects, such as vias and metal lines, as well as due to reduction in space between them. Increase in capacitive coupling and electrical resistance can increase signal delays. However, reducing a dielectric constant of dielectric 126 can ameliorate electrical impact. Lowering the dielectric constant may be generally associated with increasing porosity in the film. Film porosity may be greater than 90 atomic percent by volume in dielectric 126. In some embodiments dielectric 126 has a dielectric of approximately 3.5 or less. In embodiments dielectric 126 includes silicon and oxygen (such as low K $SiO_2$). In the illustrative embodiment, dielectric 126 laterally surrounds at least a portion of via structure 144. Dielectric 126 includes a material with a low film density (a film density much below 90% of theoretical material density), for example, low density $SiO_2$, carbon doped oxide (CDO), SiOC, SiCN, SiC, SiOxNy, F-doped oxides, or H-doped oxides.

In the illustrative embodiment, at least a portion of via structure 144 is adjacent to etch stop layer 113, as shown. Etch stop layer 113 may be in contact with conductive interconnect 138 depending on a lateral thickness (width along x-direction) of via structure 144. In some embodiments, such as is shown, at least a portion of etch stop layer 113 is on conductive interconnect 138.

Via structure 144 has a vertical thickness, $T_V$, as measured from a lower-most point of level 104 or from uppermost surface 138A of conductive interconnect 138, and metal structure 142 has a vertical thickness, $T_M$. In exemplary embodiments, a combined sum of $T_M$ and $T_V$ is equal to a combined sum of individual thicknesses $T_{ES}$, $T_P$, $T_{MD}$, and $T_{VE}$. In general, $T_M$ and $T_{VE}$ need not be equal. In some embodiments, $T_{VE}$ is between 80% and 100% of $T_M$. In some embodiments, $T_M$ is between 20 nm and 50 nm. In other embodiments, $T_M$ is between 50 nm and 200 nm.

In an embodiment, $T_{MD}$ has a thickness between 10 nm and 100 nm and $T_{ES}$ has a thickness between 5 nm and 20 nm. In an embodiment, sum of $T_{ES}$, $T_P$ and $T_{MD}$, is approximately between 85% and 100% of $T_V$. In some embodiments, $T_V$ is between 20 nm and 50 nm. In other embodiments, $T_V$ is between 20 nm and 150 nm.

Conductive interconnect 138 has one or more properties of conductive interconnect 102. Conductive interconnects 102 and 138 include a metal such as copper, cobalt, molybdenum, tungsten, or ruthenium. In some embodiments, conductive interconnects 102 and 138 include a liner layer and a fill metal on the liner layer. For example, the liner layer may include a material, such as but not limited to, ruthenium, cobalt, or tantalum, and the fill metal may include copper, molybdenum, or tungsten. Conductive interconnects 102 and 138 have a thickness that spans a portion of dielectric 103 within level 104. There may be other vias and interconnect routing connections within level 104 that are not shown in the Figure. Conductive interconnects 102 and 138 may be discrete vias or continuous trenches.

In an embodiment, via structure 144, metal structures 140 and 142, include a same or substantially the same material. In the illustrative embodiment, via structure 144, metal structures 140 and 142 include liner layer 146 and fill material 148 on liner layer 146. For example, liner layer 146 may include a material, such as but not limited to, ruthenium, cobalt, tantalum, or nitrides of tantalum and titanium, and the fill material 148 may include copper, molybdenum, or tungsten. In some embodiments, via structure 144 and metal structures 140 and 142, include a same or substantially the same material as the material of conductive interconnect 102.

The substrate 150 may include a suitable substrate such as is utilized in semiconductor device fabrication and may comprise a material such as silicon, germanium, silicon germanium, group III-V materials, group III-N materials, or quartz.

Figure 2A:
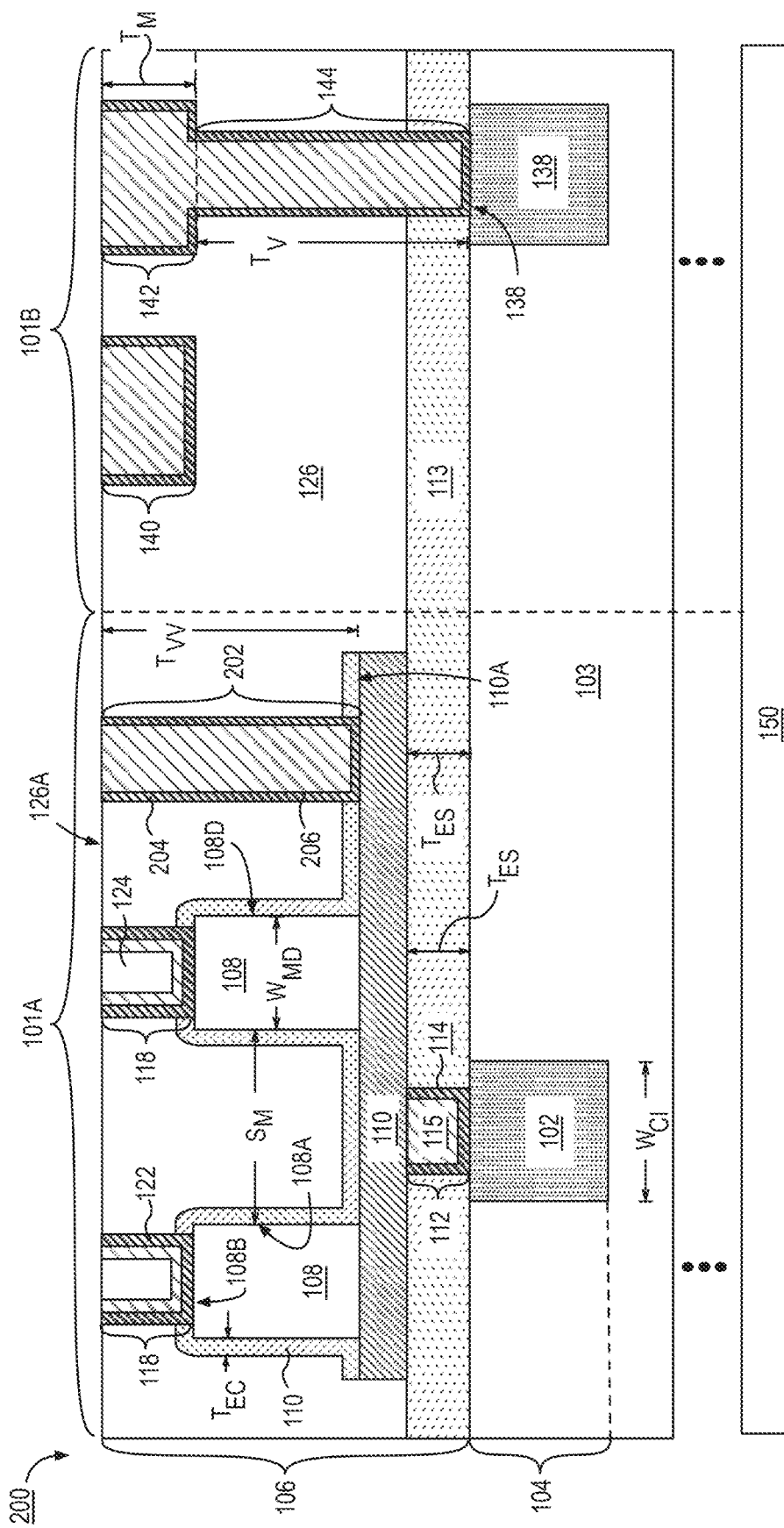
FIG. 2A is a cross-sectional illustration of a device structure including a plurality of memory devices coupled by a shared plate electrode and a via electrode coupled with the plate electrode in a memory region adjacent to interconnect structures in a logic region, in accordance with an embodiment of the present disclosure

FIG. 2A is a cross-sectional illustration of a device structure 200 that includes one or more features of the device structure 100 (FIG. 1A). In the illustrative embodiment, signal electrode 202 (herein via electrode 202) is coupled with plate electrode 110. Via electrode is utilized to route a signal from plate electrode 110 to an upper metal layer. As shown, via electrode 202 spans a height, $T_{VV}$, that extends from uppermost surface 110A to an uppermost surface 126A of dielectric 126. Via electrode may be coupled to different locations on the plate electrode 110. In an embodiment, via electrode 202 is coupled to an end of the plate electrode 110. As shown, via electrode 202 is coupled to a portion of plate electrode 110 laterally distant from sidewall 108A of memory device 108. In the illustrative embodiment, plate electrode 110 extends asymmetrically beyond sidewall 108A of memory devices 108.

In some embodiments, via electrode 202 includes liner layer 204 and conductive fill material 206. In some embodiments, liner layer 204 may include a material that is the same or substantially the same as the material of the liner layer 122. In some embodiments, conductive fill material 206 includes a material that is the same or substantially the same as the material of conductive fill material 124. In the illustrative embodiment, encapsulation layer 116 is also adjacent to a lowermost portion of via electrode 202.

Figure 2B:
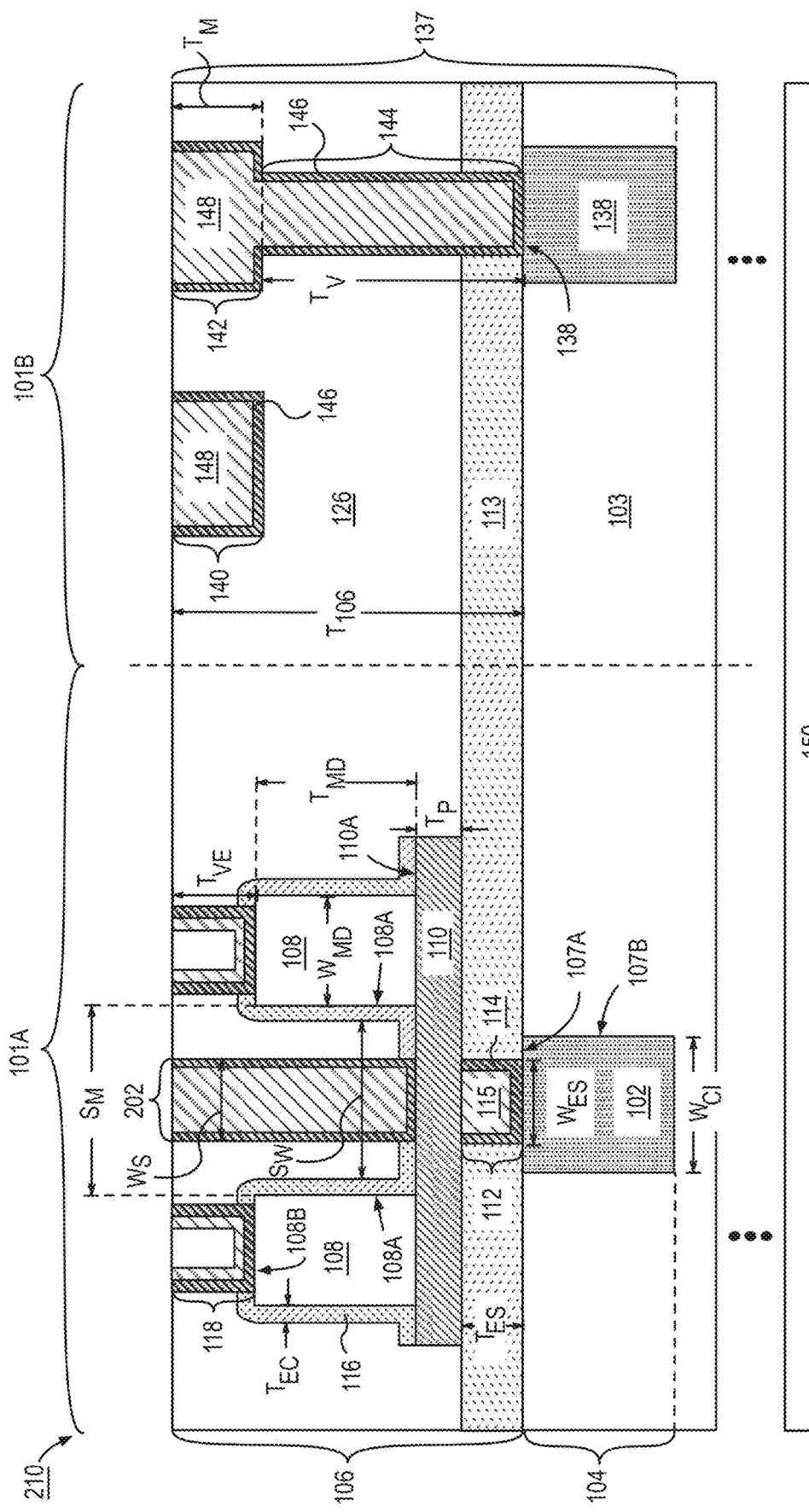
FIG. 2B is a cross-sectional illustration of a device structure including a plurality of memory devices coupled by a shared plate electrode and a via electrode coupled with the plate electrode in a memory region adjacent to interconnect structures in a logic region, in accordance with an embodiment of the present disclosure.

In another embodiment, via electrode 202 is between a pair of memory devices 108 as shown in the cross-sectional illustration of device structure 210 in FIG. 2B. In the illustrative embodiment, device structure 210 includes one or more features of device structure 100 (FIG. 1A). As shown, via electrode 202 is on uppermost surface 110A and laterally surrounded by dielectric 126 and encapsulation layer 116. As shown, spacing $S_M$ between adjacent memory devices 108 is sufficiently large for positioning via electrode 202. In the illustrative embodiment, $S_M$ is sufficiently large and $T_{EC}$ sufficiently thin that the region between memory devices 108 includes dielectric 126. In the illustrative embodiment, spacing $S_W$ Between Encapsulation Layer 116 on nearest sidewalls 108A of respective memory devices 108 includes dielectric 126.

In some embodiments, $S_M$ is greater than 4 times $T_{EC}$, but via electrode 202 has a lateral thickness $W_S$, such that a lower portion of via electrode 202 is between and in contact with portions of encapsulation layer 116 on sidewalls of two adjacent memory devices 108.

FIG. 3 is an isometric illustration of device structure 300 that includes one or more features of plate electrode 110 in FIG. 1D, in accordance with an embodiments of the present disclosure. In the illustrative embodiment, a plurality of layers such as etch stop layer, encapsulation layer, and dielectrics are removed for clarity.

As shown, device structure 300 includes three plate electrodes, 302A, 302B, 302C on level 303 above a conductive interconnect 304 that extends longitudinally along the x-direction. Conductive interconnect 304 is on level 305 below level 303. Plate electrodes 302A, 302B, and 302C have one or more features of plate electrode 110, such as material composition and thickness, $T_P$, and other features described in association with FIGS. 1G-1J. Plate electrodes 302A and 302C extend along a direction orthogonal (along y-direction) to the longitudinal direction of conductive interconnect 102. Plate electrode 302B has a shorter length (along y-direction) than plate electrodes 302A, or 302B.

As shown, a plurality of electrode structures couple individual ones of plate electrodes 302A, 302B, and 302C with the conductive interconnect 304. As shown, electrode structures 306A, 306B, and 306C are coupled between the conductive interconnect 304 and respective plate electrodes 302A, 302B, and 302C. The plurality of electrode structures 306A, 306B, and 306C are on level 307 between level 303 and level 305.

In the illustrative embodiment, device structure 300 further includes memory devices 308A, 308B, 308C, 308D, and 308E on level 309 above level 303. In the illustrative embodiment, memory devices 308A and 308B are on and electrically coupled with plate electrode 302A; memory device 308C is coupled with plate electrode 302B; and memory devices 308D and 308E are on and electrically coupled with plate electrode 302C. In some embodiments, memory devices 308A, 308B, 308C, 308D, and 308E are substantially identical, for example, they include same number of layers where the layers have same thicknesses. In exemplary embodiments, memory devices 308A, 308B, 308C, 308D and 308E have a structural composition that is the same as the structural composition of memory device 108 (FIG. 1E), such as a bottom electrode, a ferroelectric dielectric layer or a paraelectric dielectric layer, and a top electrode. In other embodiments, memory devices 308A, 308B, 308C, 308D, and 308E are trench capacitors (to be described below in FIGS. 20A-E).

In the illustrative embodiment, memory devices 308A, 308B, 308C, 308D, and 308E have a circular or elliptical plan view shape. In other embodiments, memory devices 308A, 308B, 308C, 308D, and 308E can have a rectangular or a square plan view shape. It some embodiments, memory devices 308A, 308B, 308C, 308D, and 308E can have a same diameter (for cylindrical shaped devices), or a same length and width (for rectangular shaped devices). In other embodiments, memory devices 308A, 308B, 308D, and 308E can be larger than or smaller than memory device 308C.

In an embodiment, plate electrode 302A extends beyond a perimeter of memory devices 308A and 308B, and plate electrode 302C extends beyond a perimeter of memory devices 308D and 308E. In an embodiment, plate electrode 302B extends beyond a perimeter of memory device 308C.

In an embodiment, plate electrode 302A extends beyond a perimeter of electrode structure 306A. In an embodiment, plate electrode 302B extends beyond a perimeter of electrode structure 306B. In an embodiment, plate electrode 302C extends beyond a perimeter of electrode structure 306C.

In an embodiment, electrode structure 306A is directly below memory device 308A or 308B. In some embodiments, electrode structure 306A is midway between memory device 308A or 308B. In an embodiment, electrode structure 306C is directly below memory device 308D or 308E. In some embodiments, electrode structure 306C is midway between memory device 308D or 308E. In an embodiment, electrode structure 306B is directly below memory device 308C.

It is to be appreciated that a respective via electrode may couple plate electrode 302A and plate electrode 302C, while a via electrode can couple the memory device 308C.

In some embodiments, memory devices 308A and 308B are spaced apart by a distance of at least 10 nm. In some embodiments, memory devices 308D and 308E are spaced apart by a distance of at least 10 nm.

In the illustrative embodiment, conductive interconnect 304 may be coupled to a transistor below the plane of conductive interconnect 102 through via electrode 310. Via electrode 310 includes material that is the same or substantially the same as the material of via structure 144. In an embodiment, conductive interconnect 304 includes material that is the same or substantially the same as the material of conductive interconnect 102.

Figures 4A, 4B:
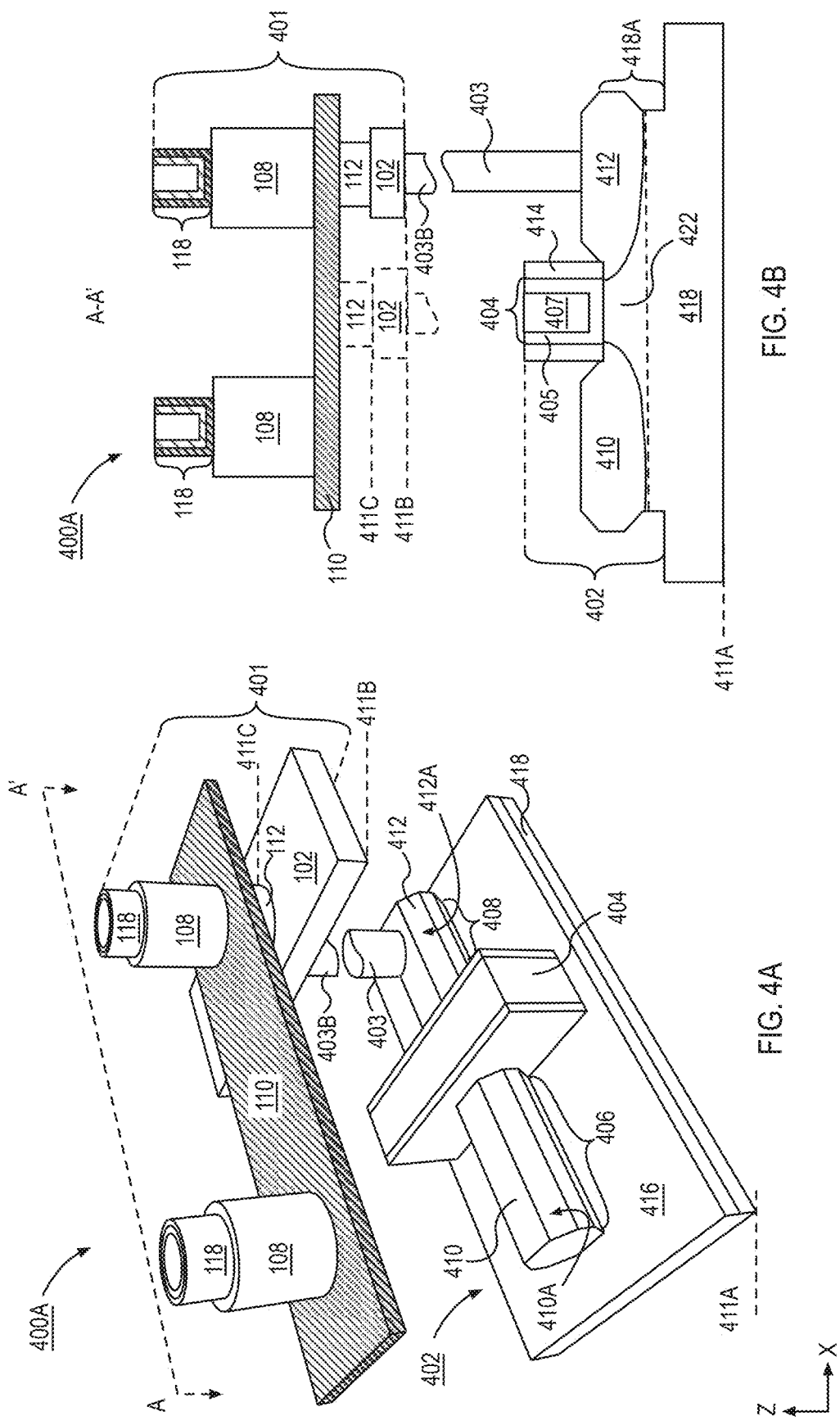
FIG. 4A is an isometric illustration of system that includes device structure including a pair of memory devices on a plate electrode that is coupled with a drain contact of a transistor, in accordance with an embodiment of the present disclosure.
FIG. 4B is a cross-sectional illustration of the system in FIG. 4A through a midplane.

FIG. 4A is an isometric illustration of system 400A that includes device structure 401 coupled with transistor 402. Transistor 402 is on first level 411A. Device structure 401 is coupled to transistor 402 through drain contact 403. Device structure 401 includes one or more features of device structure 100 (FIG. 1A), in accordance with an embodiment of the present disclosure. For example, device structure 401 includes conductive interconnect 102, electrode structure 112, plate electrode 110, memory devices 108, and via electrodes 118. Conductive interconnect is on level 411B above level 411A. Plate electrode 110, memory devices 108, and via electrodes 118 are within level 411C above level 411B.

Dielectrics 103 and 126 and encapsulation layer 116 are not illustrated for clarity.

In the illustrative embodiment, transistor 402 is an example of a transistor that is non-planar. The transistor 402 may be, for example, an NMOS or a PMOS transistor. In an embodiment, transistor 402 includes gate structure 404, between source region 406 and drain region 408. In the illustrative embodiment, source region 406 includes epitaxial source structure 410 (herein source structure 410) and drain region 408 includes epitaxial drain structure 412 (herein drain structure 412). Source structure 410 and drain structure 412 are separated from gate structure 404 by spacer 414 and have faceted sidewall surfaces 410A and 412A. Not all faceted surfaces of source structure 410 and drain structure 412 are shown. In the illustrative embodiment, a portion of gate structure 404 is on dielectric 416 that separates gate structure 404 from substrate 418. In the illustrative embodiment, drain contact 403 is coupled to drain structure 412.

Figure 20B:
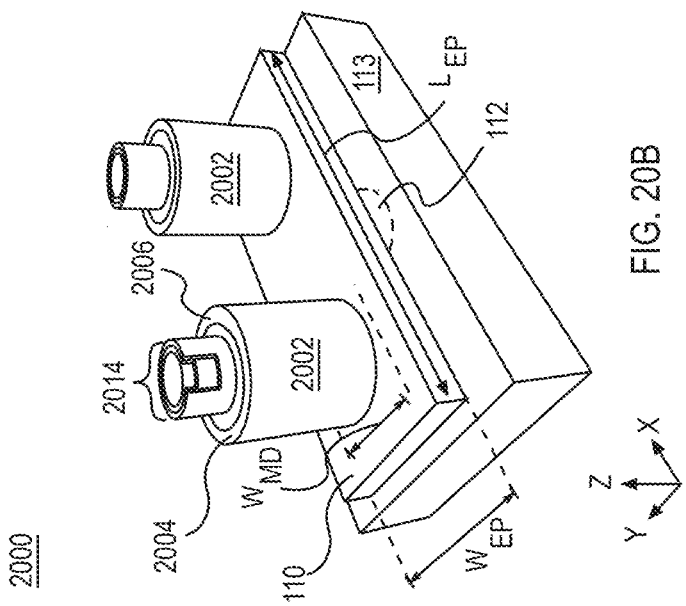
FIG. 20B is an isometric illustration of the device structure illustrated in FIG. 20A.
Figure 20A:
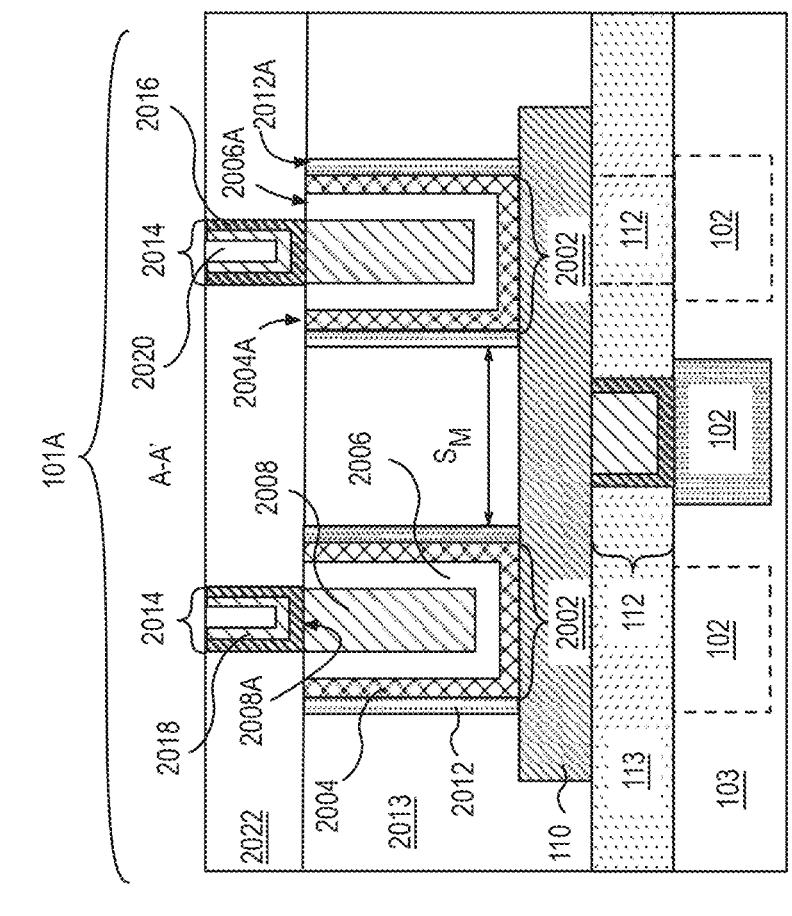
FIG. 20A is a cross-sectional illustration of a device structure including a plurality of trench capacitors above a shared plate electrode in a memory region, in accordance with an embodiment of the present disclosure.

Depending on embodiments, memory devices 108 can be a planar capacitor (FIG. 1A) or a trench capacitor (FIG. 20A). In the illustrative embodiment, memory devices 108 have a cylindrical profile. In other embodiments, memory devices 108 can have a rectangular profile. While device structure 401 is electrically coupled with drain contact 403, there may be intervening layers of via electrodes between drain contact 403 and conductive interconnect 102. In some embodiments, conductive interconnect 102 is directly on drain contact portion 403B. There may be intervening layers between portion 403B and drain contact 403. Conductive interconnects may be isolated structures.

FIG. 4B is a cross-sectional illustration through the line A-A' of system 400A in FIG. 4A. The line A-A' may be through a midplane of system 400A. In the illustrative embodiment, fin 418A is a portion of the substrate 418. The source structure 410 and drain structure 412 are epitaxial to the fin 418A and channel 422 is below gate structure 404.

As shown, gate structure 404 further includes gate dielectric layer 405 and gate electrode 407. Gate dielectric layer 405 has a base portion on channel 422 and sidewall portions that are adjacent to spacer 414. Gate electrode 407 is confined within gate dielectric layer 405.

In an embodiment, gate dielectric layer 405 includes a suitable gate dielectric material such as but not limited to an oxide of one or more of Si, Hf, Zr, La, Ti, Ta, Ga; or Al, such as $SiO_2$, $HfO_2$, $ZrO_2$, HfSiOX, $HfZrO_2$, $Ta_2O_5$, $Al_2O_3$, La2O3, TaSiOX; or $Ga_2O_5$. Gate electrode 407 may include one or more of Ti, Al, W, Pt, Co, Ni, or Pd; nitrogen; one or more of Ti, Ta, Al, Hf, or Zr; or carbon and one or more of Ti, Al, Ta, Hf, or Zr. Source structure 410 and drain structure 412 may include amorphous Si, SiC, SiGe, or Ge and may be doped with As, P, or B, depending on the mobile charge carrier required. In some embodiments, spacer 414 includes silicon nitride or silicon nitride doped with carbon. In some embodiments, drain contact 403 includes a conductive material such as Ru, Ti, Co, Mo, Co, Ni, W, or Ta; or nitrides of Ti, W, or Ta. In other embodiments, drain contact 403 includes a liner layer including TiN, TaN, WN; and a fill metal including one or more of Ru, Ti, Co, Mo, Co, Ni, W, or Ta.

In an embodiment, electrode structure 112 is below one of memory devices 108 as shown. In other embodiments, electrode structure 112 is midway between memory devices 108 as indicated by dashed outline of electrode structure 112 and conductive interconnect 102. In some such embodiments, plate electrode 110 may not be substantially symmetric about gate structure 404.

In other examples, device structure 401 can be coupled with a gate terminal of a transistor. FIG. 4C is an isometric illustration of system 400B where device structure 401 is coupled with gate structure 404. In the illustrative embodiment, device structure 401 is coupled to the transistor through gate contact 440. As shown, gate contact 440 is coupled with a portion of the gate above fin, covered by source structure 410 and drain structure 412.

In some embodiments, gate contact 440 includes a material that is the same or substantially the same as the material of drain contact 403 (FIG. 4A). While device structure 401 is electrically coupled with gate contact 440, there may be intervening layers of via electrodes between gate contact 440 and conductive interconnect 102. In some embodiments, conductive interconnect 102 is directly on gate contact 440. In some embodiments, conductive interconnect 102 is directly on gate contact portion 440A. There may be intervening layers between gate contact portion 440A and gate contact 440.

Transistor 402 is on a first level 411A. Conductive interconnect is on a level 411B above level 411A. Plate electrode 110, memory devices 108, and via electrodes 118 are within a level 411C above level 411B.

FIG. 4D is a cross-sectional illustration through the line A-A' of the structure in FIG. 4C. In the illustrative embodiment, electrode structure 112 is midway between memory devices 108.

In an embodiment, electrode structure 112 is below one of memory devices 108 as indicated by dashed outline of electrode structure 112 and conductive interconnect 102. In some such embodiments, plate electrode 110 may not be substantially symmetric about gate structure 404.

In embodiments where device structure is coupled with gate structure 404, memory device 108 includes a dielectric layer that further includes a paraelectric material. Paraelectric materials may include: $SrTiO_3$, $Ba_{(x)}Sr_{(y)}TiO3$ (where x is −0.05, and y is 0.95), $HfZrO_2$, Hf—Si—O, La-substituted $PbTiO_3$, or a PMN-PT based relaxor ferroelectrics. In some embodiments, dielectric layer includes paraelectric materials that can range between 1 nm to 30 nm in total thickness.

Figure 4E:
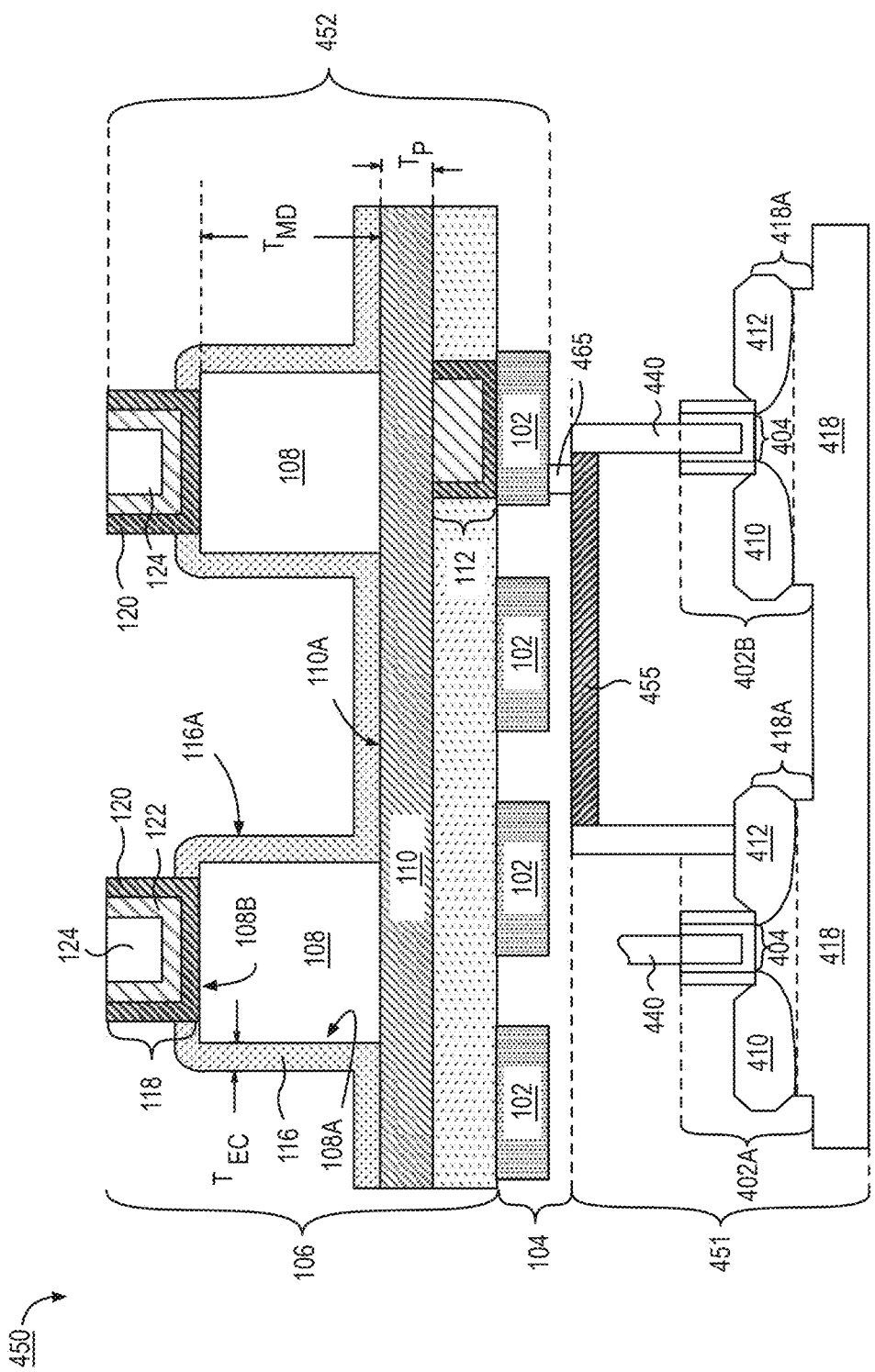
FIG. 4E is a cross-sectional illustration of a device structure that includes two transistors that are coupled with a memory structure including a single plate electrode.

FIG. 4E is a cross-sectional illustration of a system 450 that includes two transistors that are coupled with a memory structure including a single plate electrode. In the illustrative embodiment, transistors 402A and 402B are identical or substantially identical and include one or more features such as gate structure 404, source structure 410, drain structure 412, fin 418A, gate contact 440, and drain contact 403. Transistors 402A and 402B share a same substrate 418 and are on first level 451. Transistors 402A and 402B may be arranged side by side in the X direction, as shown, or in the Y direction.

As shown, memory structure 452, including memory devices 108, plate electrode 110, electrode structure 112 and conductive interconnect 102, is coupled with transistor 402A and 402B. In the illustrative embodiment, memory structure 452 is above transistors 402A and 402B. In an embodiment, memory structure 452 includes one or more features of device structure 100 within memory region 101A, described in association with FIG. 1A. Referring again to FIG. 4E, two memory devices 108 are shown. In some embodiments, memory structure 452 can include up to 1024 memory devices 108. In other embodiments, the number can be greater than 1024. An arrangement where two transistors are coupled with two or more memory devices 108 can be herein referred to as a 2T-nC device, where "n" refers to the number of capacitors that are coupled together by a single plate electrode 110. Memory devices 108 may be arranged in the plane of the figure, as well as on a plane behind the plane of the figure. In some embodiments, memory devices 108 may be arranged on a plane behind the plane illustrated and can be staggered in both X and Y directions. Memory devices 108 can include planar capacitors described in FIGS. 1E-1F or include trench capacitors to be described further below.

Referring again to FIG. 4E, system 450, further includes bridge structure 455 connecting gate contact 440 of transistor 402A to drain contact 403 of transistor 402B. Bridge structure 455 is further coupled to conductive interconnect 102. In the illustrative embodiment, conductive interconnect 102 is coupled to gate contact 440 through interconnect via 465. Conductive interconnect 102 and interconnect via 465 are within level 104. In an embodiment, interconnect via 465 includes a material that is the same or substantially the same as the material of via structure 144 (FIG. 1A).

In an embodiment, conductive interconnect 102 extends along a direction into the page of the Figure (Y-direction). In the illustrative embodiment, plate electrode 110 extends laterally along a direction that is orthogonal to conductive interconnect 102. As shown plate electrode 110 extends beyond a perimeter of the individual ones of the plurality of transistors 402A and 402B. Plate electrode 110 can include structural embodiments that are described in association with FIGS. 1E-1H.

Referring again to FIG. 4E, system 450 can further include a plurality of conductive interconnects 102 that are spaced apart along the X direction, as shown. However, plate electrode 110 is coupled with a single conductive interconnect 102 through electrode structure 112. In the illustrative embodiment, transistors 402A and 402B are spaced apart laterally along the X-direction. In other embodiments, transistors 402A and 402B can be spaced apart laterally along the Y-direction, parallel to conductive interconnects 102.

Electrode structure 112 can also include one or more embodiments, described further below.

Figure 5:
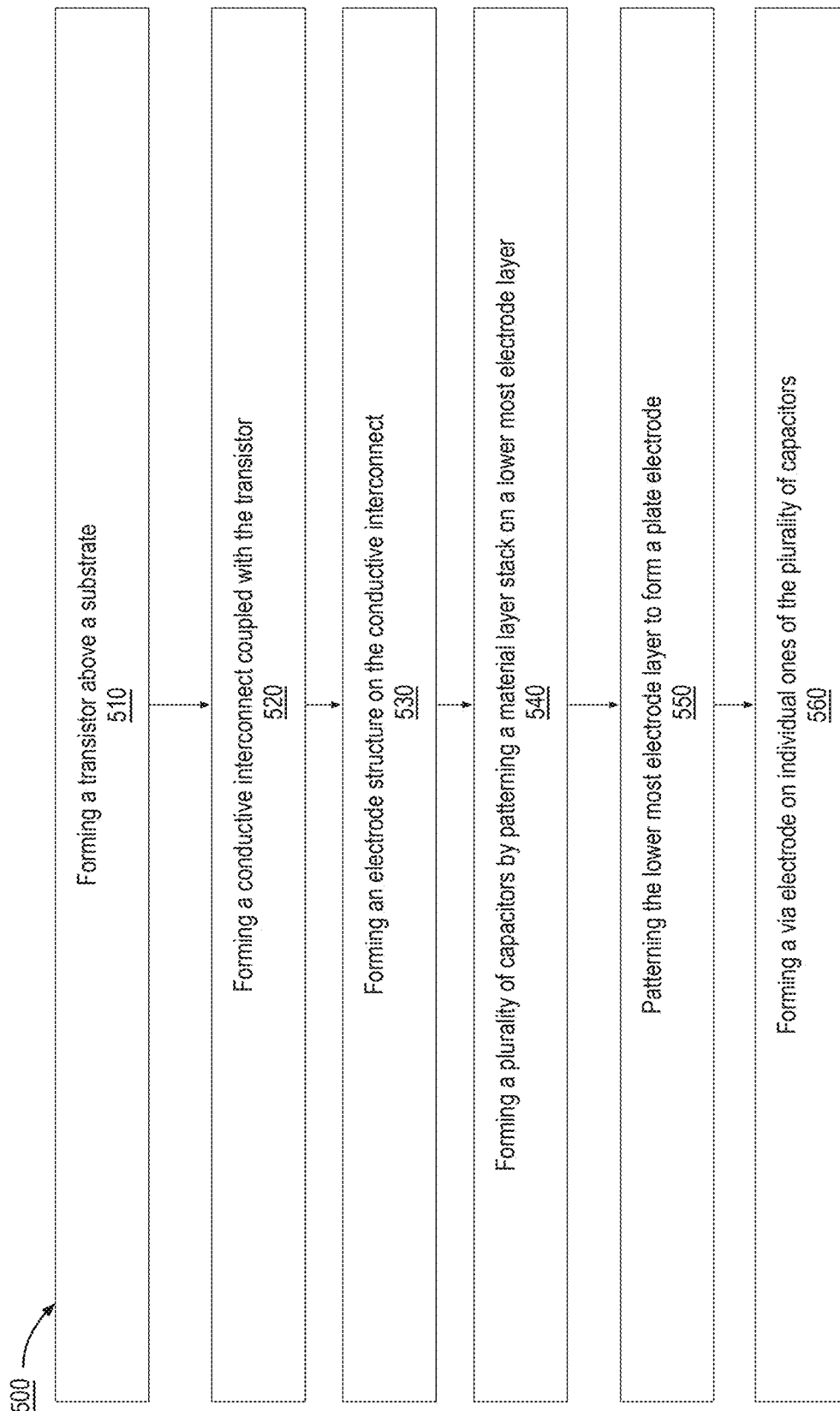
FIG. 5 is a flow diagram for method to fabricate a device structure including a plurality of memory devices above a shared plate electrode that is coupled with a transistor, in accordance with some embodiments of the present disclosure.

FIG. 5 is a flow diagram for method 500 to fabricate a device structure including a plurality of memory devices above a shared plate electrode that is coupled with a transistor. Method 500 begins at operation 510 with the forming of a transistor above a substrate. Method 500 continues at operation 520 with the formation of a conductive interconnect that is coupled with the transistor. The method continues at operation 530 with the formation of an electrode structure including a conductive hydrogen barrier on the conductive interconnect. Method 500 continues at operation 540 with the formation of a plurality of capacitors coupled with the electrode structure by depositing a material layer stack on a lowermost electrode layer. Method 500 continues at operation 550 by patterning the lowermost electrode layer to form a plate electrode that couples at least some of the plurality of capacitors. The method concludes at operation 560 with the forming of a via electrode on individual ones of the plurality of capacitors.

Method 500 outlines a method to fabricate both planar and non-planar capacitors. Examples of planar capacitors include devices where individual layers within the capacitor extends on a single plane. Examples of non-planar capacitors include trench capacitors.

FIG. 6A is a cross-sectional illustration of fin 600, formed on substrate 601. In an embodiment, mask 602 is formed on substrate 601. An etch process may be utilized to etch the material of substrate 601 to form fin 600. In some embodiments, fin 600 may be substantially vertical as is shown. In an embodiment, mask 602 includes a dielectric material. Mask 602 may be patterned into plan view shape and size of fin 600 by forming a lithographic pattern on the dielectric material. In an embodiment, substrate 601 includes silicon, silicon germanium, germanium, or a suitable material that can be utilized to pattern and dope to form source and drain structures applicable for a transistor.

FIG. 6B is an isometric illustration of the structure in FIG. 6A following the process to form dielectric 416 adjacent to a portion of fin 600. In an embodiment, dielectric 416 is blanket deposited on mask 602 (not shown), on sidewalls of fin 600, and on substrate 601. Dielectric 416 is planarized post deposition. In some embodiments, the planarization process includes a chemical mechanical planarization process (CMP). The CMP process removes mask 602 from above fin 600. Dielectric 416 is then recessed to obtain a desired height of fin 600. Dielectric 416 provides electrical isolation for portions of a gate electrode to be formed.

FIG. 6C is an isometric illustration of the structure in FIG. 6B following the formation of dummy gate 604 on fin 600. In an embodiment, dummy gate dielectric layer 606 is deposited on the fin 600 and on dielectric 416. In an embodiment, dummy gate dielectric layer 606 is grown by a plasma enhanced chemical vapor deposition (PECVD) process. In some embodiments, dummy gate dielectric layer 606 includes a layer of silicon dioxide adjacent to the fin 600.

A dummy gate material is blanket deposited on the dummy gate dielectric layer 606. In an embodiment, the dummy gate material includes a chemical vapor deposition process to deposit a material such as polysilicon, amorphous silicon, or silicon germanium. The deposition process may take place at temperatures of approximately 600° C. or less. In some embodiments, such as is shown, a planarization process may be performed to planarize the dummy gate material after deposition.

A mask material is deposited on the dummy gate material. In an embodiment, the mask material includes a silicon nitride or a silicon oxynitride. The mask material is patterned by a lithographic process and etched by a plasma etch process to form hardmask 608. The hardmask 608 is subsequently utilized to etch the dummy gate material to form the dummy gate 604. The process to form the dummy gate 604 includes removing the dummy gate material from sidewalls of the fin 600. The dummy gate dielectric layer 606 protects the fin 600 during the etch process. The dummy gate dielectric layer 606 is removed from surfaces the fin 600 after formation of the dummy gate 604.

After formation of the dummy gate 604 a spacer 414 is formed on sidewalls of the dummy gate 604. In an embodiment, an encapsulation layer is blanket deposited on the fin 600, and on dummy gate 604. The encapsulation layer is then etched to form spacer 414 on sidewalls of dummy gate 604. The encapsulation layer maybe removed from sidewalls of fin 600 by a masking and etching process so that spacer 414 is substantially formed on sidewalls of dummy gate 604. It is to be appreciated that the encapsulation layer is removed from sidewalls 600A of fin 600.

Figure 6E:
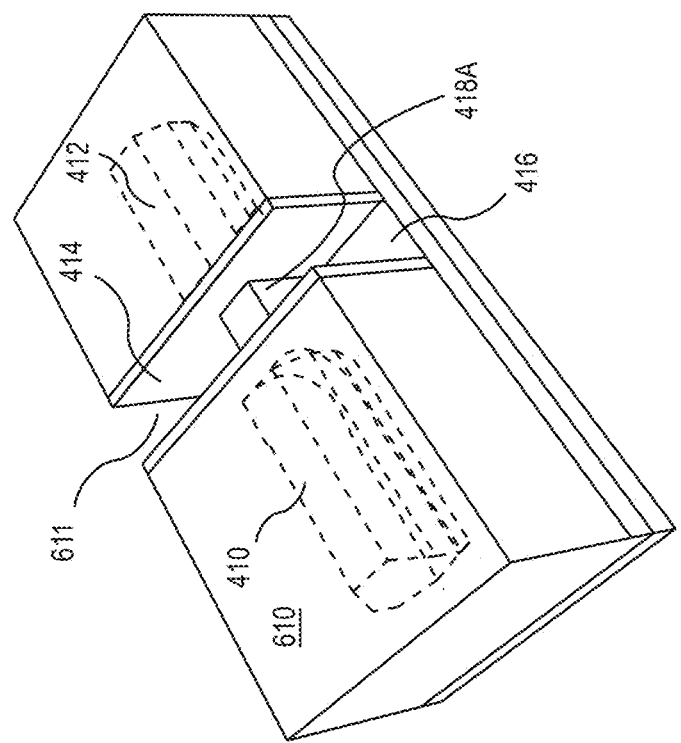
FIG. 6E is an isometric illustration of the structure in FIG. 6D following the process to remove the mask, dummy gate, and dummy gate dielectric to form a gate opening.
Figure 6D:
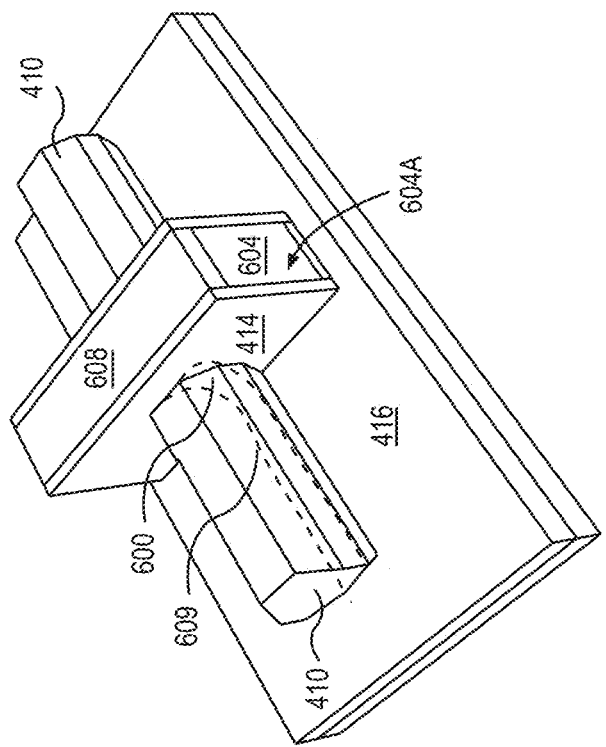
FIG. 6D is an isometric illustration of the structure in FIG. 6C following the process to form an epitaxial source structure and an epitaxial drain structure, in accordance with an embodiment of the present disclosure.

FIG. 6D is an isometric illustration of the structure in FIG. 6C following the process to form source structure 410 and drain structure 412. In an embodiment, portions of fin 600 are etched and removed. In an embodiment, the shape of fin 600 is indicated by dashed lines 609.

An epitaxial growth process is utilized to selectively grow source structure 410 and drain structure 412 on fin 600 as shown. In various embodiments, source structure 410 and drain structure 412 are grown to have faceted sidewalls. Dopants may be inserted during the growth process or implanted at a later operation. Spacer 414 and hardmask 608 prevent any epitaxial growth from taking place on dummy gate 604. It is to be appreciated that while sidewall 604A of dummy gate 604 is exposed for illustrative purposes, spacer 414 encapsulates all vertical sidewalls of dummy gate 604. The epitaxial growth process may be carried out at temperatures between 400° C. and 700° C. to grow source structure 410 and drain structure 412 doped with Si, amorphous silicon, or SiGe.

FIG. 6E is an isometric illustration of the structure in FIG. 6D following the process to remove mask 602, dummy gate 604, and dummy gate dielectric layer 606. In an embodiment, dielectric 610 is blanket deposited on source structure 410 and drain structure 412 (not visible), on dielectric 416, spacer 414 and mask 602. Dielectric 610 may include a material such as silicon oxide and may be deposited by a chemical vapor deposition (CVD), or a plasma enhanced chemical vapor deposition (PECVD) process. In an embodiment, dielectric 610 is planarized by a CMP process. In some embodiments, the CMP process may remove the mask. In other process an etch process may be utilized to remove mask 602, and portions of dummy gate 604. In other embodiments, a wet chemical process is utilized to selectively remove dummy gate 604, as well as dummy gate dielectric layer 606 selective to dielectric 416, spacer 414, and fin 600. The process of removing dummy gate 604 forms an opening 611.

Figure 6F:
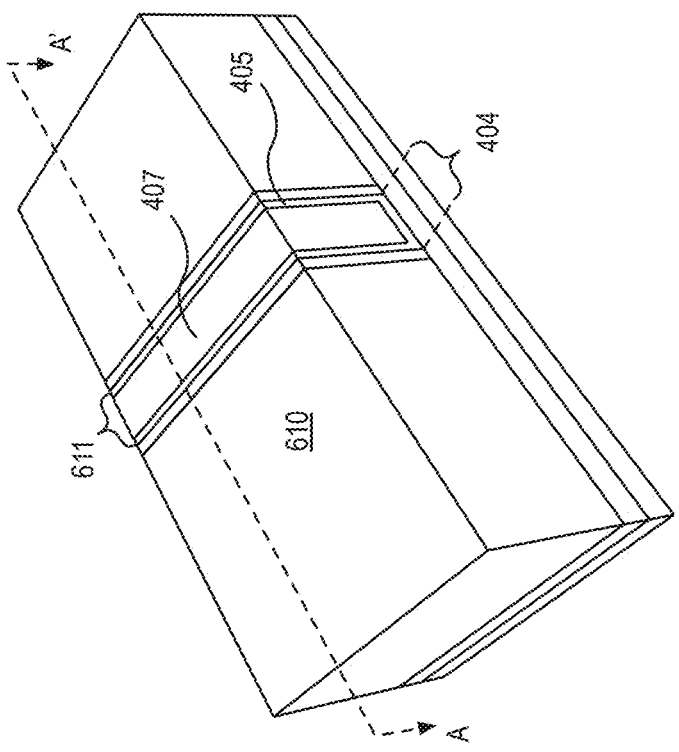
FIG. 6F is a cross-sectional illustration of the structure in FIG. 6E following the process to form a gate structure in the gate opening.

FIG. 6F is a cross-sectional illustration of the structure in FIG. 6E following the process to form gate structure 404 in opening 611. In an embodiment, a gate dielectric layer 405 is blanket deposited after a high temperature process to grow source structure 410 and drain structure 412. In an embodiment, an atomic deposition process is utilized to deposit a gate dielectric layer 405 on the fin (not shown), on sidewalls of the spacer and on dielectric 416 in the opening 611. Depending on a MOS characteristic, a PMOS or an NMOS material to form gate electrode 407 is deposited on gate dielectric layer 405. Depending on material, and the desired size of transistor gates, a range of deposition processes can be utilized. For example, processes may include CVD, physical vapor deposition (PVD), or atomic layer deposition (ALD). After deposition, a planarization process is performed to remove the excess material of gate electrode 407 and gate dielectric layer 405 from above spacer 414, and dielectric 610.

Figure 7:
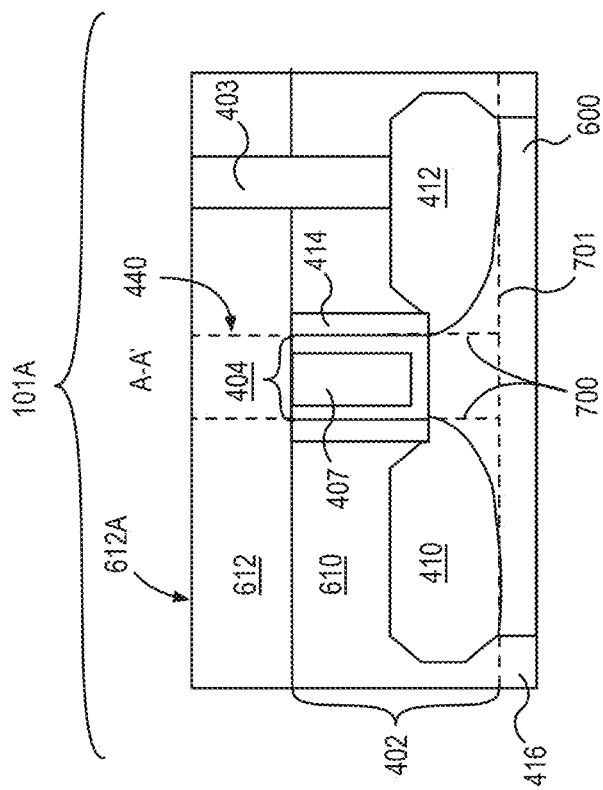
FIG. 7 is a cross-sectional illustration of the structure in FIG. 6F through a line A-A' following the process to form a via electrode on a drain structure.

FIG. 7 is a cross-sectional illustration of the structure in FIG. 6F through a line A-A' following the process to form drain contact 403 on drain structure 412. The line A-A' corresponds to a line through fin 600 and the illustration depicts a portion of gate electrode 407 on the fin 600. Dashed lines 700 denote extensions of gate electrode 407 on dielectric 416 (below dashed line 701). In the illustrative embodiment, a dielectric 612 is blanket deposited on dielectric 610, on spacer 414 and on gate structure 404. In an embodiment, dielectric 612 includes a material that is the same or substantially the same as the material of dielectric 610. Dielectric 612 may be deposited by a PECVD or a CVD process.

A mask is formed on dielectric 612, and an opening is formed in dielectric 612 and in dielectric 610 to expose drain structure 412. A conductive fill material is deposited into the opening and removed via planarization from uppermost surface 612A to fabricate drain contact 403.

In an embodiment, gate contact 440 is formed on the gate as indicated by dashed lines. In some embodiments, gate contact 440 can be formed by etching dielectric 612 and depositing materials that are the same or substantially the same as the material of drain contact 403. Transistor 402 is formed in memory region 101A. While a single transistor is shown, memory region 101A may include a plurality of transistors that are identical or substantially identical to transistor 402.

FIG. 8A is a cross-sectional illustration of the structure in FIG. 7 following the process to form an opening in dielectric 103. In the illustrative embodiment, dielectric 103 is blanket deposited on dielectric 612. In an embodiment, dielectric 103 is deposited on dielectric 612 by a PECVD, PVD, or a CVD process. Dielectric 103 may be etched by a plasma etch process to form opening 800 above drain contact 403. In some embodiments, opening 802 may be formed above gate contact 440 by forming an opening above gate contact 440 in the prior operation.

FIG. 8B is a cross-sectional illustration of the structure in FIG. 8A following the process to form a conductive interconnect 102 on drain contact 403 followed by the process to deposit an etch stop layer 113. Material of conductive interconnect 102 may be deposited into dielectric 103 and on uppermost surface 103A of dielectric 103. The material of conductive interconnect 102 is removed from uppermost surface 103A by a planarization process. The process is further continued with deposition of etch stop layer 113 on dielectric 103 and on conductive interconnect 102. Etch stop layer 113 may be deposited by a CVD, PVD, or a PECVD process. Etch stop layer 113 may be targeted to a thickness to provide capacitance shielding between a plate electrode to be formed above and conductive interconnect 102. Etch stop layer 113 may be targeted to a thickness to provide adequate etch margin while patterning to form an electrode structure.

In some embodiments, conductive interconnect 102 is formed on gate contact 440 by forming an opening above the gate contact in the prior operation.

An electrode structure is then formed above conductive interconnect 102. The process of forming an electrode structure within portion 801 is described below.

FIG. 9A is a cross-sectional illustration of portion 801 of the structure in FIG. 8 following the process to etch opening 902 in etch stop layer 113 to form an electrode structure. In an embodiment, photoresist mask 903 is formed by a lithographic process on etch stop layer 113. Exposed portions of etch stop layer 113 may be etched by a plasma etch process through an opening in photoresist mask 903. In the illustrative embodiment, opening 902 has a lateral thickness, $W_O$. $W_O$ may be narrower, equal to or wider than $W_{CI}$. In the illustrative embodiment, $W_O$ is greater than $W_{CI}$.

The shape of openings 902 may be circular or rectangular and the conductive interconnects may be discrete islands or a line straddling the drain structure, depending on embodiments. FIGS. 9B-9C illustrate embodiments of structures 910 and 920 of conductive interconnect 102 and opening 902 within portion 801 in FIG. 9A. Photoresist mask 903 is removed for clarity.

FIG. 9B is an isometric illustration of structure 910, in accordance with an embodiment of the present disclosure. A cross section through opening 902 is illustrated. In the illustrative embodiment, conductive interconnect 102 is cylindrical, where $W_{CI}$ is less than $W_O$, (for example diameter) of opening 902. As shown, opening 902 is circular and $W_O$ may be, for example, a diameter of opening 902. In other embodiments, opening 902 can be rectangular. Dielectric 103 is exposed during formation of opening 902 when $W_{CI}$ is less than $W_O$, as shown. In the illustrative embodiment, uppermost surface 102C of conductive interconnect 102 is co-planar or substantially co-planar with uppermost surface 103A of dielectric 103.

In some embodiments, opening 902 may be offset relative to interconnect 102, as is illustrated in structure 920 of FIG. 9B. Such an offset may be a result of misalignment between photoresist mask 903 and interconnect 102. The method adopted to fabricate an electrode structure within opening 902 is not impacted by misalignment as long as at least 50% of opening 902 exposes uppermost surface 102C of interconnect 102. Misalignment does not enable hydrogen to diffuse through to a memory device (to be fabricated in a downstream operation). While a single conductive interconnect 102 is shown, other conductive interconnects may be fabricated at the same time in memory region 101A.

In some embodiments, opening 902 may be offset relative to interconnect 102, as is illustrated in structure 920 in FIG. 9C. Such an offset may be a result of misalignment between photoresist mask 903 and interconnect 102. The method adopted to fabricate an electrode structure within opening 902 is not impacted by misalignment as long as at least 50% of opening 902 exposes uppermost surface 102C of interconnect 102. Misalignment does not enable hydrogen to diffuse through to a memory device (to be fabricated in a downstream operation) provided an electrode structure to be fabricated in opening 902 includes a conductive hydrogen barrier.

FIG. 10A-10B are cross-sectional illustrations depicting a method to fabricate an electrode structure having a conductive hydrogen barrier above a fill metal.

FIG. 10A is a cross-sectional illustration of the structure in FIG. 9A following the formation of conductive fill material within opening 902, in accordance with an embodiment of the present disclosure. In an embodiment, conductive fill material 1000 is blanket deposited into opening 902, and on etch stop layer 113. In embodiments, conductive fill material 1000 includes a material that is the same or substantially the same as the material of the conductive fill material 115 (FIG. 1A).

FIG. 10B is a cross-sectional illustration of the structure in FIG. 10A following the process to form conductive fill material 1000 within a portion of opening 902 on etch stop layer 113. In an embodiment, portions of conductive fill material 1000 on uppermost surface 113A of etch stop layer 113 are removed by a planarization process leaving conductive fill material 1000 within opening 902. In an embodiment, a wet chemical process is utilized to recess conductive fill material 1000 below uppermost surface 113A. In an embodiment, level of recess of conductive fill material 1000 relative to uppermost surface 113A will depend on $T_L$ and on a desired thickness of the conductive hydrogen barrier to be formed. In some embodiments, conductive fill material 1000 is recessed relative to uppermost surface 113A by up to half of $T_L$. In some embodiments, uppermost surface 1000A of conductive fill material 1000 is concaved due to wet chemical recess as indicated by dashed lines 1001.

FIG. 10C is a cross-sectional illustration of the structure in FIG. 10B following the process to form conductive hydrogen barrier 1010 on conductive fill material 1000. In an embodiment, a conductive hydrogen barrier layer is blanket deposited on conductive fill material 1000 and on etch stop layer 113. A planarization process may be utilized to remove an excess conductive hydrogen barrier material layer from above etch stop layer 113. In an embodiment, the planarization process includes a chemical mechanical polish (CMP) process. The CMP process forms conductive hydrogen barrier 1010 within opening 902.

In the illustrative embodiment, electrode structure 112 includes conductive hydrogen barrier 1010 above conductive fill material 1000, where conductive hydrogen barrier 1010 prevents hydrogen from diffusing towards a memory device to be formed above. Depending on embodiments, electrode structure 112 has a width that can be greater than or less than a width of a memory device to be formed on electrode structure 112. In either embodiment, conductive hydrogen barrier 1010 can effectively prevent hydrogen from diffusing towards the memory device. In embodiments, conductive hydrogen barrier 1010 includes a material that is the same or substantially the same as the material of the conductive hydrogen barrier 114 (FIG. 1A).

FIG. 11A is a cross-sectional illustration of the structure in FIG. 9A following the process to deposit one or more electrode materials on conductive interconnect 102 and on etch stop layer 113. In an embodiment, a layer of conductive hydrogen barrier material 1100 is deposited in opening 902, on sidewalls of etch stop layer 113 and on conductive interconnect 102. In the illustrative embodiment, conductive hydrogen barrier material 1100 is also deposited on exposed portions of dielectric 103. In embodiments, conductive hydrogen barrier material 1100 includes a material that is the same or substantially the same as the material of the conductive hydrogen barrier 114 (FIG. 1A).

FIG. 11B is a cross-sectional illustration of the structure in FIG. 11A following the deposition of a fill material in the remaining portions of opening 902 and on conductive hydrogen barrier material 1100. Conductive fill material 1102 is deposited on conductive hydrogen barrier material 1100. In embodiments conductive fill material 1102 includes tantalum, titanium, ruthenium, or tungsten, and may be deposited by a PVD, PECVD, or an ALD process. In some embodiments, conductive fill material 1102 includes copper and may be deposited by an electroplating process.

FIG. 11C is a cross-sectional illustration of the structure in FIG. 11B following the process to planarize conductive fill material 1102 and conductive hydrogen barrier material 1100. In an embodiment, the planarization process includes a chemical mechanical planarization (CMP) process. The CMP process removes the conductive fill material 1102 and conductive hydrogen barrier material 1100 from uppermost surface 113A of etch stop layer 113. The planarization process isolates conductive hydrogen barrier material 1100 and conductive fill material 1102 to form electrode structure 1104. In an exemplary embodiment, conductive hydrogen barrier material 1100 includes a material that is the same or substantially the same as the material of conductive hydrogen barrier 1010. In an exemplary embodiment, conductive fill material 1102 includes a material that is the same or substantially the same as the material of conductive fill material 1000 (FIG. 10A).

It is to be appreciated that while the electrode structure 1104 has width $W_{ES}$ that is less than $W_{CI}$, in other embodiments, an electrode structure having $W_{ES}$ that is greater than $W_{CP}$, can be fabricated by the same methodology described above.

Figure 12A:
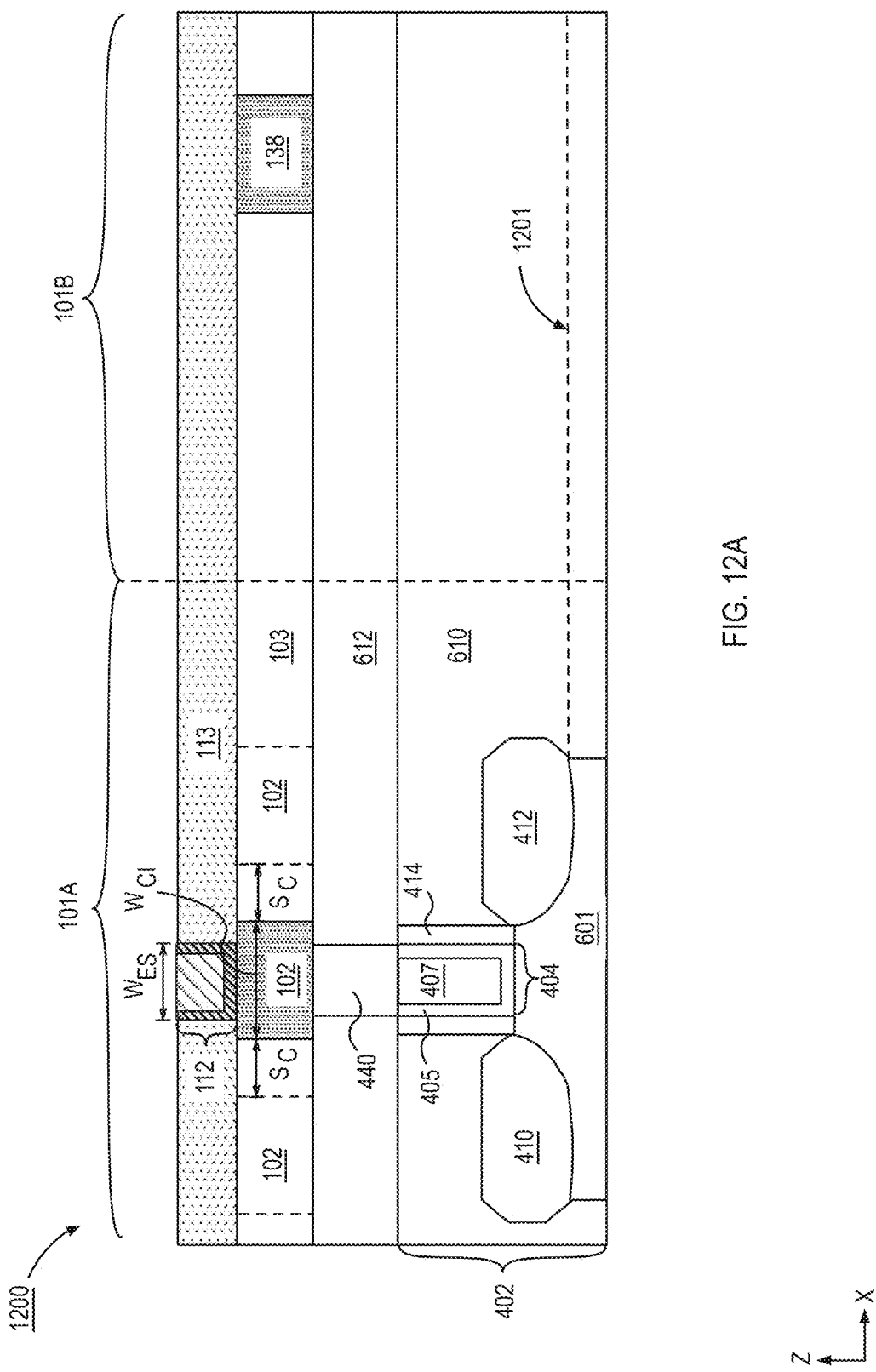
FIG. 12A is a cross-sectional illustration of a structure that includes a transistor in a memory region, a conductive interconnect coupled with a gate contact, an electrode structure fabricated on the conductive interconnect, within openings in an etch stop layer above the conductive interconnect, in accordance with an embodiment of the present disclosure.

FIG. 12A is a cross-sectional illustration of a structure 1200 that includes transistor 402 in memory region 101A, conductive interconnect 102 coupled with gate contact 440 and electrode structure 112 fabricated on conductive interconnect 102, in accordance with an embodiment of the present disclosure.

In an embodiment, the method of forming electrode structure 112 described in FIGS. 11A-11C may be utilized to fabricate electrode structure 112 on conductive interconnect 102.

Referring again to FIG. 12A, conductive interconnect 102 is formed above gate contact 440. In other embodiments, conductive interconnect 102 is formed above a drain contact 403 (as shown in FIGS. 8A-8B). Conductive interconnect 138, in logic region 101B, may be fabricated at the same time as conductive interconnect 102. In exemplary embodiments, conductive interconnect 138 is fabricated prior to fabrication of electrode structure 112 in the memory region 101A.

Substrate 601 may extend across to the logic region 101B as indicated by dashed lines 1201. There may be devices such as transistors formed on substrate 601 in logic region 101B.

Figure 12B:
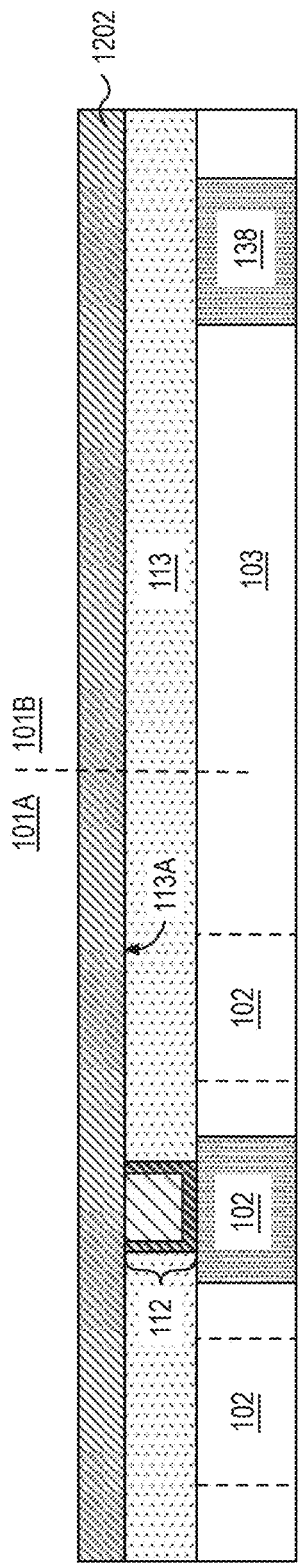
FIG. 12B is a cross-sectional illustration of the structure in FIG. 12A following the process to deposit an electrode layer on the etch stop layer and on electrode structure.

FIG. 12B is a cross-sectional illustration of the structure in FIG. 12A following the process to deposit electrode layer 1202 on etch stop layer 113 and on electrode structure 112. In an embodiment, electrode layer 1202 is blanket deposited in memory region 101A and in logic region 101B. In an embodiment, electrode layer 1202 includes a material that is the same or substantially the same as the material of plate electrode 110 (FIG. 1A). In some embodiments, electrode layer 1202 includes a conductive hydrogen barrier material. Examples of conductive hydrogen barrier material are the same or substantially the same as the material of conductive hydrogen barrier 114. In some embodiments, the blanket deposition process may utilize a physical vapor deposition, chemical vapor deposition, or an atomic layer deposition process.

Transistor 402 and gate contact 440 are not shown for clarity.

Figure 12C:
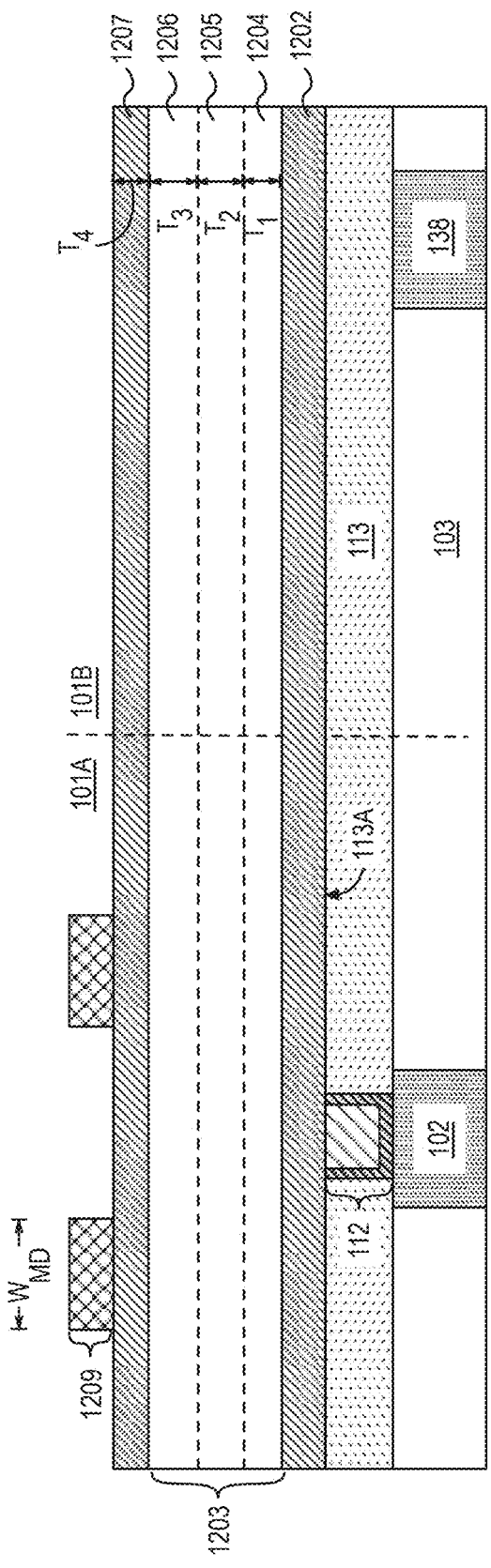
FIG. 12C is a cross-sectional illustration of the structure in FIG. 12B following the process to form a material layer stack on the electrode structure and on the etch stop layer.

FIG. 12C is a cross-sectional illustration of a material layer stack 1203 on electrode layer 1202. The process to form material layer stack 1203 includes blanket deposition of at least three material layers, where the number further depends on a type of memory device to be fabricated. In some embodiments, material layer stack 1203 includes deposition of layers for a ferroelectric memory device. In other embodiments, material layer stack 1203 includes deposition of layers for a paraelectric memory device.

In an embodiment, individual layers of material layer stack 1203 (for a ferroelectric memory device) are deposited in situ, i.e., without breaking vacuum. Material layer stack 1203 may be deposited by an ALD, a PECVD, a CVD, a PVD process, or a combination thereof. In embodiments, the ALD process may be performed at a process temperature between 160° C. and 400° C., the PVD process may be performed at a process temperature between 23° C. (room temperature) and 400° C., and the CVD process may be performed at a process temperature between 160° C. and 400° C.

In some embodiments, conductive layer 1204 is blanket deposited on electrode structure 112 and on etch stop layer 113. In an embodiment, conductive layer 1204 includes a conductive ferroelectric oxide. The conductive ferroelectric oxide includes one of a non-Pb perovskite metal oxides, such as but not limited to, La—Sr—CoO$_3$, SrRuO$_3$, La—Sr—MnO$_3$, YBa$_2$Cu$_3$O$_7$, Bi2Sr$_2$CaCu$_2$O$_8$, or LaNiO$_3$.

Conductive layer 1204 is deposited to a thickness, $T_1$, that is suitable for minimizing electrical resistance and to minimize tapering of sidewalls during a patterning process that will be utilized to fabricate memory devices. In some embodiments, conductive layer 1204 has a thickness that is between 3 nm and 30 nm. A thickness of less than 30 nm is highly desirable to prevent significant tapering in sidewalls during the patterning process.

In an embodiment, the deposition process is continued by deposition of dielectric layer 1205 (for example, ferroelectric dielectric layer 1205 for a ferroelectric memory device). Dielectric layer 1205 may be blanket deposited on conductive layer 1204. Dielectric layer 1205 has a thickness, $T_2$, that is between 1 nm and 30 nm. In some embodiments, dielectric layer 1205 includes non-Pb perovskite material in the form ABO$_3$, where A and B are two cations of different sizes and O is oxygen. A is generally larger than B in size. In some embodiments, non-Pb perovskites can also be doped, e.g., by La or lanthanides. The non-Pb perovskite material can include one or more of La, Sr, Co, Cr, K, Nb, Na, Sr, Ru, Y, Fe, Ba, Hf, Zr, Cu, Ta, Bi, Ca, Ti, and Ni.

In other embodiments, dielectric layer 1205 includes a low voltage ferroelectric material sandwiched between conductive layer 1204 and conductive layer 1206. Low voltage materials can be of the form AA'BB'O$_3$, where A' is a dopant for atomic site A and can be an element from the lanthanides series and B' is a dopant for atomic site B and can be an element from the transition metal elements such as Sc, Ti, V, Cr, Mn, Fe, Co, Ni, Cu, or Zn. A' may have the same valency of site A, with a different ferroelectric polarizability. A voltage below 3 Volts is sufficiently low to be characterized as low voltage.

The deposition process is continued with a deposition of conductive layer 1206 on dielectric layer 1205. In an exemplary embodiment, conductive layer 1206 includes a material that is the same or substantially the same as the material of conductive layer 1204. When conductive layer 1204 and conductive layer 1206 include a same material, material layer stack 1203 is symmetric. In different embodiments, conductive layer 1206 can have a different thickness than conductive layer 1204. In embodiments, conductive layer 1206 is deposited to a thickness, $T_3$, between 3 nm and 30 nm. Conductive layer 1206 between 3 nm and 30 nm can facilitate the patterning process.

In various embodiments, the as-deposited grain size of conductive layers 1204 and 1206 and in dielectric layer 1205 is less than 15 nm. Grain size refers to an average length of a longest dimension of a grain within conductive layers 1204 and 1206. In various embodiments, point defects in conductive layers 1204 and 1206, that are deposited but not annealed, are greater than 1e22 atoms/cm$^3$.

In some embodiments, such as is indicated, the deposition process concludes with the formation of capping layer 1207 on conductive layer 1206. In some embodiments, capping layer 1207 is blanket deposited by a PECVD, CVD, or PVD process. In an embodiment, capping layer 1207 includes a material that has a favorable etch selectivity compared to the ferroelectric materials in material layer stack 1203. In other embodiments, capping layer 1207 includes a conductive material that is different from the conductive material of the ferroelectric material. In a different embodiment, capping layer 1207 includes a bilayer where the bilayer includes a metallic layer and a dielectric on the metallic layer. In some such embodiments, the dielectric can be patterned with high fidelity and includes for example, $SiO_2$, $Si_3N_4$, DLC (Diamond Like Carbon), or $Al_2O_3$.

In an embodiment, dielectric layer 1205 includes paraelectric materials. Paraelectric materials may include: SrTiO3, Ba(x)Sr(y)TiO3 (where x is −0.05, and y is 0.95), HfZrO2, Hf—Si—O, La-substituted PbTiO3, or a PMN-PT based relaxor ferroelectrics. In some embodiments, material layer stack including paraelectric materials can range from 5 nm to 100 nm in total thickness. In various embodiments, point defects in dielectric layer 1205, that is as-deposited but not annealed, is greater than 1e22 atoms/cm³.

In some embodiments, a post deposition anneal process is formed after deposition of material layer stack 1203. A post deposition anneal may be characterized by an anneal after the deposition process, in contrast to an in-situ anneal which takes place during deposition. Depending on embodiments the anneal can take place after deposition of all the layers in material layer stack 1203, or at least after the dielectric layer has been deposited. In the illustrative embodiment, a PDA is performed after deposition of material layer stack 1203.

In various embodiments, the anneal temperatures can be as high as 1300° Celsius, where anneal durations are limited to less than or equal to 60 seconds. The specific temperature, and time duration are dependent on the annealing technique utilized and a maximum thermal budget that is not impactful to transistor 402 (not shown). Specifically, annealing material layer stack 1203 is performed in a manner to suitably prevent metallurgical reaction between gate dielectric layer 405 and gate electrode 407.

It is to be appreciated that while materials of gate electrode 407 have been deposited at temperatures less than 400° C., atomic diffusion in the vicinity of the gate dielectric layer 405 and gate electrode 407 may not occur when PDA is carried out for short time durations. Temperatures of 700° C. and less, and time durations of 60 seconds or less, for example, may be considered to be a short time duration.

In an embodiment, PDA anneal at temperatures less than or equal to 1300° C. has an effect of increasing grain size due to coalescence of smaller grain sizes. The net growth in grain size can be a function of the as-deposited thickness. In some embodiments, when the deposited thickness of layers in material layer stack 1203 are less than 30 nm thick, the PDA at temperatures less than 1300° C. is found to increase grain size to a peak value of approximately 50 nm. It is to be appreciated that the grain size refers to an average length of a grain. PDA does not increase thickness of the as-deposited layers.

In some embodiments, post deposition anneal can include an RTP/RTA process that can be performed at temperatures above >1000° C. However, since the duration of anneal is on the order of a minimum of a few seconds, it is preferable to use RTP/RTA for annealing to temperatures <800° C. to avoid damage to underlying structures such as transistor 402.

In some embodiments PDA includes a flash anneal process. Flash and Laser annealing offer extremely short durations, and thus can allow high temperatures >1000° C. without damaging the underlying structures e.g., transistors, on the wafer. Flash and laser anneal can include spot heating or beam rastering for increased throughput. Processing pressures range from 1 Torr to 760 Torr while flowing in $O_2$, $N_2$, or argon gases, or in air. In other embodiments, flash anneal processes are carried out in vacuum at pressures less than 1 Torr. In various embodiments, processing temperatures range from 500° to 1300° C., where the heating and cooling rate is approximately $10^6$ degrees C./s. In some embodiments, processing times is 1 ms or less.

In various embodiments, point defects in dielectric layer 1205, conductive layers 1204 and 1206, post anneal, have a defect density of less than 1e20 atoms/cm³.

After an anneal process, mask 1209 may be formed on capping layer 1207. In an embodiment, mask 1209 is formed by a lithographic process on capping layer 1207.

FIG. 12D is a cross-sectional illustration of the structure in FIG. 12C following the process to etch material layer stack 1203 (and in some embodiments, capping layer 1207). In an embodiment, material layer stack 1203 is etched by a plasma etch process. The plasma etch process may include a discharge produced by a magnetic enhanced reactive ion etching mechanism, an electron cyclotron resonance discharge or an inductively coupled plasma discharge. The plasma parameters may be characterized by a range of plasma densities such as between 1e9 and 1e12 ions/cm³, pressures in the range of 0.001-10 Torr, and electron temperatures in the range of 1-8 eV. Ions may be accelerated to the surface from a plasma sheath by means of electrostatic chuck with biasing capabilities that are independent of the power delivered to sustain various plasma configurations.

In an embodiment, the plasma etch process is utilized to etch conductive layer 1206 to form top electrode 132. In the illustrative embodiment, memory device 108 has substantially vertical sidewalls 108A. In some embodiments, capping layer 1207 is etched into cap 133 (dashed lines). When cap 133 includes a dielectric material, cap 133 may be removed during the plasma etch process as indicated by dashed lines. The etch process continues to etch and form dielectric layer 130.

The plasma etch process is continued to etch and form bottom electrode 128. In an embodiment, the process utilized to etch conductive layer to form bottom electrode 128 may be substantially the same as the etch process utilized to form top electrode 132. In the illustrative embodiment, sidewalls 1211 of memory device 108 are substantially vertical with respect to uppermost surface 110A. In the process of forming top electrode 132, and dielectric layer 130, bottom electrode 128 completes formation of memory device 108.

It is to be appreciated that the process of etching to form bottom electrode 128 exposes electrode layer 1202. An over etch may be required to etch the material of bottom electrode 128 completely from above bottom electrode 128. Some portions of electrode layer 1202 may become etched due to local non-uniformity in the etching process. In some embodiments regions between and immediately adjacent to memory devices 108 may become recessed as indicated by dashed lines 1213.

FIG. 13A is a cross-sectional illustration of the structure in FIG. 12D following the process to deposit encapsulation layer on memory devices 108, and on electrode layer 1202.

The process utilized to deposit encapsulation layer 116 depends on the material utilized, on the height of memory device 108, and on the relative spacing between adjacent memory devices 108. In exemplary embodiments, the deposition process utilized to deposit encapsulation layer 116 does not include hydrogen or ammonia containing chemicals to prevent hydrogen exposure to layers within memory device 108. Depending on a deposition process some materials can be deposited by both a non-hydrogen or ammonia containing chemicals. However, each deposition process can have different deposition rates and deposition conformality. In general, a combination of ALD, PVD, and CVD processes may be utilized depending on spacing SM between adjacent memory devices 108.

In the illustrative embodiment, encapsulation layer 116 is blanket deposited.

In an embodiment, encapsulation layer 116 includes a metal containing insulator material. Some examples of the insulator material include a metal and oxygen, such as, but not limited to $Al_xO_y$, $HfO_x$, $AlSiO_x$, $ZrO_x$, or $TiO_x$. In some embodiments, encapsulation layer 116 can include a metal and nitrogen such as, but not limited to, AlN, ZrN, and HfN. In other embodiments, encapsulation layer 116 can include a metal, and both Si and O, such as $AlSiO_x$, $HfSiO_x$, and $TaSiO_x$.

Materials such as $Al_xO_y$, $HfO_x$, $AlSiO_x$, $ZrO_x$, or $TiO_x$ can be deposited without a hydrogen or ammonia containing chemical precursor in an ALD process. In some embodiments, encapsulation layer 116 can be deposited by an ALD process to a thickness in the range of 0.5 nm-10 nm. In some embodiments, encapsulation layer 116 may be deposited to a thickness of less than 5 nm. An ALD process can provide a substantial conformal thickness on sidewalls 108A and on uppermost surface 108B, as shown.

In other embodiments a physical vapor deposition (PVD) process may be utilized. In some such embodiments, encapsulation layer 116 can include an insulative metal containing material. For example, encapsulation layer 116 can include a metal and nitrogen such as, but not limited to, AlN, ZrN, and HfN, or a compound of a metal, and both Si and O and, such as $AlSiO_x$, $HfSiO_x$, and $TaSiO_x$.

In other embodiments, encapsulation layer 116 includes a nonmetallic element such as silicon, and one or more of nitrogen or carbon. In one such embodiment, encapsulation layer 116 can be deposited by a PVD, CVD, or an ALD process. In some embodiments, a PVD process may be utilized to form a thin layer of encapsulation layer 116 to avoid exposure of memory devices 108 to hydrogen or ammonia, followed by an ALD process to deposit the same material to provide substantial conformality on sidewalls 108A. In some such embodiments, encapsulation layer 116 is deposited to a thickness of at least 2 nm. A thickness of approximately 2 nm may be sufficient to prevent hydrogen diffusion through encapsulation layer 116 that is deposited with a material density of at least 90%.

A PVD process may not provide a substantially conformal deposition. In some such embodiments, encapsulation layer 116 is not deposited with a uniform thickness $T_{EC}$ and portions of encapsulation layer 116 adjacent to uppermost surface of memory device 108 is wider (illustrated by dashed lines 1301) than portions adjacent to lower-most surface of memory device 108.

Figure 13B:
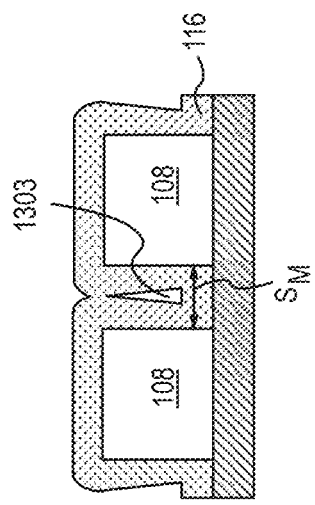
FIG. 13B is a cross-sectional illustration of the structure in FIG. 13A in an embodiment, where encapsulation layer formed on sidewalls of memory devices merge.

In some embodiments, $S_M$ is approximately equal to two times $T_{EC}$ as shown in FIG. 13B. In some such embodiments, encapsulation layer 116 formed on sidewalls 108D of two adjacent memory devices 108, can merge. In the illustrative embodiment, sidewalls 108D face each other and the encapsulation layer 116 formed on sidewalls 108D are substantially conformal with sidewalls 108D and the merged portion includes no defects or voids. An ALD deposition process may be used.

In some embodiments, $S_M$ is between 2 and 4 times $T_{EC}$. In some such embodiments, via electrode 202 (FIG. 2B) can be directly adjacent to portions of encapsulation layer 116 that are adjacent to sidewalls 108D.

Figure 13C:
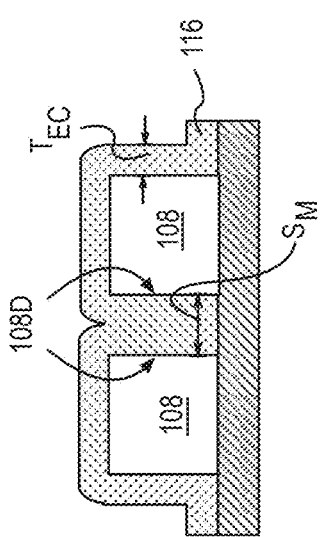
FIG. 13C is a cross-sectional illustration of the structure in FIG. 13A where encapsulation layer formed on sidewalls of memory devices merge and form a keyhole void, in accordance with embodiments of the present disclosure.

In other embodiments, when a PVD process is utilized, a non-conformal deposition on sidewalls 108D can result in keyhole artifact 1303, as illustrated in FIG. 13C. As shown, keyhole artifact 1303 may be formed between merged portions of encapsulation layer 116. In other embodiments, a combination of ALD deposition and PVD deposition processes can also produce keyhole artifact 1303 depending on relative thickness of encapsulation layer 116 deposited by each process.

Figure 14:
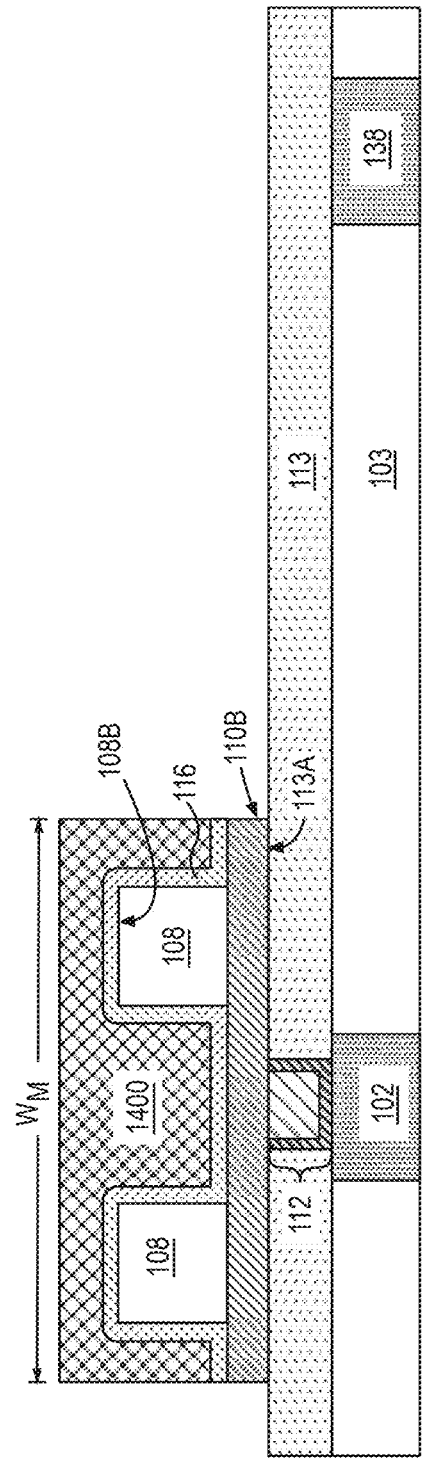
FIG. 14 is a cross-sectional illustration of the structure in FIG. 13A following the process to mask and etch the electrode layer.

FIG. 14 is a cross-sectional illustration of the structure in FIG. 13A following the process to etch encapsulation layer 116 and plate electrode 110. In an embodiment, mask 1400 is formed on encapsulation layer 116. Mask 1400 may include material such as photoresist that has been patterned lithographically. Mask 1400 has a shape that defines a plan view shape and size of plate electrode 110 to be formed. The lateral thickness, $W_M$, of mask 1400 can be chosen to cover two or more memory devices.

In the illustrative embodiment, mask 1400 is utilized to pattern encapsulation layer 116, and electrode layer 1202, and form electrode 110. A plasma etch process may be utilized to pattern. It is desirable for the plasma etch process to be selective to etch stop layer 113 to avoid exposure of conductive interconnect 138. Preventing exposure of conductive interconnect 138 is highly desirable when conductive interconnect 138 includes copper and etchants utilized to form plate electrode 110 including halogen chemistry.

In an embodiment, the plasma etch process may be part of two operation processes, where a first operation, including a first chemistry that is selective to mask 1400, and electrode layer 1202 is utilized to etch encapsulation layer 116. After etching encapsulation layer 116, mask 1400 may be removed and encapsulation layer 116 may be used as a mask to etch electrode layer 1202 from memory region 101A and from logic region 101B in a second operation. A second chemistry may be utilized to etch electrode layer 1202 that is selective to encapsulation layer 116.

In some embodiments, mask 1400 is not removed and the second operation continues with mask 1400 in place. In some such embodiments, mask 1400 can be consumed during the etch process or be removed after forming plate electrode 110.

The plasma etch process can form plate electrode 110 with sidewalls 110B that are substantially vertical. In some examples, sidewalls 110B can be tapered relative to uppermost surface 113A.

In some embodiments, plate electrode 110 includes a material that may be susceptible to hydrogen and oxygen diffusion. In some such embodiments, it may be desirable for sidewalls 110B to be encapsulated as shown in the cross-sectional illustration of FIG. 15A. FIG. 15A is a cross-sectional illustration of the structure in FIG. 14 following the process to deposit encapsulation layer 1500 on encapsulation layer 116, and on exposed portions of etch stop layer 113, in accordance with an embodiment of the present disclosure.

In an embodiment, encapsulation layer 1500 includes a material that is the same or substantially the same as the material of encapsulation layer 116. In an embodiment, encapsulation layer 1500 includes a nonmetallic element such as silicon and one or more of nitrogen or carbon. Encapsulation layer 1500 may be deposited by a PVD, ALD, or a CVD process, or a combination thereof.

While depositing encapsulation layer 1500 can encapsulate sidewalls 110B, addition of the encapsulation layer 1500 above encapsulation layer 116 can require further processing operations to fabricate via electrode within level 106. The additional encapsulation layer 1500 will need to be etched while forming the via electrode above memory devices 108.

In other embodiments, encapsulation layer 1500 may be etched to form a spacer as shown in the enhanced cross-sectional illustration of FIG. 15B. The etch process may be designed to remove encapsulation layer 1500 from above plate electrode 110 while removing encapsulation layer 1500 from above memory devices 108 (FIG. 15A). However, the etch process forms spacer 1500B adjacent to sidewalls 110B as shown. Formation of spacer 1500A can encapsulate sidewalls 110B as well as obviate the need for etching encapsulation layer 1500 while forming via electrode above memory devices 108 (FIG. 15A).

FIG. 16A is a cross-sectional illustration of the structure in FIG. 15A following the process to form openings 1600 in dielectric 126 and encapsulation layer 116 to form via electrodes. In the illustrative embodiment, dielectric 126 is blanket deposited on encapsulation layer 116, and on etch stop layer 113. In an embodiment, the blanket deposition process may be performed by a PECVD or a CVD process.

A planarization process may be performed to planarize dielectric 126. In an embodiment, the planarization process includes a chemical mechanical planarization process. The CMP process may form an uppermost surface 126A that is substantially planar.

Mask 1601 is formed on dielectric 126. In an embodiment, mask 1601 includes a photo resist material and may be lithographically patterned.

Openings 1600 may be formed by a plasma etch process that etches dielectric 126 but is selective to encapsulation layer 116. A selective etch process may be desirable when the width of the opening 1600 is comparable or greater than a width of memory device 108. Any potential issues arising from misalignment between the location of opening 1600 in mask 1601 and memory device 108 can be reduced when the plasma etch utilized to etch dielectric 126 is selective to encapsulation layer 116. In some embodiments, openings 1600 can have a width, between 20 nm-100 nm.

After etching dielectric 126, the plasma etch process is continued to etch a portion of encapsulation layer 116. The etch process exposes uppermost surface 108B of memory device 108. The opening 1600 may have sidewalls 1600A that are substantially vertical or flared. In the illustrative embodiment, sidewalls 1600A are substantially vertical. In other examples, sidewalls 1600A may be tapered as indicated by dashed lines 1603.

In embodiments, encapsulation layer 1500 is deposited and etched. In some such embodiments, a spacer 1500A can be formed adjacent to sidewall 110B, and spacer 1500B can be formed adjacent to encapsulation layer 116 above plate electrode 110, as indicated by dashed lines.

FIG. 16B is a cross-sectional illustration of the structure in FIG. 16A following the process to deposit materials to form via electrodes. In the illustrative embodiment, conductive hydrogen barrier material 1604A is blanket-deposited into openings 1600, on memory device 108 and on sidewall of dielectric 126. Conductive hydrogen barrier material 1604A includes a material that is chemically compatible with dielectric 126 so that interface 1617 between conductive hydrogen barrier material 1604A and dielectric 126 is not a source of dislocations.

In an embodiment, liner layer material 1604B is blanket deposited in openings 1600, and on conductive hydrogen barrier material 1604A. A layer of conductive fill material 1604C is deposited into the remaining portions of openings 1600 on liner layer material 1604B.

In embodiments, conductive hydrogen barrier material 1604A, liner layer material 1604B and layer of conductive fill material 1604C are deposited by an ALD, PVD, or sputter deposition process.

FIG. 16C is a cross-sectional illustration of the structure in FIG. 16B following the process to planarize and form via electrode 118 on respective memory devices 108.

In an embodiment, the planarization process includes a chemical mechanical planarization (CMP) process. The CMP process removes layer of conductive fill material 1604C, liner layer material 1604B, and conductive hydrogen barrier material 1604A from uppermost surface 126A of dielectric 126. The planarization process isolates conductive hydrogen barrier material 1604A to form conductive hydrogen barrier 120, liner layer material 1604B to form liner layer 122 and the layer of conductive fill material 1604C to form conductive fill material 124. The CMP process may also reduce the as-deposited thickness of dielectric 126.

Figure 16D:
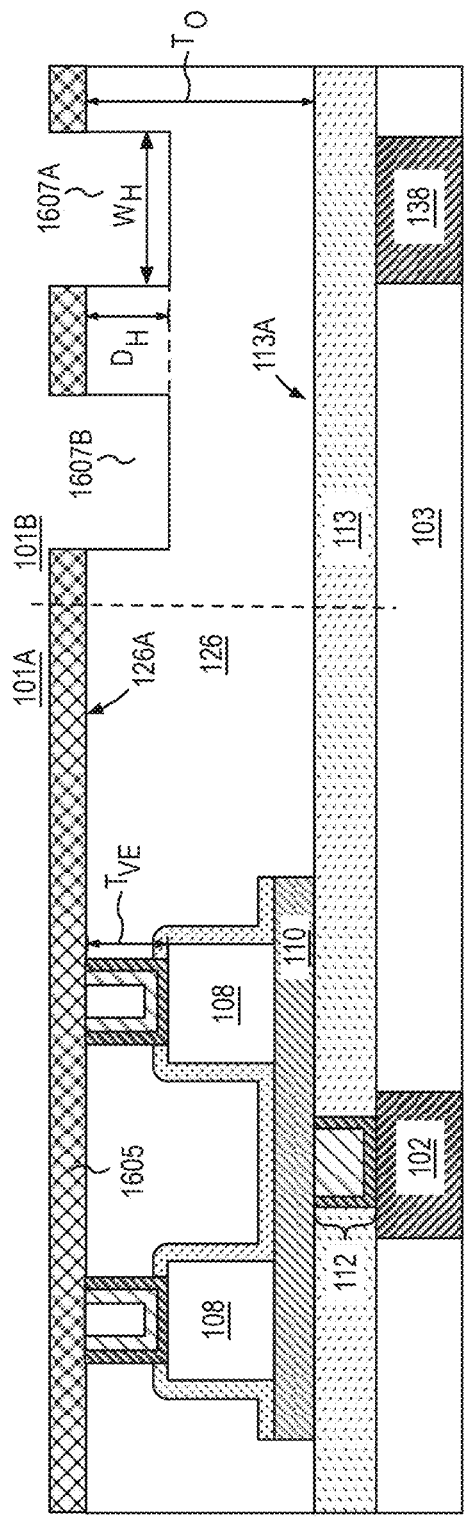
FIG. 16D is a cross-sectional illustration of the structure in FIG. 16C following the process to form hanging trenches in the dielectric in the logic region.

FIG. 16D is a cross-sectional illustration of the structure in FIG. 16C following the process to form mask 1605 on dielectric 126, and on via electrodes 118, and following the process to etch dielectric 126 to form hanging trench openings 1607A and 1607B in logic region 101B. Mask 1605 is designed to form an interconnect structure in logic region 101B. In an embodiment, mask 1605 is formed by a lithographic process and includes a photoresist material.

In an embodiment, a plasma etch process is utilized to etch dielectric 126 through openings in mask 1605 to form hanging trench openings 1607A and 1607B. Dielectric 126 may be etched to form hanging trench openings 1607A and 1607B with a depth, $D_H$, measured relative to uppermost surface 126A. In different embodiments, $D_H$ can be equal, less than or greater than $T_{VE}$. In general $D_H$ may depend on interconnect circuitry within level 106. In embodiments, $D_H$ ranges between 10 nm and 50 nm. $D_H$ may be set by height and width of a via to be formed within hanging trench opening 1607A. $W_H$, may also be determined by a thickness $T_O$, of dielectric 126 relative to uppermost surface 113A of etch stop layer 113.

Hanging trench openings 1607A and 1607B may be etched to have a width, $W_H$. $W_H$ may range between 10 nm and 200 nm. $W_H$ may be determined by a width of interconnect vias to be formed within hanging trench openings 1607A and 1607B. In general, height and width of a via is determined by a desired minimum line conductance of the via and a metal line to be formed within hanging trench opening 1607A.

Figure 16E:
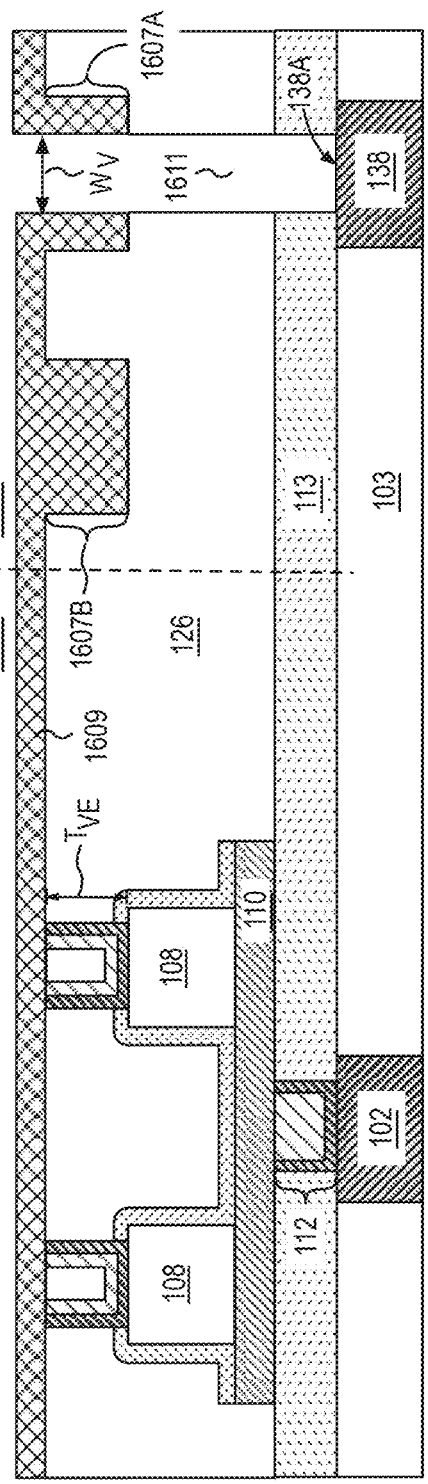
FIG. 16E is a cross-sectional illustration of the structure in FIG. 16D following the process to form a via opening within one of the hanging trenches, where the via exposes a conductive interconnect in the logic region.

FIG. 16E is a cross-sectional illustration of the structure in FIG. 16D following the process to form via mask 1609 within hanging trench opening 1607A in logic region 101B, and via opening 1611 in dielectric 126.

In an embodiment, via mask 1609 is utilized to form hanging trench openings 1607A, 1607B is removed, and via mask 1609 is formed. In an embodiment, via mask 1609 is formed by a lithographic process and includes a photoresist material. Via mask 1609 has via opening 1611 within hanging trench opening 1607A that is designed to enable etching dielectric 126 to form a via opening in a subsequent operation. Via opening 1611 has a lateral thickness $W_V$. The opening may be symmetric about hanging trench opening 1607A or be offset. $W_V$ can range between 25%-75% of $W_H$.

In an embodiment, a plasma etch process is utilized to form via opening 1611 by etching dielectric 126 and etch stop layer 113. Via opening 1611 is formed below hanging trench opening 1607A in region 101B.

In an embodiment, dielectric 126 is first etched and the etch is halted after exposing etch stop layer 113. The plasma etch process is continued with a different chemistry to etch stop layer 113. An advantage of the process methodology outlined herein, is that etch stop layer 113 has a thickness, $T_L$, that is determined by a deposition process and by the formation of electrode structure 112 in memory region 101A. Formation of via opening 1611 within etch stop layer 113 can be targeted and tuned by fixing a thickness of etch stop layer 113 to a desired thickness. In the illustrative embodiment, the formation of via opening 1611 exposes uppermost surface 138A of conductive interconnect 138. The via opening 1611 may have a first slope within dielectric 126 and a second slope within etch stop layer 113 due to a difference in material between dielectric 126 and etch stop layer 113.

FIG. 16F is a cross-sectional illustration of the structure in FIG. 16E following the process to deposit a conductive material into the openings to form via structure 144, and metal structures 140 and 142. Via mask 1609 utilized to form via opening 1611 (FIG. 16E), is removed and a conductive material is deposited into hanging trench openings 1607A and 1607B, and into via opening 1611. In an embodiment, depositing the conductive material includes depositing liner layer 1613 in via opening 1611, and in hanging trench openings 1607A, and 1607B. In such embodiments, liner layer 1613 is also deposited on uppermost surface 138A of conductive interconnect 138, on sidewalls of etch stop layer 113, dielectric 126, on uppermost surface 126A and on surfaces of via electrodes 118. Conductive fill material 1615 is deposited on liner layer 1613. In some embodiments, conductive fill material 1615 includes copper, tungsten, nickel, or cobalt, and liner layer 1613 includes ruthenium tantalum, or nitrides of tantalum or titanium. In other embodiments where no liner is implemented a conductive fill material is directly deposited on uppermost surface 138A of conductive interconnect 138, on sidewalls of etch stop layer 113, dielectric 126, on uppermost surface 126A and on surfaces of via electrodes 118.

A planarization process may be utilized to remove excess conductive fill material 1615 deposited on liner layer 1613 above dielectric 126 and via electrodes 118. In an embodiment, the planarization process includes a chemical mechanical polish (CMP) process. The CMP process isolates metal structures 140 and 142 within hanging trench openings 1607A, and 1607B. Via structure 144 is formed at the same time as metal structure 140. The liner layer is contiguous between via structure 144 and metal structure 142 and conductive fill material 1615 extends continuously from metal structure 142 to via structure 144.

In the illustrative embodiment, uppermost surfaces 118A of via electrodes 118, and uppermost surfaces 140A, and 142A of metal structures 140, and 142, respectively, are co-planar or substantially co-planar after the CMP process.

In general, via electrodes 118 may be fabricated before or after fabrication of via structure 144 and metal structures 140 and 142.

In some embodiments, plate electrode 110 is coupled by a signal electrode as illustrated in FIG. 2A. In such embodiments, plate electrode 110 may be formed by increasing lateral width, $W_M$, of mask 1400 as illustrated in FIG. 14.

FIG. 17A is a cross-sectional illustration of an embodiment of the structure in FIG. 16F. In the illustrative embodiment, plate electrode 110 further extends on etch stop layer 113 compared to plate electrode 110 in FIG. 16F. Referring again to FIG. 17A, plate electrode 110 may or may not extend symmetrically about the memory devices 108. In the illustrative embodiment, plate electrode 110 extends beyond sidewall 108A of one of the memory devices 108. Plate electrode 110 does not extend beyond memory region 101A. As shown, encapsulation layer 116 also extends over entire uppermost surface 110A. Extension in plate electrode 110 is to facilitate formation of a via electrode for routing signal.

FIG. 17B is a cross-sectional illustration of the structure in FIG. 17A following the process to form via opening 1700 in dielectric 126 and in encapsulation layer 116. In an embodiment, mask 1702 is formed on dielectric 126, via electrodes 118, and metal structures 140 and 142. In an embodiment, mask 1702 includes a photoresist material and is formed by a lithographic process. In an embodiment, a plasma etch process is utilized to form via opening 1700 by etching dielectric 126 and encapsulation layer 116.

FIG. 17C is a cross-sectional illustration of the structure in FIG. 17B following the process to form via electrode 202, in accordance with an embodiment of the present disclosure. In an embodiment, a conductive material is deposited into via opening 1700. In an embodiment, depositing the conductive material includes depositing liner layer 1704 in via opening 1700. In such embodiments, liner layer 1704 is also deposited on uppermost surface 110A of plate electrode 110, on sidewalls of etch stop layer 113, dielectric 126, on uppermost surface 126A and on surfaces of via electrodes 118, and metal structures 140 and 142. A conductive fill material 1615 is deposited on liner layer 1613. In some embodiments, conductive fill material 1615 includes copper, tungsten, nickel or cobalt, and liner layer 1613 includes ruthenium tantalum, or nitrides of tantalum or titanium. In other embodiments where no liner is implemented, a conductive fill material is directly deposited on uppermost surface 138A of conductive interconnect 138, on sidewalls of etch stop layer 113, dielectric 126, on uppermost surface 126A, and on surfaces of via electrodes 118.

A planarization process may be utilized to remove an excess conductive fill material 1706 deposited on liner layer 1704 above dielectric 126, via electrodes 118, and metal structures 140 and 142. In an embodiment, the planarization process includes a chemical mechanical polish (CMP) process. The CMP process forms via electrode 202. Via electrode 202 may also be formed prior to forming via electrodes 118, and metal structures 140 and 142.

FIG. 18A is a cross-sectional illustration of the structure in FIG. 13A, following the process to form spacer 1800 adjacent to sidewall 108A of memory devices 108. Spacer 1800 can be formed in embodiments where memory devices 108 include a hydrogen barrier layer above electrodes that are immediately in contact with ferroelectric or paraelectric dielectric material. In the illustrative embodiment, memory devices 108 include a conductive hydrogen barrier 134 as an uppermost layer.

In an embodiment, encapsulation layer 116 can be etched to form spacer 1800 by a plasma etch process. The plasma etch process may be utilized to selectively remove encapsulation layer 116 from above surface 1202A of electrode layer 1202, and above memory devices 108. The plasma etch process also enables formation of spacer 1800 having outmost sidewall 1800A that is substantially vertical as shown. Spacer 1800 extends vertically directly adjacent to sidewalls 108A to uppermost surface 108B. As shown, spacer 1800 covers an interface between conductive hydrogen barrier 134 and a layer directly below within memory device 108. Spacer 1800 has a maximum thickness $T_S$ that may be less than a thickness of the as-deposited encapsulation layer 116. Forming spacer 1800 can be advantageous when a thick spacer, such as a spacer with a thickness above 5 nm, is desired. Etching a thick encapsulation layer from above memory devices 108 can help to preserve vertical thickness of level 106 (FIG. 1A).

Forming spacer 1800 can also be advantageous while forming via electrodes in memory region 101A and in logic region 101B as a single dielectric etch may be utilized to form via openings.

FIG. 18B is a cross-sectional illustration of the structure in FIG. 18A following the process to form plate electrode 110. In an embodiment, mask 1400 is formed on encapsulation layer 116. Mask 1802 may include a material such as photoresist that has been patterned lithographically. Mask 1802 has a shape that defines a plan view shape and size of plate electrode 110 to be formed. In some embodiments, mask 1802 has one or more features of mask 1400 (FIG. 14). The lateral thickness $W_M$ of mask 1802 can be chosen to cover two or more memory devices.

In the illustrative embodiment, mask 1802 is utilized to pattern electrode layer 1202 and form electrode 110. The process utilized to etch electrode layer 1202 to form plate electrode 110 has been described above (see FIG. 14). In the illustrative embodiment, a single etch operation to pattern electrode layer 1202 is utilized. Plate electrode 110 has one or more features (sidewalls, thickness etc.), of plate electrode 110 described in association with FIG. 14.

In some embodiments, mask 1802 can be extended to pattern a larger plate electrode 110 as indicated by dashed lines 1801.

FIG. 18C is a cross-sectional illustration of the structure in FIG. 18B following the process to form a via opening 1804 above a respective memory device 108. In the illustrative embodiment, dielectric 126 is deposited on memory devices 108, spacer 1800, etch stop layer 113, and on plate electrode 110. In embodiments, dielectric 126 includes a material that is described above (FIG. 1A). In some embodiments, dielectric 126 is blanket deposited by a CVD or a PECVD process. Dielectric 126 can be planarized depending on a combined thickness of plate electrode 110 and memory device 108. In the illustrative embodiment, dielectric is planarized by a CMP process, for example.

Mask 1806 is formed on dielectric 126. In an embodiment, mask 1806 includes a photoresist material and may be lithographically patterned. Openings 1804 may be formed by a plasma etch process that etches dielectric 126 but is selective to conductive hydrogen barrier 134. Opening 1804 may have sidewalls 1804A that are substantially vertical or flared. In the illustrative embodiment, sidewalls 1804A are substantially vertical. In other examples, sidewalls 1804A may be tapered as indicated by dashed lines 1807.

FIG. 18D is a cross-sectional illustration of the structure in FIG. 18C following the process to form via electrodes 118 and metal structures 140 and 142, and via structure 144 in logic region 101B. The process to form via electrode 118 is the same or substantially the same as the process utilized to form via electrode 118 described in association with FIGS. 16B-C. In the illustrative embodiment, via electrodes 118 are in contact with a respective memory device 108 and surrounded laterally only by dielectric 126.

The method utilized to fabricate form via structure 144, and metal structures 140, and 142 are the same or substantially the same as methods described in FIGS. 16D-16F.

In some embodiments, memory devices 108 do not include a hydrogen barrier layer as part of the stack. To provide a barrier against hydrogen diffusion directly into uppermost surface of memory device 108, a dielectric that is amorphous, having a high film density (a film density above 90% of theoretical material density or film density) may be directly in contact with an uppermost surface 108B. In some such instances the high film density-dielectric is present over memory region 101A directly adjacent to routing interconnects in logic region 101B. To minimize line capacitance, the routing interconnects are embedded within a low dielectric constant interlayer dielectric (ILD), where the ILD has a low film density (less than 90% film density) or a high porosity material. The process of forming regions with dual dielectric materials is illustrated in FIGS. 19A and 19B.

Figure 19A:
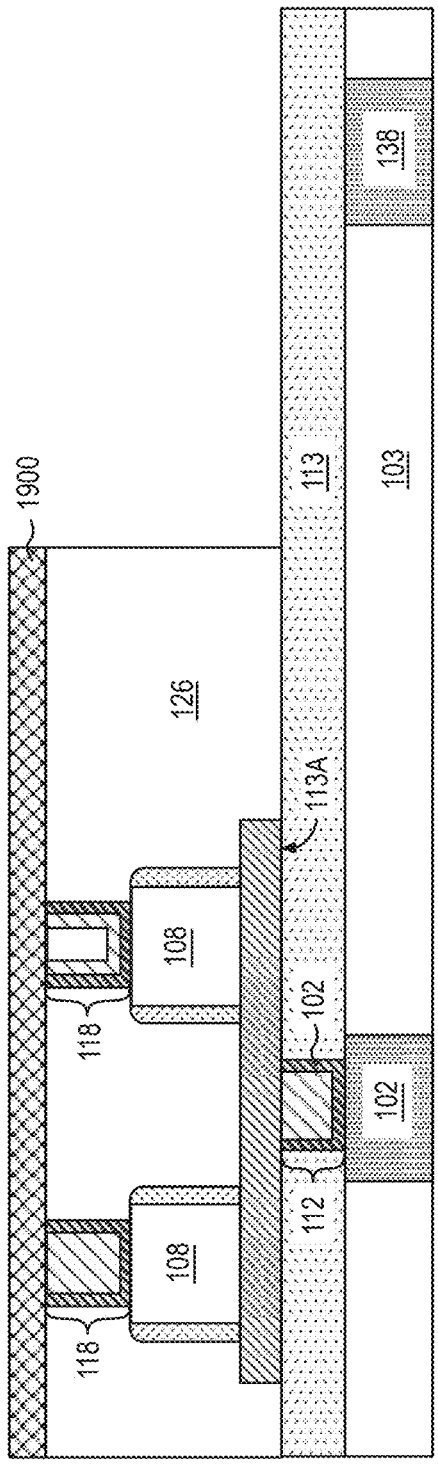
FIG. 19A is a cross-sectional illustration of the structure in FIG. 18C following the process to form a via electrode above individual respective memory device and following the process to etch and remove the dielectric from the logic region, in accordance with an embodiment of the present disclosure.
Figure 19B:
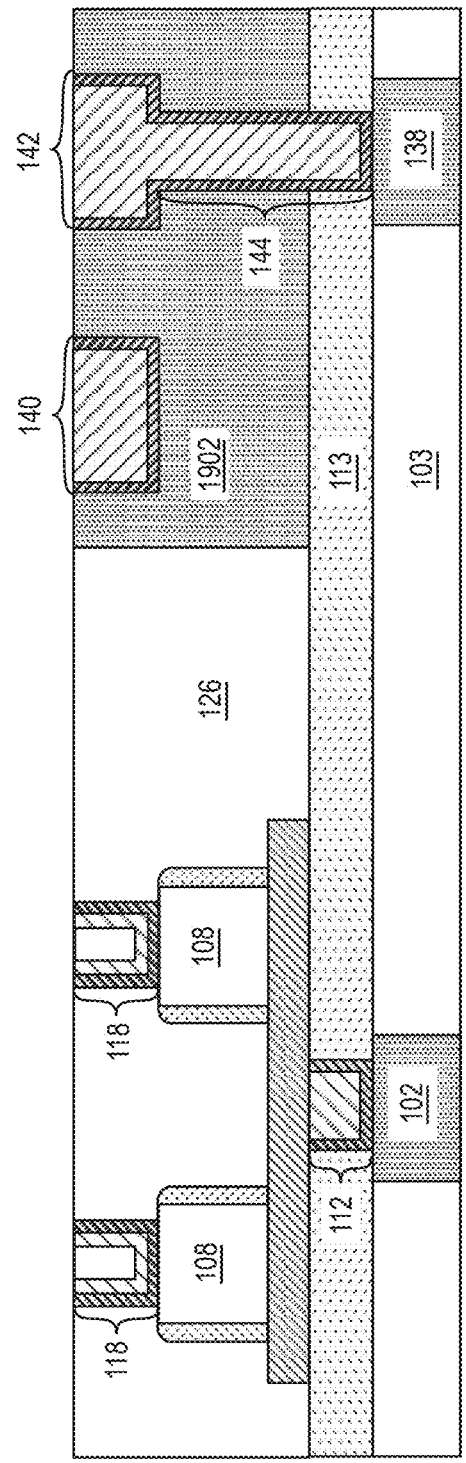
FIG. 19B is a cross-sectional illustration of the structure in FIG. 19A following the process to deposit a second dielectric in the logic region and following the formation of via structure, and metal lines or structure, in accordance with an embodiment of the present disclosure.

FIG. 19A is a cross-sectional illustration of the structure in FIG. 18C following the process to form via electrodes 118 and following the process to etch and remove dielectric 126 from logic region 101B, in accordance with an embodiment of the present disclosure. Fabrication of via electrode 118 is described in association with FIG. 18D.

In an embodiment, after fabrication of via electrodes 118, (see FIG. 18D) mask 1900 is formed on dielectric 126, and on via electrodes 118. A portion of dielectric 126 in logic region 101B is etched and removed. In the illustrative embodiment, dielectric 126 includes an insulator material including a metal and oxygen, for example, $Al_xO_y$, $HfO_x$, $AlSiO_x$, $ZrO_x$, $TiO_x$, $AlSiO_x$, $HfSiO_x$, $TaSiO_x$, or a metal and a nitrogen, for example, AlN, ZrN, or HfN. Dielectric 126 having a high density film can be advantageous in embodiments, where plate electrode 110 includes a material that may not provide adequate protection against hydrogen diffusion.

In an embodiment, a plasma etch process may be utilized to etch dielectric 126, that is a nonconductive metallic oxide or metallic nitride selectively to etch stop layer 113.

FIG. 19B is a cross-sectional illustration of the structure in FIG. 19A following the process to deposit dielectric 1902 in logic region 101B and following the formation of via structure 144, and metal structures 140, and 142, in accordance with an embodiment of the present disclosure.

In the illustrative embodiment, dielectric 126 is replaced by dielectric 1902 in logic region 101B. Dielectric 1902 may be blanket deposited on etch stop layer 113, on dielectric 126, and on via electrodes 118 by a CVD or a PECVD process. In some embodiments, dielectric 1902 includes $SiO_2$, SiOC, SiC, or $SiO_2$ doped with F. Dielectric 1902 may be planarized, for example, by a CMP process.

In the illustrative embodiment, via structure 144, and metal structures 140, and 142 are formed in dielectric 1902. The method utilized to fabricate form via structure 144, and metal structures 140, and 142 are the same or substantially the same as the method described in association with FIGS. 16D-16F.

While memory devices 108 have been described in various embodiments in the context of planar capacitors, other geometries such as trench capacitors are also possible.

FIG. 20A is a cross-sectional illustration of a plurality of trench capacitors 2002 above plate electrode 110 in memory region 101A, in accordance with an embodiment of the present disclosure.

Trench capacitors 2002 are on and coupled with plate electrode 110. Trench capacitors 2002 include one or more ferroelectric materials or one or more paraelectric materials. As shown, trench capacitors 2002 include a first electrode, herein bottom electrode 2004. Bottom electrode 2004 includes a base portion in contact with plate electrode 110, and substantially vertically sidewall portions. In the illustrative embodiment, bottom electrode 2004 is U-shaped with an opening facing via electrode 2014. The base portion, and substantially vertical sidewall portions are of substantially a same thickness.

Trench capacitor 2002 further includes a ferroelectric or a paraelectric dielectric layer (herein dielectric layer 2006) directly adjacent to a bottom electrode 2004. As shown, dielectric layer 2006 is substantially conformal to bottom electrode 2004. In the illustrative embodiment, dielectric layer 2006 is U-shaped with an opening facing via electrode 2014.

Trench capacitor 2002 further includes a second electrode (herein top electrode 2008) directly in contact with dielectric layer 2006. Top electrode 2008 fills a space between portions of dielectric layer 2006 that are conformal with bottom electrode 2004. In the illustrative embodiment, top electrode 2008 is substantially cylindrical in shape. The arrangement of bottom electrode 2004, dielectric layer 2006, and top electrode 2008 produces a substantially uniform electric field between bottom electrode 2004 and top electrode 2008, during operation.

Trench capacitors 2002 can be advantageous over parallel plate capacitors, such as memory device 108, because trench capacitors 2002 have greater surface area for charge storage for a given footprint. However, to obtain charge storage benefits, trench capacitors 2002 can be substantially taller than planar capacitors by at least 3 times, for example.

Trench capacitors 2002 include a same or substantially the same material as layers of memory device 108 described above. For example, bottom electrode 2004, dielectric layer 2006, and top electrode 2008 individually include a material that is the same or substantially the same as the material of bottom electrode 128, dielectric layer 130, and top electrode 132, respectively, described in association with FIG. 1E.

In the illustrative embodiment, trench capacitors 2002 are laterally surrounded by a respective dielectric spacer 2012. Dielectric spacer 2012 is in contact with bottom electrode 2004 and extends along full vertical extent of bottom electrode 2004. In some embodiments, dielectric spacer 2012 includes a material that is the same or substantially the same as the material of encapsulation layer 116 (FIG. 1A). In the illustrative embodiment, dielectric spacer 2012 has uppermost surface 2012A that is coplanar or substantially coplanar with uppermost surfaces 2004A, 2006A, and 2008A, bottom electrode 2004, dielectric layer 2006, and top electrode 2008, respectively.

In the illustrative embodiment, two trench capacitors 2002 are shown coupled with a single conductive interconnect 102 through plate electrode 110 and electrode structure 112. Collectively, conductive interconnect 102, electrode structure 112 and plate electrode 110 have one or more features described above (FIG. 1A).

Trench capacitors 2002 are embedded within dielectric 2013. In some embodiments, dielectric 2013 includes $SiO_2$, SiOC, SiC, or $SiO_2$ doped with F. In other embodiments, dielectric 2013 includes an insulator material including a metal and oxygen, for example, $Al_xO_y$, $HfO_x$, $AlSiO_x$, $ZrO_x$, $TiO_x$, $AlSiO_x$, $HfSiO_x$, $TaSiO_x$, or a metal and a nitrogen, for example, AlN, ZrN, or HfN. In some such embodiments, dielectric spacer can be removed.

Trench capacitors 2002 are individually coupled with via electrode 2014. Via electrode 2014 includes one or more features of via electrode 118 (FIG. 1A). In the illustrative embodiment, via electrode 2014 includes conductive hydrogen barrier 2016, liner layer 2018 and conductive fill material 2020. In one or more embodiments, conductive hydrogen barrier 2016, liner layer 2018, and conductive fill material 2020 individually include a material that is the same or substantially the same as the material of conductive hydrogen barrier 120, liner layer 122 and conductive fill material 124, respectively, as described in association with FIG. 1A. Referring again to FIG. 20A, via electrode 2014 is in contact with top electrode 2008. In other embodiments, a portion of via electrode 2014 can be in contact with some or all of uppermost surface 2006A of dielectric layer 2006.

Via electrode 202 is laterally surrounded by dielectric 2022. In various embodiments, dielectric 2022 includes a material that has hydrogen barrier properties. Dielectric 2022 may include a insulator material including metal and oxygen, for example, $Al_xO_y$, $HfO_x$, $AlSiO_x$, $ZrO_x$,$TiO_x$, $AlSiO_x$, $HfSiO_x$, $TaSiO_x$, or metal and nitrogen, for example, AlN, ZrN, or HfN, or a nonmetal containing compound such as SiN, or SiN doped with carbon.

Bottom electrode 2004 and dielectric layer 2006 are a substantially U-shaped, and the top electrode 2008 is substantially cylindrical, as shown.

FIG. 20B is an isometric illustration of the device structure 2000 illustrated in FIG. 20A. Dielectric 103, conductive interconnect 102 and dielectric spacer 2012 are not illustrated, for clarity. In the illustrative embodiment, plate electrode 110 has a rectangular cross-sectional profile. As shown, trench capacitors 2002 are cylindrical, and plate electrode 110 extends beyond perimeters of trench capacitors 2002. Plate electrode 110 has a width, $W_{EP}$, that is greater than width or diameter $W_{MD}$, of trench capacitor 2002.

In the illustrative embodiment, top electrode 2008 (under via electrode 2014) is surrounded by an annular ring of the dielectric layer 2006. Annular ring of the dielectric layer 2006 is further surrounded by bottom electrode 2004.

FIG. 20C is a cross-sectional illustration of device structure 2030, in accordance with an embodiment of the present disclosure. Device structure 2030 includes one or more elements of device structure 2000 (FIG. 20A), such as conductive interconnect 102, electrode structure 112, plate electrode 110 and via electrodes 2014. Device structure further includes a plurality of trench capacitors 2032. Individual trench capacitors 2032 further includes a conductive hydrogen barrier 2034 on an uppermost surface of plate electrode 110 and on sidewalls of dielectric 2013. Trench capacitors 2032 are formed within a trench in dielectric 2013, as will be discussed below. In the illustrative embodiment, conductive hydrogen barrier 2034 is substantially U-shaped. Conductive hydrogen barrier 2034 provides protection against hydrogen diffusion from below plate electrode 110, and from dielectric 2013. As such, dielectric spacers are not included in device structure 2030. In some embodiments, dielectric spacer may be included to reduce a lateral thickness or diameter of trench capacitors 2032. Trench capacitors 2032 further include bottom electrode 2004, that is substantially U-shaped, and on conductive hydrogen barrier 2034. Other components of trench capacitors 2032 include dielectric layer 2006 and top electrode 2008.

FIG. 20D is a cross-sectional illustration of a device structure 2040, in accordance with an embodiment of the present disclosure. device structure 2040 includes all of the elements of device structure 2000. Additionally, device structure 2040 includes an encapsulation layer 2042 on plate electrode 110. Encapsulation layer 2042 is on sidewalls 110B and on uppermost surface 110A of plate electrode 110. In the illustrative embodiment, encapsulation layer 2042 is also directly in contact with dielectric spacer 2012. Depending on embodiments, encapsulation layer 2042 can include a same material as the material of dielectric spacer 2012. In other embodiments, encapsulation layer 2042 includes one of silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$, where the material is different from a material of dielectric spacer 2012.

FIG. 21A is a cross-sectional illustration of the structure in FIG. 12B following the process to form plate electrode 110, in accordance with an embodiment of the present disclosure.

In an embodiment, electrode layer 1202 (within dashed lines) is deposited on electrode structure 112 and on etch stop layer 113, in accordance with embodiments described in association with FIG. 12B. Mask 2100 is formed on electrode layer 1202. In an embodiment, mask 2100 includes a photoresist material and is formed by a lithographic process on electrode layer 1202. In an embodiment, electrode layer 1202 is patterned by plasma etch process prior to forming trench capacitors. After formation of plate electrode 110, mask 2100 may be removed.

FIG. 21B is a cross-sectional illustration of the structure in FIG. 21A following the process to form openings 2102 in dielectric 126 formed on plate electrode 110, in accordance with an embodiment of the present disclosure. Openings 2102 may be trench openings or trenches. Openings 2102 may have a circular, elliptical or a rectangular plan view profile.

In an embodiment, dielectric 126 is blanket deposited on plate electrode 110 and on etch stop layer 113. Dielectric 126 may be blanket deposited by a CVD or a PECVD process. A planarization process may be performed to planarize dielectric 126 to remove non planarity arising from topography of plate electrode 110. In an embodiment, the planarization process includes a chemical mechanical planarization process. The CMP process may form an uppermost surface 126A that is substantially planar.

Mask 2104 is formed on dielectric 126. In an embodiment, mask 2104 includes a photoresist material and is formed by a lithographic process on dielectric 126.

Openings 2102 may be formed by a plasma etch process that etches dielectric 126 but is selective to plate electrode 110. As such, uppermost surface 110A may be substantially planar. Uppermost surface 110A may not have features of uppermost surface 110A described in association with FIGS. 1G and 1J. Referring again to FIG. 21B, openings 2102 may have a circular, elliptical or a rectangular plan view profile. In some embodiments, openings 2102 can have a width, between 20 nm and 100 nm. The plasma etch may form openings 2102 which have sidewalls 2102A that are substantially vertical or flared (indicated by dashed lines 2105). In the illustrative embodiment, sidewalls 2102A are substantially vertical. After formation of openings 2102, mask 2100 is removed.

In other embodiments, plate electrode 110 can be encapsulated by an encapsulation layer 2103 prior to deposition of dielectric 126, as indicated by dashed lines. Encapsulation layer 2103 may be deposited by a CVD, PECVD, or an ALD process to a thickness of at least 1 nm. Encapsulation layer 2103 includes a material that is the same or substantially the same as the material of encapsulation layer 116 (FIG. 1A). As shown, encapsulation layer 2103 is formed on uppermost surface 110A and on sidewalls 110B. In the illustrative embodiment, blanket deposition of encapsulation layer 2103 includes depositing on etch stop layer 113 in memory region 101A and in logic region 101B.

In some such embodiments, while forming openings 2102, the plasma etch process also etches portions of encapsulation layer 2103 deposited on uppermost surface 110A after etching dielectric 126.

FIG. 21C is a cross-sectional illustration of the structure in FIG. 21B following the process to deposit layers to form trench capacitors into respective openings 2102.

In an embodiment, a dielectric spacer material is deposited in openings 2102, on sidewalls 126B, on uppermost surface 126A, and on plate electrode 110. The dielectric spacer material may include a material that is the same or substantially the same as the material of encapsulation layer 116 (FIG. 13A). A plasma etch process may be utilized to etch the dielectric spacer material to form dielectric spacer 2106. The plasma etch process removes dielectric spacer material from uppermost surface 126A and from surface 110A of plate electrode 110. Dielectric spacer 2106 may be formed along at entire sidewall of individual openings 2102, as shown. Sidewall 2106A is exposed after formation of dielectric spacer 2106.

After formation of dielectric spacer 2106, layers are deposited to form trench capacitors. In some embodiments, bottom electrode layer 2107 and top electrode layer 2111 can be deposited into openings 2102 by a PVD or a CVD process, while dielectric layer 2109 can be deposited by an ALD process due to thickness uniformity requirements. In other embodiments, an ALD process is utilized to sequentially deposit all layers within openings 2102.

In an embodiment, the ALD deposition process is performed at a temperature between 150° C. and 250° C. In an embodiment, bottom electrode layer 2107 includes a material that is the same or substantially the same as the material of bottom electrode 2004 (FIG. 20A). In an embodiment, dielectric layer 2109 includes a material that is the same or substantially the same as the material of dielectric layer 2006 (FIG. 20A). In an embodiment, top electrode layer 2111 includes a material that is the same or substantially the same as the material of top electrode 2008 (FIG. 20A).

The deposition process forms bottom electrode layer 2107 on exposed sidewalls 2106A of dielectric spacer 2106, on a base of openings 2102, on plate electrode 110, and on uppermost surface 126A. In an embodiment, bottom electrode layer 2107 is deposited to a thickness of at least 1 nm by an ALD, PAALD, or PELD process. The deposition process forms dielectric layer 2109 on the surface of bottom electrode layer 2107 and forms top electrode layer 2111 on dielectric layer 2109. An ALD deposition process may be utilized to sequentially deposit a single monolayer at a time. In an embodiment, the deposition process is carried out until dielectric layer 2109 including a ferroelectric or paraelectric nanocrystalline film having a requisite thickness between 1 nm and 30 nm is obtained.

Formation of dielectric spacer 2106 reduces an originally formed width of respective openings 2102 to a new width $W_T$. Depending on $W_T$, and on a thickness of top electrode layer 2111 to be deposited, top electrode layer 2111 may or may not fill openings 2102. In an embodiment, top electrode layer 2111 is deposited to a thickness of at least 1 nm by an ALD, PAALD, or PELD process. In the illustrative embodiment, top electrode layer 2111 fills openings 2102. In other embodiments, an additional fill material may be required to fill the space between dielectric layer 2109 that is conformally deposited on bottom electrode layer 2107.

In other embodiments, dielectric spacer 2106 is not present and bottom electrode layer 2107 is deposited on sidewalls 126B of dielectric 126.

FIG. 21D is a cross-sectional illustration of the structure in FIG. 21C following the process to form trench capacitors 2002. Trench capacitors 2002 may be formed by planarizing and removing excess trench capacitor layers deposited on and above dielectric 126. In an embodiment, a chemical mechanical polish (CMP) process is utilized. The CMP process removes top electrode layer, dielectric layer and bottom electrode layer from above dielectric 126. The planarization process isolates top electrode 2008, dielectric layer 2006 and bottom electrode 2004 within openings 2102 to form trench capacitors 2002. It is to be appreciated that a vertical thickness, $T_D$, of dielectric 126 may be reduced by the CMP process. However, dielectric 126 may be deposited to a thickness to account for losses during the CMP process.

FIG. 21E is a cross-sectional illustration of the structure in FIG. 21D following the process to form opening 2114 in dielectric 2116 above a respective trench capacitor 2002.

Dielectric 2116 is deposited on dielectric 126, and on trench capacitors 2002. In an embodiment, dielectric 2116 includes a material that is the same or substantially the same as the material of dielectric 126. In an embodiment, dielectric 2116 includes an insulative material with a hydrogen barrier property. A hydrogen barrier is essential to prevent hydrogen from reaching an uppermost portion of dielectric layer 2006. In some embodiments, dielectric 2116 includes silicon and nitrogen, or silicon, nitrogen, and carbon. In some embodiments, dielectric 2116 includes an insulator material having 90% of theoretical material density such as but not limited to $Al_xO_y$, $HfO_x$, $AlSiO_x$, $ZrO_x$, $TiO_x$, $AlSiO_X$, $HfSiO_X$, $TaSiO_X$, AlN, ZrN, or HfN.

In other embodiments, dielectric 2116 is a bilayer stack where a first layer is a hydrogen barrier layer that is directly in contact with dielectric 126 and trench capacitor 2002, and second layer, on the first layer, is a low K ILD material. Methods of depositing dielectric 2116 and choice of materials of dielectric 2116 with hydrogen barrier property or low density films have been described above.

Mask 2117 may be formed on dielectric 2116. In an embodiment, mask 2117 includes a photoresist material and is formed by a lithographic process on dielectric 2116. Openings 2114 may be formed in dielectric 2116 by a plasma etch process. It is highly desirable for the plasma etch process to be selective to top electrode 2008. In the illustrative embodiment, width, $W_C$, of openings 2114 are substantially equal to a lateral width $W_{TL}$, of top electrode 2008. Openings 2114 do not expose bottom electrode 2004. After formation of openings 2114, mask 2117 may be removed.

FIG. 21F is a cross-sectional illustration of the structure in FIG. 21E following the process to form via electrode 2118 on a respective trench capacitor 2002.

In the illustrative embodiment, conductive hydrogen barrier material is blanket deposited into openings 2114, on top electrode 2008, on uppermost surface 2116B and on sidewalls 2116A of dielectric 2116. The conductive hydrogen barrier material includes a material that is compatible with dielectric 2116 so that an interface between the conductive hydrogen barrier material and dielectric 2116 is not a source of dislocations.

In an embodiment, a liner layer material is blanket deposited in openings 2114, and on the conductive hydrogen barrier material. A layer of fill metal is deposited into the remaining portions of openings 2114 on the liner layer material.

In embodiments, the conductive hydrogen barrier material, the liner layer material and layer of fill metal are deposited by an ALD, CVD, PVD or sputter deposition process.

Following the deposition process, a planarization process is performed to remove excess materials from above dielectric 2116 to form via electrode 2014 on a respective trench capacitor 2002.

In an embodiment, the planarization process includes a chemical mechanical planarization (CMP) process. The CMP process removes layer of fill metal, liner layer material and the conductive hydrogen barrier material from uppermost surface 2116B. The planarization process isolates the materials inside openings 2114 to form conductive hydrogen barrier 2120, and conductive fill material 2124.

FIG. 21G is a cross-sectional illustration of the structure in FIG. 21F following the process to form hanging trench openings 2123 and 2125 and via opening 2127 in logic region 101B. In an embodiment, the process to form hanging trench openings 2123 and 2125 and via opening 2127 is substantially the same as the process described in association with FIGS. 16D-16E. A difference in material composition between dielectric 2116 and dielectric 126, can allow substantial etch selectivity between them. A substantial etch selectivity can enable an etch process to target etching of dielectric 2116 so that hanging trench openings 2123 and 2125 can be targeted to not recess substantially below dielectric 2116, as shown.

FIG. 21H is a cross-sectional illustration of the structure in FIG. 21G following the process to form metal lines 140 and 142, and via structure 144, in logic region 101B. In an embodiment, the process to form metal structures 140, and 142, and via structure 144 is substantially the same as the process described in association with FIG. 16F.

FIG. 22 is a plan view illustration of device structure 300 in FIG. 3, in accordance with some embodiments of the present disclosure. Memory devices 308A and 308C are on a plane defined by dashed lines B-B'. As shown memory devices 308B and 308D are on a plane defined by dashed lines C-C'.

Method of fabrication of device structure 300 is described in association with FIGS. 23A-23G.

FIG. 23A is a cross-sectional illustration of a plurality of electrode structures 112 formed above a conductive interconnect 304, in accordance with an embodiment of the present disclosure. In an embodiment, conductive interconnect 304 is formed in level 307, adjacent to etch stop layer 113, by a method that is substantially the same as the method utilized to fabricate conductive interconnect 102 illustrated in FIGS. 8A-8B. Electrode structures 306A, 306B, and 306C may be fabricated by methods described in association with FIGS. 9A-10C, or FIGS. 9A-9C, 11A-11C, in accordance with embodiments of the present disclosure. In the illustrative embodiment, electrode structures 306A, 306B, and 306C include conductive hydrogen barrier 114 and conductive fill material 115 formed on conductive hydrogen barrier 114. In other embodiments, 306A, 306B, and 306C include conductive hydrogen barrier 114 formed on conductive fill material 115 (FIG. 11C).

FIG. 23B is a cross-sectional illustration of the structure in FIG. 23A following the process to deposit an electrode layer 2302, in accordance with an embodiment of the present disclosure. In an embodiment, electrode layer 2302 includes a material that is the same or substantially the same as the material of plate electrode 110 (FIG. 1A). Electrode layer 2302 may be deposited by an ALD, PVD, or a CVD process. Electrode layer 2302 may be deposited to a thickness between (5 nm and 20 nm).

Figure 23C:
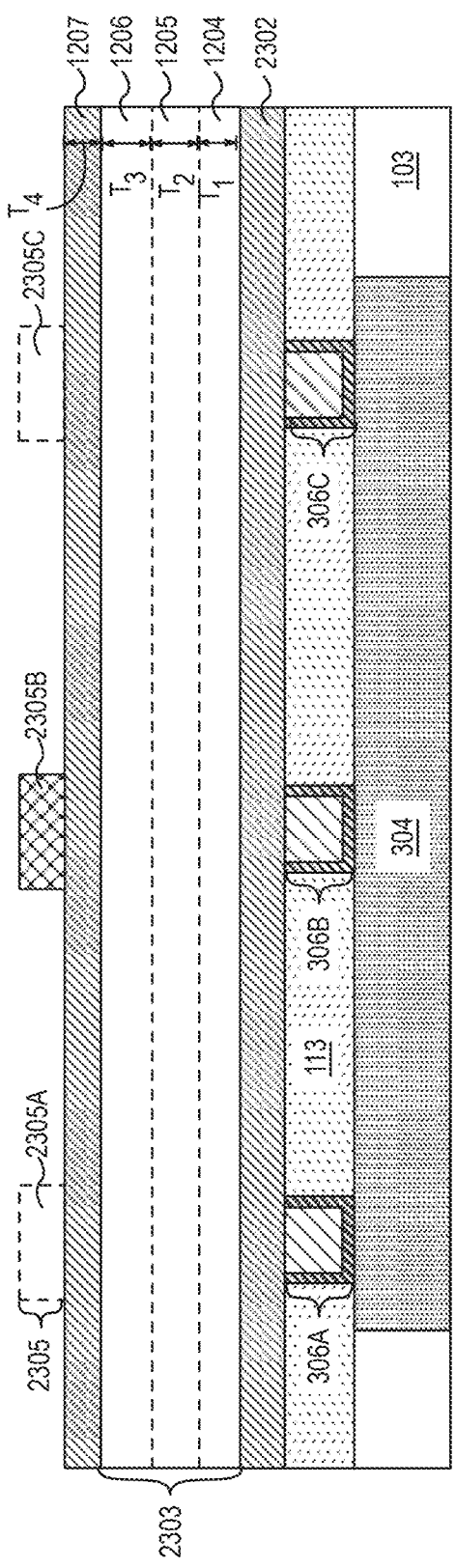
FIG. 23C is a cross-sectional illustration of the structure in FIG. 23B following the process to deposit a material layer stack on the electrode layer and a capping layer on the material layer stack, in accordance with an embodiment of the present disclosure.

FIG. 23C is a cross-sectional illustration of structure in FIG. 23B following the process to deposit material layer stack 2303 on electrode layer 2302, in accordance with an embodiment of the present disclosure. In some embodiments, material layer stack 2303 includes materials that are the same or substantially the same as the materials of material layer stack 1203 (FIG. 12C). In an embodiment, forming material layer stack 2303 includes blanket depositing conductive layer 1204 on electrode layer 1202, blanket depositing dielectric layer 1205 on conductive layer 1204 and blanket depositing conductive layer 1206 on dielectric layer 1205.

In some embodiments, such as is indicated, the deposition process concludes with the formation of a capping layer 1207 on conductive layer 1206. In some embodiments, capping layer 1207 is an in-situ blanket deposited by a PECVD, a CVD, or a PVD process on material layer stack 2303.

In some embodiments, layers within material layer stack 2303 are deposited by methods described in association with FIG. 12C.

Referring again to FIG. 23C, mask 2305 may be formed on material layer stack 2303. In an embodiment, mask 2305 includes a photoresist material and is formed by a lithographic process on electrode layer 2302. Mask portions 2305A and 2305C formed on material layer stack 2303 are aligned along a line B-B' in FIG. 22. Mask portions 2305A and 2305C formed are formed on a different plane compared to mask portion 2305B. Mask portions 2305A and 2305C are overlayed in Figure to provide context. Mask portions 2305A/2305C are shown in dashed lines to indicate that devices to be patterned by mask portion 2305A/2305C are not in the same plane as a device that is to be patterned by mask portion 2305B. Mask portions 2305A and 2305C are designed to pattern material layer stack 2303 to form memory devices 308A/308B or 308D/308E (FIG. 22).

Figure 23D:
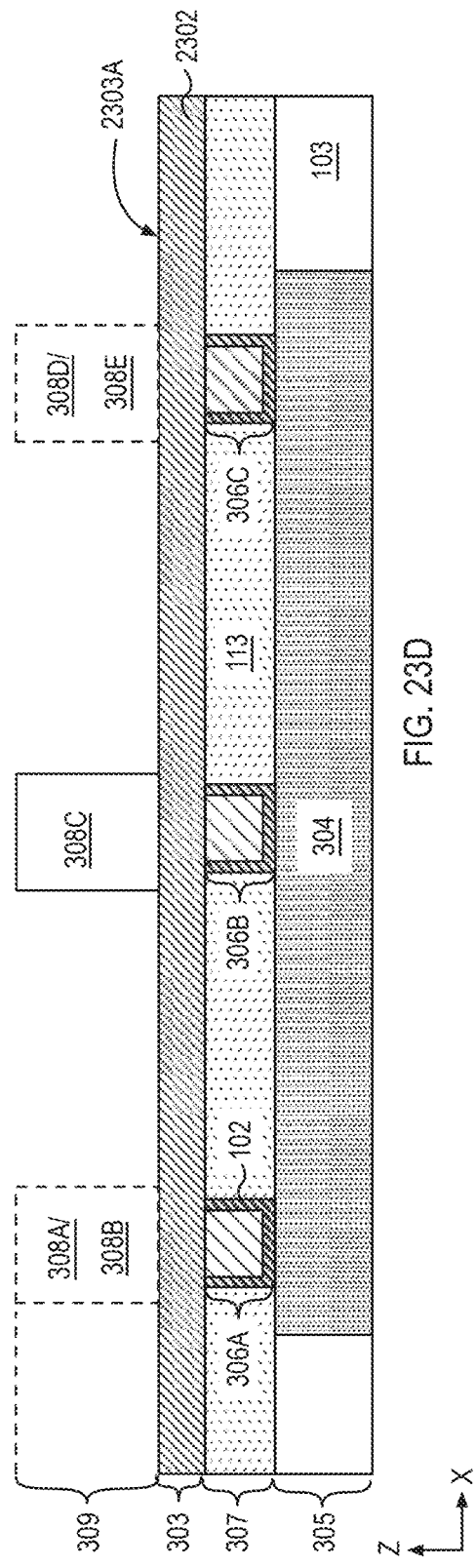
FIG. 23D is a cross-sectional illustration of the structure in FIG. 23C following the process to pattern capping layer and material layer stack to form memory devices on the electrode layer, in accordance with an embodiment of the present disclosure.

FIG. 23D is a cross-sectional illustration of the structure in FIG. 23C following the process to pattern capping layer 1207 and material layer stack 2303 to form memory devices 308A/308B, 308C, and 308D/308E on the electrode layer 2302, in accordance with an embodiment of the present disclosure. Memory devices 308A/308B, and 308D/308E are shown in dashed lines to indicate that these devices are not in the same plane as memory device 308B.

In an embodiment, methods to etch capping layer 1207 and material layer stack 2303 are described in detail in association with FIG. 12D. Referring again to FIG. 23D, in embodiments, uppermost surface 2303A of electrode layer 2302 may be recessed during fabrication of memory devices 308A/308B, 308C, and 308D/308E as illustrated in FIGS. 1G and 1H.

FIG. 23E is a cross-sectional illustration of the structure in FIG. 23D following the process to form an encapsulation layer on memory devices 308A/308B, 308C, and 308D/308E and on the electrode layer 2302. In an embodiment encapsulation layer 116 is blanket deposited on memory devices 308A/308B, 308C, and 308D/308E.

Mask 2307 may be formed on encapsulation layer 116 to pattern electrode layer 2302. In the illustrative embodiment, mask portion 2307A and 2307C are formed above memory devices 308A/308B and above memory devices 308D/308E, respectively. Mask portion 2307B is formed above memory device 308C. Mask portions 2307A, 2307B, and 2307C have a respective width that defines a respective width (along x-direction) of plate electrodes to be formed. Mask portions 2307A, 2307B, and 2307C may have a same or different widths.

FIG. 23F is a cross-sectional illustration of the structure in FIG. 23E following the process to etch the electrode layer 2302 to form plate electrodes 302A, 302B, and 302C, in accordance with an embodiment of the present disclosure.

In an embodiment, process to etch encapsulation layer 116 and electrode layer 2302 to form plate electrodes 302A, 302B, and 302C is the same or substantially the same as the process to etch encapsulation layer 116 and electrode layer 1202 to form plate electrodes 110 (FIG. 14). In the illustrative embodiment, memory devices 308A/308B, 308C, and 308D/308E are all connected to conductive interconnect 304. A via electrode may be formed above a respective memory device 308A/308B, 308C, and 308D/308E to independently program memory devices 308A/308B, 308C, and 308D/308E.

Though three plate electrodes 302A, 302B, and 302C are shown, the method described above can be utilized to form more plate electrodes that are parallel to either plate electrode 302A, 302B, or 302C. In the illustrative embodiment, plate electrodes 302A, 302B, and 302C are physically separate from each other in the X and Y directions.

Figure 23G:
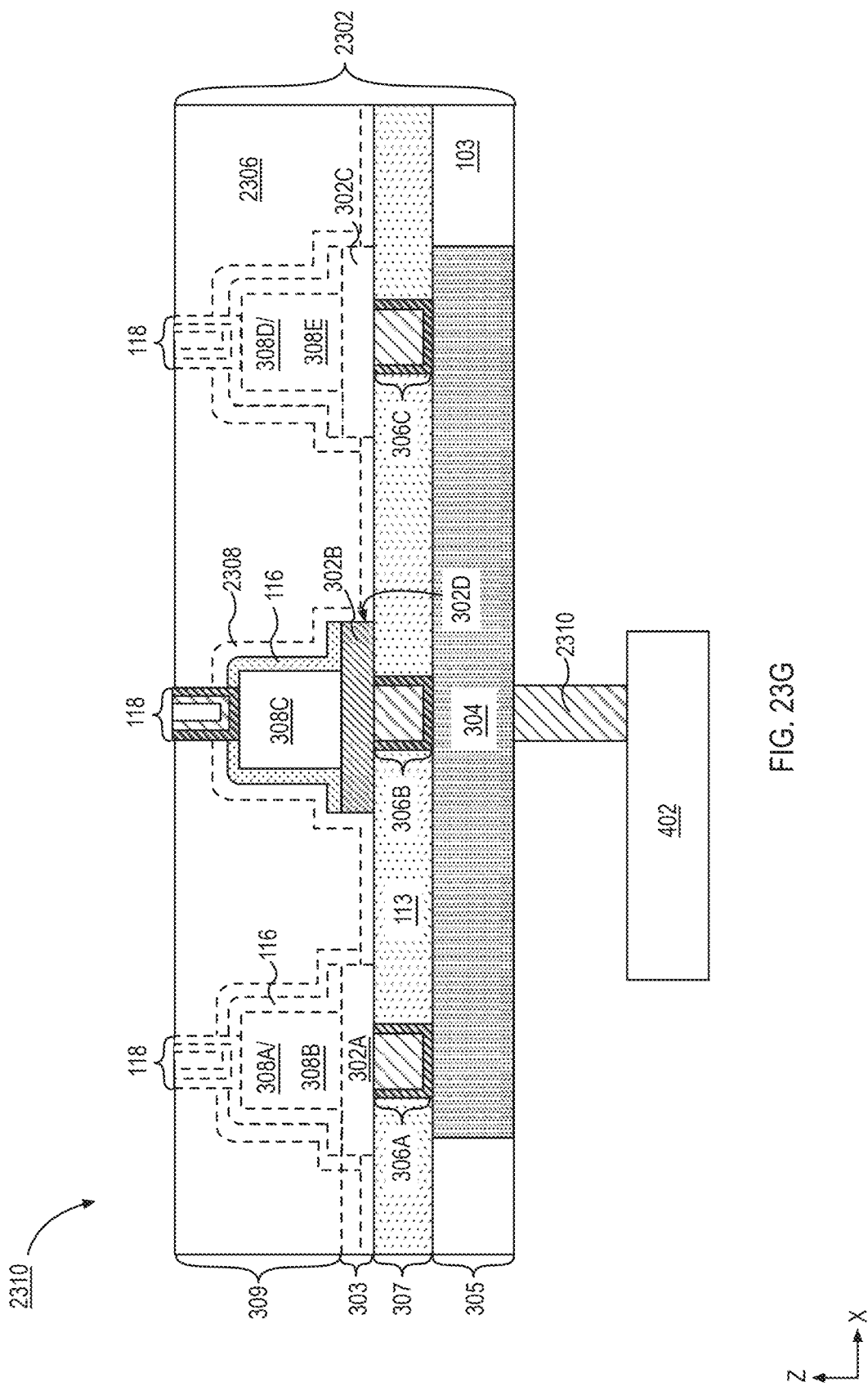
FIG. 23G is a cross-sectional illustration of the structure in FIG. 23F following the process to deposit a dielectric and to form plurality of via electrodes, in accordance with an embodiment of the present disclosure.

FIG. 23G is a cross-sectional illustration of the structure in FIG. 23F following the process to deposit dielectric 2306 and to form plurality of via electrodes 118, in accordance with an embodiment of the present disclosure.

In embodiment, dielectric 2306 includes a material that is the same or substantially the same as the material of dielectric 126 (FIG. 1A). Via electrodes 118 may be formed by a method that is the same or substantially the same as the method utilized to fabricate via electrodes 118 (FIGS. 16A-16C). In the illustrative embodiment, a via electrode 118 is formed above individual memory devices 308A/308B, 308C, and 308D/308E.

In some embodiments, an additional encapsulation layer such as encapsulation layer 2308 is deposited prior to depositing dielectric 2306. In the illustrative embodiment, encapsulation layer 2308 is formed on sidewalls 302D of plate electrode 302A, 302B, and 302C, on encapsulation layer 116, and on etch stop layer 113. Encapsulation layer 2306 may be blanket deposited on encapsulation layer 116, and on etch stop layer 113. As shown, encapsulation layer 2308 extends continuously between plate electrodes 302A, 302B, and 302C.

In some embodiments, encapsulation layer 2308 may be etched to form spacers adjacent to sidewalls 302D of individual plate electrodes 302A, 302B, and 302C (as illustrated in FIG. 110B)

In other embodiments, encapsulation layer 116 may be etched to form spacers adjacent to memory devices 108. In some such embodiments, encapsulation layer 116 is partially on plate electrodes 302A, 302B, and 302C but not on an entire uppermost surface of respective plate electrodes 302A, 302B, and 302C.

In some such embodiments, the process utilized to form via 118 is utilized to remove portions of encapsulation layer 2308 from above encapsulation layer 116 prior to depositing materials to form via electrode 118. In some embodiments, encapsulation layer 2308 includes a material that is the same or substantially the same as the material of encapsulation layer 116 (FIG. 1A). Encapsulation layer 2308 may be conformally deposited.

In the illustrative embodiment, conductive interconnect 304 extends longitudinally long the X-direction. the conductive interconnect 304 may be coupled to transistor 402 through a via electrode 2310. Conductive interconnect 304 may be coupled to a drain or a gate of transistor 402. Via electrode 2310 may include one or more features of via structure 144 (FIG. 1A).

Figure 24:
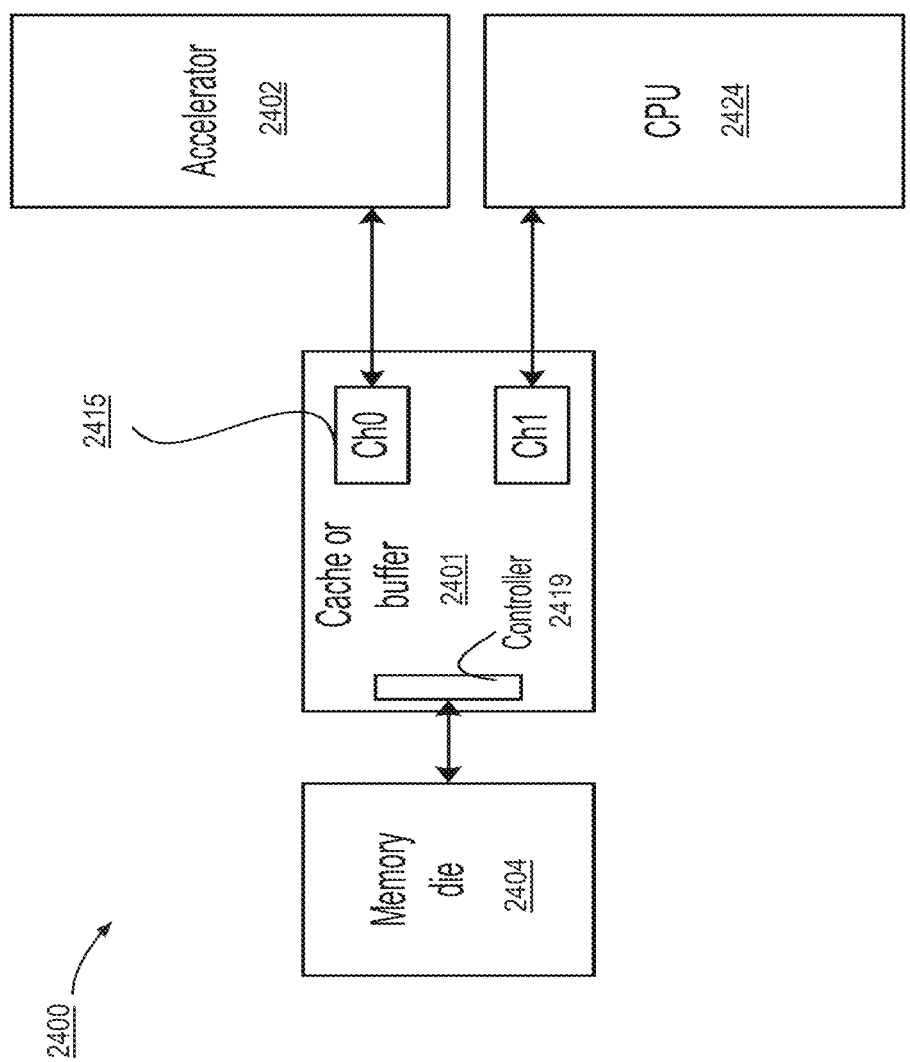
FIG. 24 illustrates a computing architecture with a coherent cache or memory-side buffer chiplet that includes a memory controller, wherein the coherent cache or memory-side buffer chiplet is coupled to an accelerator, a processor, and a memory, in accordance with some embodiments.

FIG. 24 illustrates computing architecture 2400 with a coherent cache or memory-side buffer chiplet that includes a memory controller, wherein the coherent cache or memory-side buffer chiplet is coupled to an accelerator, a processor, and a memory, in accordance with some embodiments. Computing architecture 2400 comprises coherent cache or memory-side buffer chiplet 2401, accelerator 2402 (e.g., inference chip), processor (e.g., central processing unit CPU 2424), and memory die 2404. In some embodiments, coherent cache, or memory-side buffer chiplet 2401 comprises at least two channels 2415 which are configured to connect with accelerator 2402 and CPU 2424. In some embodiments, coherent cache, or memory-side buffer chiplet 2401 comprises I/O and controller 2419 to manage data traffic with memory die 2404. By moving controller 2419 from CPU 2424 to coherent cache or memory-side buffer chiplet 2401, cost in terms of power and die area for CPU 2424 is reduced. In some embodiments, coherent cache, or memory-side buffer chiplet 2401 is a cache memory that comprises ferroelectric memory cells. For example, coherent cache or memory-side buffer chiplet 2401 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 25:
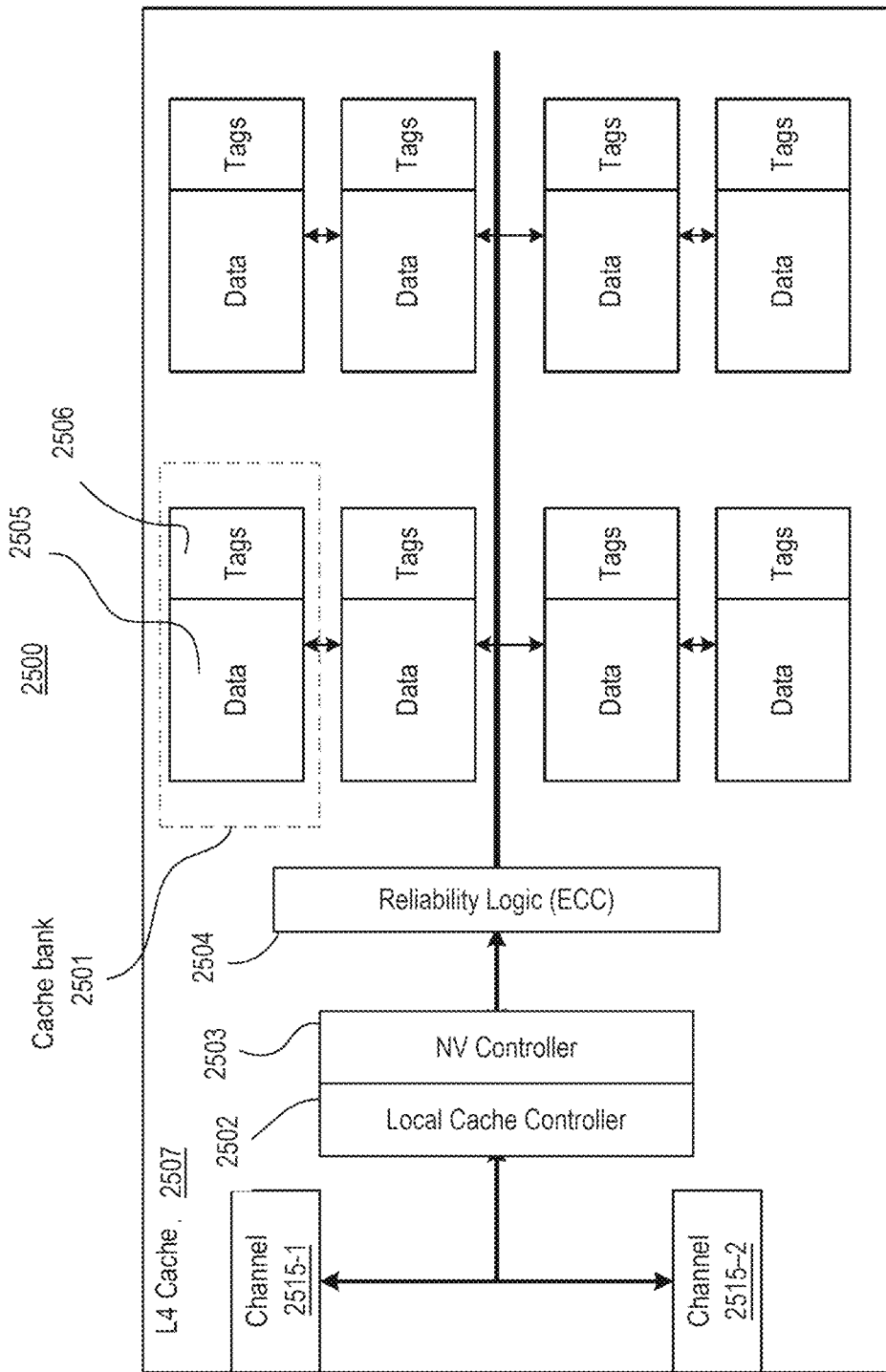
FIG. 25 illustrates an architecture of the coherent cache or memory-side buffer chiplet with multiple controllers and multiple cache banks, in accordance with some embodiments.

FIG. 25 illustrates architecture 2500 of the coherent cache or memory-side buffer chiplet (e.g., 2507) with multiple controllers and multiple cache banks, in accordance with some embodiments. In some embodiments, architecture 2500 comprises channels (e.g., ch0 2515-1 and ch1 2515-2), cache banks 2501, cache controller 2502, non-volatile (NV) controller 2503, and reliability logic 2504. Coherent cache or memory-side buffer chiplet 2507 may function as a cache or memory buffer. In some embodiments, cache lookups can map a large physical memory into a small physical cache using indirection via tags. Here, indirection refers to the use of tags to specify which address maps to which physical location. If multiple addresses can map to a single physical location, a tag is used to figure out which address is currently mapped.

In some embodiments, each cache bank 2501 includes data bank 2505 (e.g., comprising memory cells) and associated tags 2506. In some embodiments, data bank 2505 comprises ferroelectric memory cells. In some embodiments, data bank 2505 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 2505 includes ferroelectric memory, it uses NV controller 2503 and a stronger reliability logic (e.g., error correction code) for security compared to non-ferroelectric memory for data bank 2505.

When data bank 2505 is used to implement a cache, tags may be used to identify which addresses map to which physical locations in the bank. The cache may be set associative, in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, a tag 2506 may be coupled with each physical line. Tag 2506 may comprise some address bits, sufficient to uniquely identify which address currently occupies the physical line coupled with the tag.

In some embodiments, cache controller 2502 could be used to control state transitions required for cache look ups such as comparing requested addresses with tags stored in the tags 2506 and identifying a candidate for replacement (replacement algorithm) when a cache miss occurs. In addition, the cache controller could be tasked with initializing the cache when the cache powers on. When FE memory of data bank 2505, which retains state across power cycles, is used, cache controller 2502 could write 0s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 2502 would skip locations marked thus when initializing memory.

In some embodiments, reliability logic 2504 performs error correction to the data. Any suitable error correction scheme (e.g., with error correction code (ECC)) may be used by reliability logic 2504. In some embodiments, NV controller 2503 is provided to explicitly clear the cache when using a non-volatile memory, such as FM memory for data bank 2505. NV controller 2503 may include an NV bit which indicates cache lines that should not be cleared but are expected to retain their contents across power cycles. The functions of NV controller 2503 can be combined in cache controller 2502, or vice versa.

Figure 26:
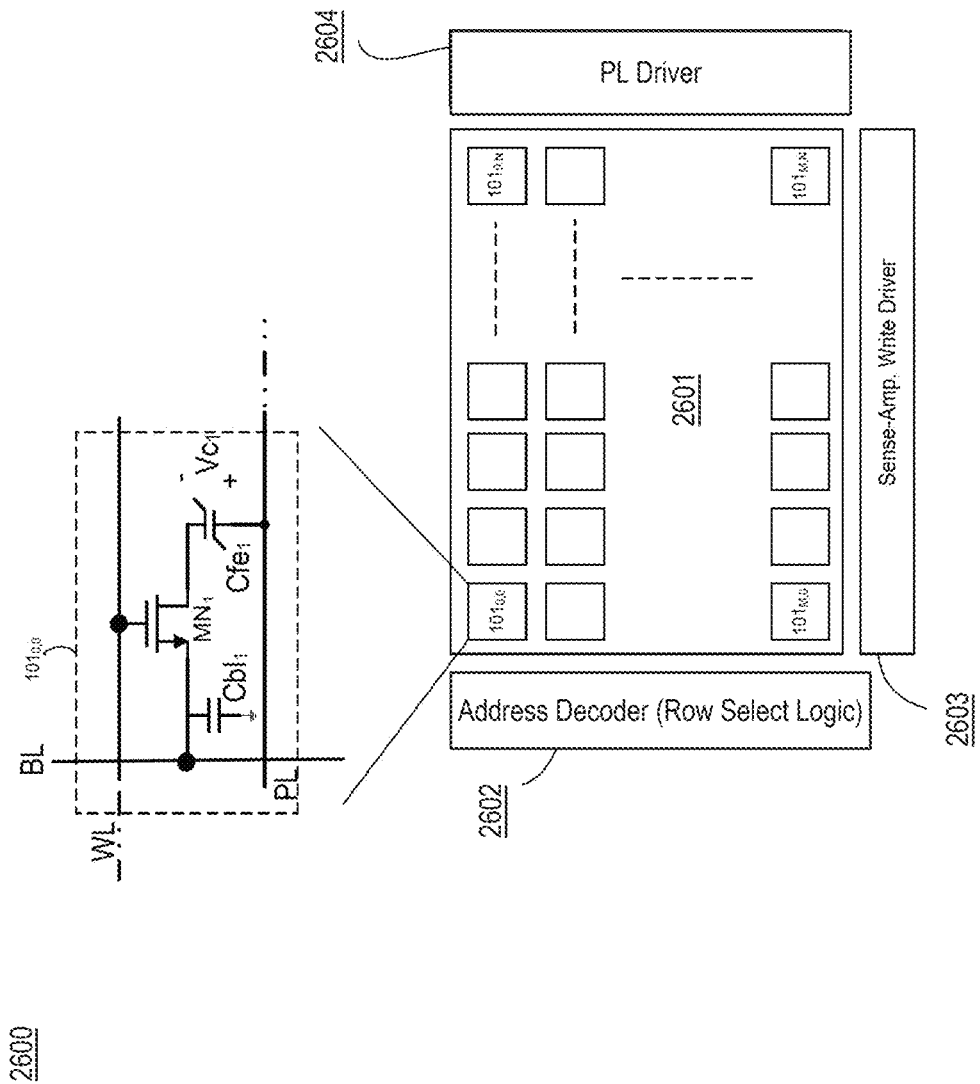
FIG. 26 illustrates an apparatus comprising memory and corresponding logic, wherein the memory comprises ferroelectric (FE) memory bit-cells, in accordance with some embodiments.

FIG. 26 illustrates apparatus 2600 comprising memory and corresponding logic, wherein the memory comprises ferroelectric (FE) memory bit-cells, in accordance with some embodiments. Apparatus 2600 comprises M×N memory array 2601 of bit-cells, logic circuitry 2602 for address decoding, sense amplifier and write drivers 2603, and plate-line (PL) driver 2604. Logic circuitry 2602 comprises address decoders for selecting a row of bit-cells and/or a particular bit-cell from M×N memory array 2601, where M and N are integers of same or different values. Logic circuitry 2602 comprises sense-amplifiers for reading the values from the selected bit-cell, while write drivers are used to write a particular value to a selected bit-cell. Here, a schematic of FE bit-cell $2601_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell $2601_{0,0}$ comprises a word-line (WL), a plate-line (PL), a bit-line (BL), a complementary bit-line (BLB), and two half bit-cells $2601_{0,0\_A}$ and $2601_{0,0\_B}$. In some embodiments, bit-cell $2601_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, a BL capacitor $CBl_1$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 27:
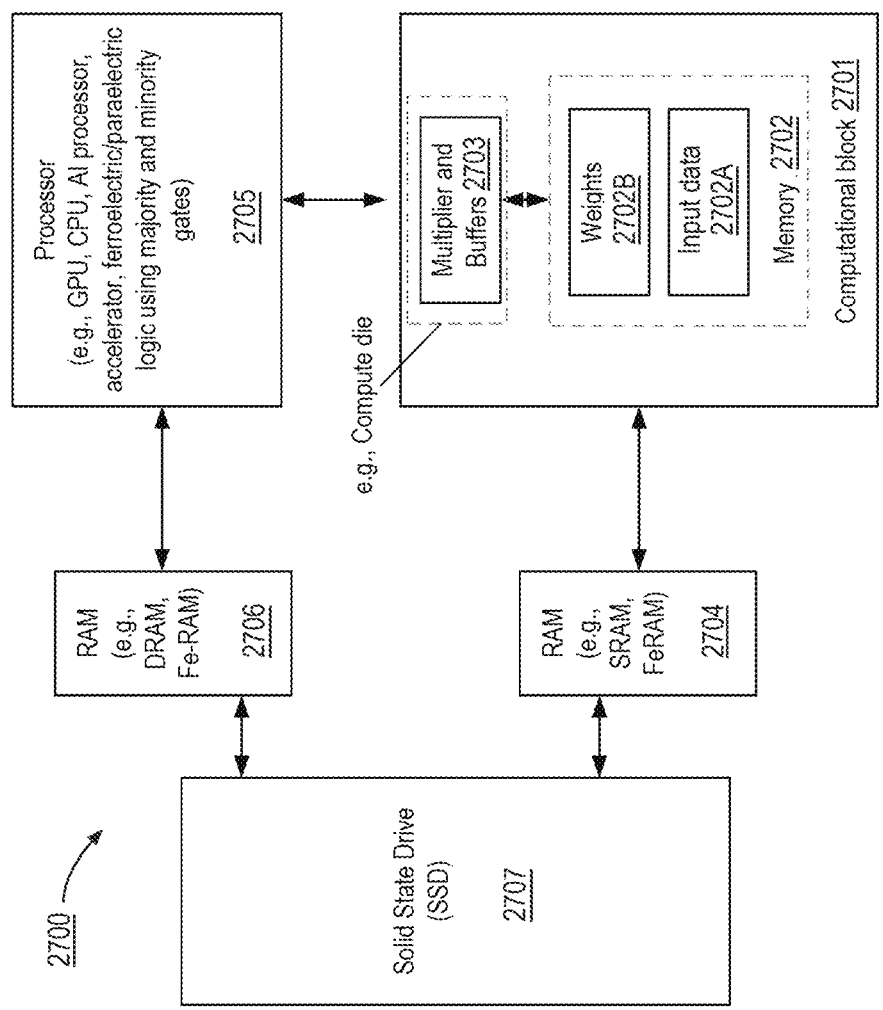
FIG. 27 illustrates a high-level architecture of an artificial intelligence (AI) machine comprising a compute die positioned on top of a memory die, in accordance with some embodiments.

FIG. 27 illustrates a high-level architecture of an artificial intelligence (AI) machine 2700 comprising a compute die positioned on top of a memory die, in accordance with some embodiments. AI machine 2700 comprises computational block 2701 or processor having memory 2702 such as random-access memory (RAM) 2702 and compute die 2703; first random-access memory 2704 (e.g., static RAM (SRAM), ferroelectric or paraelectric RAM (FeRAM), ferroelectric or paraelectric static random-access memory (FeSRAM)), main processor 2705, second random-access memory 2706 (dynamic RAM (DRAM), FeRAM), and solid-state memory or drive (SSD) 2707. In some embodiments, some or all components of AI machine 2700 are packaged in a single package forming a system-on-chip (SoC). The SoC can be configured as a logic-on-logic configuration, which can be in a 3D configuration or a 2.5D configuration.

In some embodiments, computational block 2701 is packaged in a single package and then coupled to main processor 2705 and first random-access memory 2704, second random-access memory 2706, and second 2707 on a printed circuit board (PCB). In some embodiments, computational block 2701 is configured as a logic-on-logic configuration, which can be in a 3D configuration or a 2.5D configuration. In some embodiments, computational block 2701 comprises a special purpose compute die 2703 or microprocessor. For example, compute die 2703 is a compute chiplet that performs a function of an accelerator or inference. In some embodiments, RAM 2702 is DRAM which forms a special memory/cache for the special purpose compute die 2703. The DRAM can be embedded DRAM (eDRAM) such as 1T-1C (one transistor and one capacitor) based memories. In some embodiments, RAM 2702 is ferroelectric or paraelectric RAM (Fe-RAM).

In some embodiments, compute die 2703 is specialized for applications such as Artificial Intelligence, graph processing, and algorithms for data processing. In some embodiments, compute die 2703 further has logic computational blocks, for example, for multipliers and buffers, a special data memory block (e.g., buffers) comprising DRAM, FeRAM, or a combination of them. In some embodiments, RAM 2702 has weights and inputs stored in order to improve the computational efficiency. The interconnects between main processor 2705 (also referred to as special purpose processor), First RAM 2704 and compute die 2703 are optimized for high bandwidth and low latency. The architecture of FIG. 27 allows efficient packaging to lower the energy, power, or cost and provides for ultra-high bandwidth between RAM 2702 and compute die 2703 of computational block 2701.

In some embodiments, RAM 2702 is partitioned to store input data (or data to be processed) 2702A and weights 2702B. In some embodiments, input data 2702A is stored in a separate memory (e.g., a separate memory die) and weights 2702B are stored in a separate memory (e.g., separate memory die).

In some embodiments, computational logic or compute die 2703 comprises matrix multiplier, adder, concatenation logic, buffers, and combinational logic. In various embodiments, compute die 2703 performs multiplication operation on input data 2702A and weight 2702B. In some embodiments, weights 2702B are fixed weights. For example, main processor 2705 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2702. In various embodiments, the input data 2702A, that is to be analyzed using a trained model, is processed by computational block 2701 with computed weights 2702B to generate an output (e.g., a classification result).

In some embodiments, First RAM 2704 is ferroelectric or paraelectric based SRAM. For example, a six transistor (6T) SRAM bit-cells having ferroelectric or paraelectric transistors are used to implement a non-volatile FeSRAM. In some embodiments, SSD 2707 comprises NAND flash cells. In some embodiments, SSD 2707 comprises NOR flash cells. In some embodiments, SSD 2707 comprises multi-threshold NAND flash cells.

In various embodiments, the non-volatility of FeRAM is used to introduce new features such as security, functional safety, and faster reboot time of AI machine 2700. The non-volatile FeRAM is a low power RAM that provides fast access to data and weights. First RAM 2704 can also serve as a fast storage for inference die (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 2700 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by lanthanides). In various embodiments, when the FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type $h-RMnO_3$, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: (La, Sr)CoO$_3$, SrRuO$_3$, (La, Sr)MnO$_3$, YBa$_2$Cu$_3$O$_7$, Bi$_2$Sr$_2$CaCu$_2$O$_8$, LaNiO$_3$, etc. may be used for FE material. Perovskites can be suitably doped to achieve a spontaneous distortion in a range of 0.3 to 2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when the FE material is a perovskite, the conductive oxides are of the type AA'BB'O$_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: IrO$_2$, RuO$_2$, PdO$_2$, OSO$_2$, or ReO$_3$. In some embodiments, the perovskite is doped with La or lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O.

In some embodiments, the FE material comprises one or more of: hafnium (Hf), zirconium (Zr), aluminum (Al), silicon (Si), their oxides or their alloyed oxides. In some embodiments, the FE material includes one or more of: Al(1-x)Sc(x)N, Ga(1-x)Sc(x)N, Al(1-x)Y(x) N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes one or more of: bismuth ferrite (BFO), or BFO with doping material.

In some embodiments, the FE material includes bismuth ferrite (BFO), BFO with a doping material where in the doping material is one of lanthanum, or any element from the lanthanide series of the periodic table. In some embodiments, the FE material includes a relaxor ferroelectric includes one of barium titanium-bismuth zinc niobium tantalum (BT-BZNT) or barium titanium-barium strontium titanium (BT-BST).

In some embodiments, the FE material includes hafnium oxides of the form, Hf1-x Ex Oy where E can be Al, Ca, Ce, Dy, Er, Gd, Ge, La, Sc, Si, Sr, Sn, or Y. In some embodiments, the FE material includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, polyvinylidene fluoride or polyvinylidene difluoride (PVDF).

In some embodiments, the FE material comprises hexagonal ferroelectrics of the type h-RMnO$_3$, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials SnTiO3 (STO), respectively, and LaAlO3 (LAO) and STO, respectively. For example, a super lattice of [PTO/STO]n or [LAO/STO]n, where 'n' is between 1 to 2700. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is −0.5, and y is 0.95), HfZrO2, Hf—Si—O.

Figure 28:
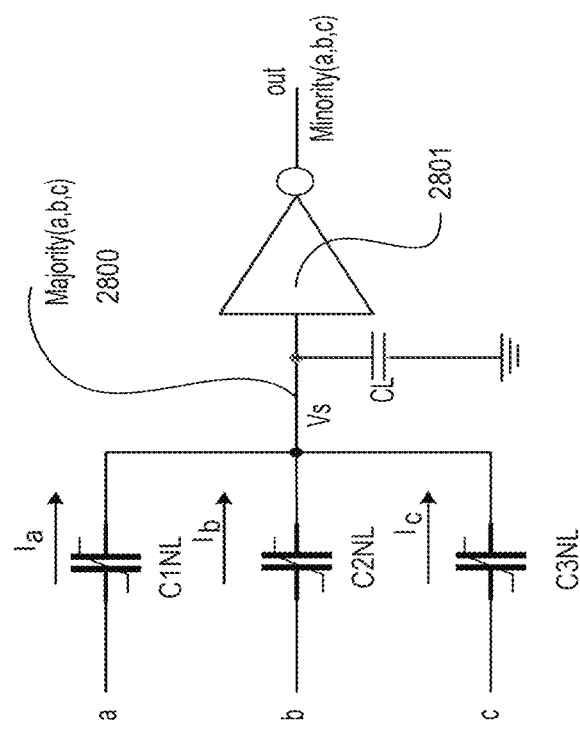
FIG. 28 illustrates a 3-input majority gate using non-linear input capacitors, in accordance with some embodiments.

FIG. 28 illustrates 3-input majority gate 2800 using non-linear input capacitors, in accordance with some embodiments. In some embodiments, 3-input majority gate 2800 comprises non-linear input capacitors C1n1, C2n1, and C3n1 that receive digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In some embodiments, 3-input majority gate 2800 comprises a driver circuitry 2801. In this example, driver circuitry 2801 is an inverter. In other embodiments, other types of driver circuitries can be used such as NAND gate, NOR gate, multiplexer, buffer, and other logic gates. The majority function is performed at summing node Vs as Majority(a,b,c). In this example, since driver circuitry 2801 is an inverter, minority function is performed at output "out" as Minority(a,b,c).

In some embodiments, in addition to the gate capacitance of driver circuitry 2801, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, paraelectric capacitor, or non-linear dielectric capacitor. A dielectric capacitor comprises first and second metal plates with a dielectric between them. Examples of such dielectrics are: HfOX, $ABO_3$ perovskites, nitrides, oxy-fluorides, oxides, etc. A paraelectric capacitor comprises first and second metal plates with a paraelectric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In some embodiments, the non-linear input capacitors C1n1, C2n1, and C3n1 comprise non-linear polar material. In some embodiments, the non-linear polar material includes one of: ferroelectric (FE) material, paraelectric material, relaxor ferroelectric, or non-linear dielectric. In various embodiments, paraelectric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as paraelectric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In some embodiments, perovskite includes one of: BaTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O28, LaNiO3, and ReO3.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: hafnium (Hf), zirconium (Zr), aluminum (Al), silicon (Si), their oxides or their alloyed oxides. In some embodiments, FE material includes one of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes bismuth ferrite (BFO) or BFO with doping material.

In some embodiments, the FE material includes bismuth ferrite (BFO), BFO with a doping material where in the doping material is one of lanthanum, or any element from the lanthanide series of the periodic table. In some embodiments, the FE material includes a relaxor ferroelectric including one of barium titanium-bismuth zinc niobium tantalum (BT-BZNT), or barium titanium-barium strontium titanium (BT-BST).

In some embodiments, the FE material includes hafnium oxides of the form, Hf1-x Ex Oy where E can be Al, Ca, Ce, Dy, Er, Gd, Ge, La, Sc, Si, Sr, Sn, or Y. In some embodiments, FE material includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include indium tin oxide (ITO) such as Sn-doped In2O3.

The charge developed on node Vs produces a voltage and current that is the output of the majority gate 2800. Any suitable driver circuitry 2801 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc. The majority function is performed at the summing node Vs, and the resulting voltage is projected on to capacitance of driver circuitry 2801. For example, the majority function of the currents ($I_a$, $I_b$, and $I_c$) on node Vs results in a resultant current that charges capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |

TABLE 1-continued

| a | b | c | Vs (f(Majority a, b, c)) |
|---|---|---|---|
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 2800. Any suitable driver circuitry 2801 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 28 illustrates a 3-input majority gate, the same concept can be extended to more than 3 inputs to make an N-input majority gate, where N is greater than 2. In various embodiments, 'N' is an odd number. For example, a 5-input majority gate is like an input majority gate 2800 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 2801 can be replaced with another majority or minority gate. In one such embodiment, the storage node Vs is directly coupled to a non-linear capacitor of another majority or minority gate.

Any logic function can be represented by two levels of logic as given by the min-term expansion:
where is either 0 or 1. When is 1, (the input is used in its original form). When is 0 (the input is used in its inverted form). The first level of logic is represented by at most AND gates, one for each of the possible combinations of 0 and 1 for. The second level of logic is represented by a single OR gate (∨). Each operand of the OR gate is a representation of a row in the truth table for.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 29:
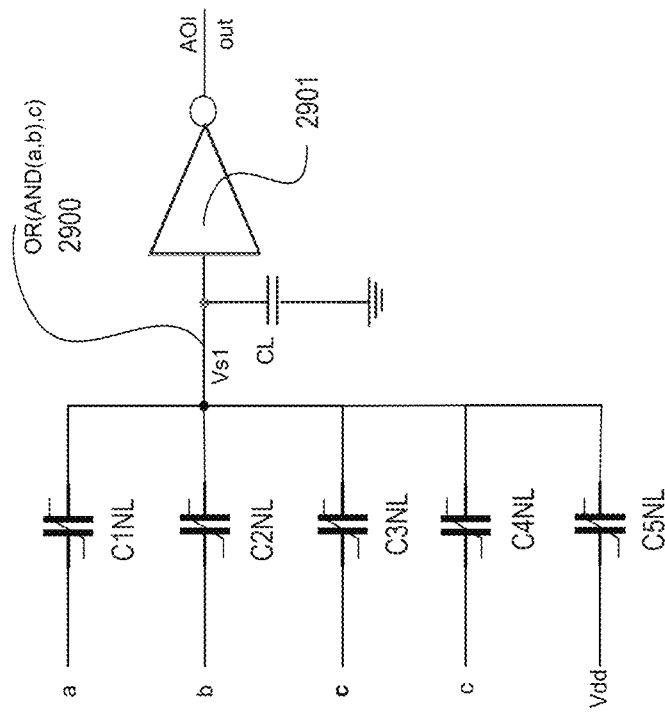
FIG. 29 illustrates a complex logic gate implemented using a 5-input majority gate, in accordance with some embodiments.

FIG. 29 illustrates complex logic gate 2900 implemented using a 5-input majority gate, in accordance with some embodiments. In some embodiments, an AOI (and-or-invert) logic comprises a 5-input majority gate. The 5-input majority gate includes non-linear capacitors C1n1, C2n1, C3n1, C4n1, and C5n1 and driving circuitry 2901 coupled as shown. In various embodiments, two of the non-linear capacitors receive the same input. Here, capacitors C3n1 and C4n1 receive input 'c'. In various embodiments, C5n1 is coupled to Vdd to produce an OR function at node Vs, where the OR function is OR(AND(a,b),c). In some embodiments, other logic gates can be realized by changing Vdd to ground for capacitor C5n1, and/or changing other inputs.

The method of forming the structures described herein are applicable to various logic embodiments. For example, the FeRAM devices or capacitive structures formed herein can be used to form other ferroelectric/paraelectric circuits. These circuits can be implemented majority gate, minority gate and/or threshold gate.

Following examples are provided that illustrate the various embodiments. The examples can be combined with other examples. As such, various embodiments can be combined with other embodiments without changing the scope of the invention.

Example 1: A device, comprising: a first region comprising: a first conductive interconnect within a first dielectric in a first level, the first conductive interconnect comprising a first lateral thickness; and a second level above the first level, the second level comprising: an electrode structure on the first conductive interconnect, the electrode structure comprising a first conductive hydrogen barrier layer and a first conductive fill material, wherein the electrode structure comprises a second lateral thickness; an etch stop layer laterally surrounding the electrode structure; a plurality of memory devices above the electrode structure, wherein individual ones of the plurality of memory devices comprise a dielectric layer comprising a perovskite material; a plate electrode coupled between the plurality of memory devices and the electrode structure, wherein the plate electrode is in direct contact with a respective lower most conductive layer of the individual ones of the plurality of memory devices; an insulative hydrogen barrier layer on at least a sidewall of the individual ones of the plurality of memory devices; and a plurality of via electrodes, wherein individual ones of the plurality of via electrodes are on a respective one of the individual ones of the plurality of memory devices, and wherein the individual ones of the plurality of via electrodes comprise: a second conductive hydrogen barrier layer comprising a lateral portion and substantially vertical portions connected to two ends of the lateral portion; and a second conductive fill material on the lateral portion and between the substantially vertical portions; a second region adjacent to the first region, the second region comprising: a second conductive interconnect within the first level and wherein the second level further comprises: a metal structure; and a via structure coupled between the second conductive interconnect and the metal structure, wherein at least a sidewall of the via structure is adjacent to the etch stop layer.

Example 2: The device of example 1, wherein the plate electrode extends beyond a first perimeter of the individual ones of the plurality of memory devices.

Example 3: The device of example 2, wherein the plate electrode extends beyond a second perimeter of the electrode structure.

Example 4: The device of example 1, wherein the plate electrode comprises a first thickness under the individual ones of the plurality of memory devices and a second thickness away from the individual ones of the plurality of memory devices.

Example 5: The device of example 3, wherein the insulative hydrogen barrier layer further comprises: a first portion that is substantially aligned with a third perimeter of the plate electrode, a second portion between the individual ones of the plurality of memory devices and a third portion on the individual ones of the plurality of memory devices.

Example 6: The device of example 1, wherein the individual ones of the plurality of memory devices are spaced apart by a distance between at least 10 nm.

Example 7: The device of example 1, wherein the electrode structure is laterally between a pair of memory devices in the plurality of memory devices.

Example 8: The device of example 1, wherein the electrode structure is directly below a memory device in the plurality of memory devices.

Example 9: The device of example 1, wherein the first region further comprises a third conductive interconnect on a same level as the first conductive interconnect, wherein the third conductive interconnect is at least partially below the plate electrode but not coupled with the plate electrode.

Example 10: The device of example 1, wherein the first region further comprises a third conductive interconnect and a fourth conductive interconnect on a same level as the first conductive interconnect, wherein the first conductive interconnect, the second conductive interconnect, and the third conductive interconnect are laterally spaced apart by a distance along a line, and wherein the second lateral thickness is less than a combined sum of the first lateral thickness and two times the distance.

Example 11: The device of example 1, wherein the plate electrode comprises: a third portion that extends along a first direction on a first plane; a fourth portion that extends parallel to the first direction, the fourth portion on a second plane, the second plane behind the first plane; and a fifth portion that extends orthogonally from the third portion to the fourth portion.

Example 12: The device of example 11, wherein the third portion is connected to a first midpoint of the third portion to a second midpoint of the fourth portion.

Example 13: The device of example 12, wherein the plate electrode comprises: a first pair of memory devices in the plurality of memory devices on the third portion; a second pair of memory devices in the plurality of memory devices on the fourth portion; and at least one memory device in the plurality of memory devices on the fifth portion.

Example 14: The device of example 11, wherein the third portion is connected to a first midpoint of the third portion to a second midpoint of the fourth portion.

Example 15: The device of example 12, wherein the plate electrode comprises: a first pair of memory devices in the plurality of memory devices on the third portion; a second pair of memory devices in the plurality of memory devices on the fourth portion; and at least one memory device in the plurality of memory devices on the fifth portion.

Example 16: The device of example 13, wherein the plate electrode comprises a first thickness under the plurality of memory devices, and a second thickness away from the individual ones of the plurality of memory devices.

Example 17: The device of example 1, wherein the individual ones of the plurality of memory devices comprise a circular, an elliptical or a rectangular plan view profile.

Example 18: The device of example 1, wherein the second lateral thickness is greater than the first lateral thickness.

Example 19: The device of example 1, wherein the second lateral thickness is less than the first lateral thickness.

Example 20: The device of example 1, wherein the perovskite material comprises: bismuth ferrite (BFO) or BFO with a first doping material where in the first doping material is one of lanthanum, or elements from lanthanide series of periodic table; lead zirconium titanate (PZT), or PZT with a second doping material, wherein the second doping material is one of: La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x)Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 and 100; or a paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 21: The device of example 1, wherein the individual ones of the plurality of memory devices comprise a conductive nonlinear polar material comprising one of La—Sr—CoO3, SrRuO3, La—Sr—MnO3, YBa2Cu3O7, Bi2Sr2CaCu2O8, LaNiO3, or DyScO3.

Example 22: The device of example 1, wherein the dielectric layer comprises a defect density that is less than 1e20 atoms/cm³.

Example 23: The device of example 1, wherein the insulative hydrogen barrier layer comprises silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$.

Example 24: The device of example 1, wherein the first conductive hydrogen barrier layer is between the first conductive interconnect and the first conductive fill material, and wherein the first conductive hydrogen barrier layer and the second conductive hydrogen barrier layer comprise TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO, or METGLAS series of alloys.

Example 25: The device of example 1, wherein the first conductive fill material is between the first conductive interconnect and the first conductive hydrogen barrier layer, and wherein the first conductive hydrogen barrier layer and the second conductive hydrogen barrier layer comprise TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO, or METGLAS series of alloys.

Example 26: A device, comprising: a first region comprising: a first conductive interconnect within a first dielectric in a first level, the first conductive interconnect comprising a first lateral thickness; and a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a second lateral thickness; an etch stop layer laterally surrounding the electrode structure; a plurality of memory devices above the electrode structure, wherein individual ones of the plurality of memory devices comprises a perovskite material; a plate electrode coupled between the plurality of memory devices and the electrode structure, wherein the plate electrode is in direct contact with a respective lower most conductive layer of the individual ones of the plurality of memory devices; a signal electrode on the plate electrode, wherein the signal electrode is electrically coupled with the first conductive interconnect; an insulative hydrogen barrier layer on a sidewall of the individual ones of the plurality of memory devices; and a plurality of via electrodes, wherein individual ones of the plurality of via electrodes are on a respective one of the individual ones of the plurality of memory devices, and wherein the individual ones of the plurality of via electrodes comprise: a second conductive hydrogen barrier layer comprising a lateral portion and substantially vertical portions connected to two ends of the lateral portion; and a second conductive fill material on the lateral portion and between the substantially vertical portions; a second region adjacent to the first region, the second region comprising: a second conductive interconnect within the first level and wherein the second level further comprises: a third conductive interconnect; and a via structure coupled between the second conductive interconnect and the third conductive interconnect, wherein at least a first portion of the via structure is adjacent to the etch stop layer.

Example 27: The device of example 24, wherein the signal electrode is between a pair of memory devices in the individual ones of the plurality of memory devices.

Example 28: The device of example 25, wherein the signal electrode is adjacent to the insulative hydrogen barrier layer on the sidewall of the individual ones of the plurality of memory devices.

Example 29: The device of example 24, wherein the signal electrode is at an end of the plate electrode.

Example 30: A device, comprising: a first region comprising: a first conductive interconnect within a first dielectric in a first level, the first conductive interconnect comprising a first lateral thickness; and a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a second lateral thickness; an etch stop layer laterally surrounding the electrode structure; a plurality of memory devices above the electrode structure, wherein individual ones of the plurality of memory devices comprise a perovskite material and a first sidewall; a plate electrode comprising a first uppermost surface and second sidewalls, the plate electrode coupled between the plurality of memory devices and the electrode structure, wherein the plate electrode is in direct contact with a respective lower most conductive layer of the individual ones of the plurality of memory devices; an encapsulation layer on the first sidewall and on a portion of a second uppermost surface of the individual ones of the plurality of memory devices, and on the first uppermost surface, wherein the encapsulation layer is aligned with the second sidewalls and wherein the encapsulation layer comprises an insulator material; a dielectric spacer on the second sidewalls, wherein the dielectric spacer comprises the insulator material; a plurality of via electrodes, wherein individual ones of the plurality of via electrodes are on a respective one of the individual ones of the plurality of memory devices, and wherein the individual ones of the plurality of via electrodes comprise: a second conductive hydrogen barrier layer comprising a lateral portion and substantially vertical portions connected to two ends of the lateral portion; and a second conductive fill material on the lateral portion and between the substantially vertical portions a second region adjacent to the first region, the second region comprising: a second conductive interconnect within the first level and wherein the second level further comprises: a third conductive interconnect; and a via structure coupled between the second conductive interconnect and the third conductive interconnect, wherein at least a first portion of the via structure is adjacent to the etch stop layer.

Example 31: The device of example 28, wherein the individual ones of the plurality of via electrodes are directly adjacent to the encapsulation layer on the portion of the second uppermost surface of the individual ones of the plurality of memory devices.

Example 32: The device of example 28, wherein the dielectric spacer on the second sidewalls is a first dielectric spacer portion, wherein the dielectric spacer comprises a second dielectric spacer portion separate from the first dielectric spacer portion, and wherein the second dielectric spacer portion is on the encapsulation layer and adjacent to the encapsulation layer that is adjacent to the first sidewall of the individual ones of the plurality of memory devices.

Example 2a: A method of fabricating a device structure, the method comprising: forming at least a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by a first process comprising: etching a first opening in the etch stop layer; and depositing a first conductive hydrogen barrier layer and a first conductive material in the first opening; depositing an electrode layer on the electrode structure and on the etch stop layer; forming a plurality of memory devices by depositing a material layer stack comprising a ferroelectric material or a paraelectric material on the electrode layer and etching the material layer stack; depositing an encapsulation layer on the plurality of memory devices and on the electrode layer; forming a mask over the plurality of memory devices and the electrode layer; using the mask to etch the electrode layer to form plate electrode extending beyond sidewalls of the plurality of memory devices; depositing a second dielectric on the plurality of memory devices, on the encapsulation layer and on the etch stop layer; forming a plurality of via electrodes, wherein individual ones of the plurality of via electrodes are formed on an individual ones plurality of memory devices by a second process comprising: forming a second opening in the second dielectric and in the encapsulation layer; depositing a second conductive hydrogen barrier layer and a second conductive material in the second opening; forming a hanging trench over the second conductive interconnect; forming a third opening in the second dielectric and in the etch stop layer; and depositing a third conductive material in the third opening and in the hanging trench to form a via structure on the second conductive interconnect and a metal structure on the via structure.

Example 2b: The method of example 2a, wherein depositing the material layer stack comprises depositing the ferroelectric material comprising one of: bismuth ferrite (BFO), BFO with a first doping material where in the first doping material is one of lanthanum, or elements from lanthanide series of periodic table; lead zirconium titanate (PZT), or PZT with a second doping material, wherein the second doping material is one of La or Nb; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; a hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxides as Hf1-x Ex Oy, where E can be Al, Ca, Ce, Dy, Er, Gd, Ge, La, Sc, Si, Sr, Sn, Zr, or Y; Al(1-x)Sc(x)N, Ga(1-x) Sc(x)N, Al(1-x)Y(x)N or Al(1-x-y) Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 and 100; or a paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 2c: The method of example 2a, wherein etching to form the plurality of memory devices comprises partially recessing the electrode layer to form the electrode layer having variable thickness.

Example 2d: The method of example 2a, wherein a first uppermost surface of the electrode layer is curved away from an edge of the individual ones of the plurality of memory devices.

Example 2e: The method of example 2a, wherein depositing the encapsulation layer comprises conformally depositing a material comprising silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$ on the plurality of memory devices and on the electrode layer.

Example 2f: The method of example 2d, wherein further comprises depositing the encapsulation layer on the sidewalls of the individual ones of the plurality of memory devices and wherein depositing the encapsulation layer causes portions of the encapsulation layer deposited on the sidewalls of the individual ones of the plurality of memory devices to merge.

Example 2g: The method of example 2a, further comprising forming the individual ones of the plurality of memory devices that are spaced apart by a distance that is equal to or greater than 4 times a thickness of the encapsulation layer.

Example 2h: The method of example 2a, wherein forming the mask comprises depositing a sacrificial material on the individual ones of the plurality of memory devices and lithographically patterning the sacrificial material.

Example 2i: The method of example 2a further comprising etching the encapsulation layer to form an etched encapsulation layer prior to etching the electrode layer, and then using the etched encapsulation layer to etch the electrode layer to form the plate electrode having a first perimeter that is substantially aligned with a second perimeter of the encapsulation layer.

Example 2j: The method of example 2a, wherein the plate electrode extends beyond a third perimeter of the electrode structure.

Example 2k: The method of example 2a, further comprises: forming a fourth opening by etching the second dielectric and the encapsulation layer and exposing an uppermost surface of the plate electrode; depositing a liner layer in the fourth opening and depositing a fourth conductive material in the fourth opening to form a signal electrode.

Example 2l: The method of example 2k, wherein the fourth opening is formed at one end of the plate electrode.

Example 2m: The method of example 2k, wherein the fourth opening is formed at one end of the plate electrode.

Example 2n: The method of example 2a, wherein the fourth opening is formed between a pair of memory devices in the plurality of memory devices.

Example 2o: The method of example 2a, wherein etching the first opening comprises forming the first opening with a first lateral thickness that is less than a second lateral thickness of the first conductive interconnect, and wherein etching the material layer stack further comprises forming individual ones of the plurality of memory devices having a third lateral thickness that is greater than the first lateral thickness.

Example 2p: The method of example 2a, wherein depositing the first conductive hydrogen barrier layer comprises utilizing a atomic layer deposition process to blanket deposit the first conductive hydrogen barrier layer on the first conductive interconnect and on sidewalls of the etch stop layer to form a conductive hydrogen barrier layer having a lateral portion and substantially vertical portions connected to the lateral portion, and wherein depositing the first conductive hydrogen barrier layer further comprises depositing a material comprising TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO, or METGLAS series of alloys.

Example 2q: The method of example 2a, wherein forming the electrode structure further comprises: depositing the first conductive hydrogen barrier layer on the first conductive interconnect and on sidewalls of the first opening; depositing the first conductive material on the first conductive hydrogen barrier layer; and performing a chemical mechanical planarization process to form the electrode structure that is substantially comprised of the first conductive material with a peripheral boundary comprising the first conductive hydrogen barrier layer, and wherein the first conductive material is planarized to form a second uppermost surface that is substantially co-planar with a third uppermost surface of the etch stop layer; and wherein depositing the electrode layer comprises depositing on the electrode structure and the etch stop layer that are substantially co-planar with each other.

Example 2r: A method of fabricating a device structure, the method comprising: forming at least a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by a first process comprising: etching a first opening in the etch stop layer; and depositing a first conductive hydrogen barrier layer and a first conductive material in the first opening; depositing an electrode layer on the electrode structure and on the etch stop layer; forming a plurality of memory devices by depositing a material layer stack comprising a ferroelectric material or a paraelectric material on the electrode layer and etching the material layer stack; forming a first encapsulation layer on the plurality of memory devices and on the electrode layer; forming a mask over the plurality of memory devices and the electrode layer; using the mask to etch the first encapsulation layer and the electrode layer to form a plate electrode extending beyond a sidewall of individual ones of the plurality of memory devices; depositing a second encapsulation layer on the first encapsulation layer and on sidewalls of the plate electrode; depositing a second dielectric on the plurality of memory devices, on the second encapsulation layer; forming a plurality of via electrodes, wherein individual ones of the plurality of via electrodes are formed on the individual ones of the plurality of memory devices by a second process comprising: forming a second opening in the second dielectric and in the first encapsulation layer; depositing a second conductive hydrogen barrier layer and a second conductive material in the second opening; forming a hanging trench over the second conductive interconnect; forming a third opening in the second dielectric and in the etch stop layer; and depositing a conductive material in the third opening and in the hanging trench to form a via structure on the second conductive interconnect and a metal structure on the via structure.

Example 2s: The method of example 2r, wherein depositing the second encapsulation layer further comprises blanket depositing on the second encapsulation layer above an uppermost surface of the individual ones of the plurality of memory devices and on the etch stop layer, and wherein forming the plurality of via electrodes further comprises etching the second encapsulation layer prior to etching the first encapsulation layer, and wherein forming the third opening further comprises etching the second encapsulation layer prior to etching the etch stop layer.

Example 2t: The method of example 2s, forming the first encapsulation layer further comprises depositing the first encapsulation layer on the sidewall of the individual ones of the plurality of memory devices and wherein the method further comprises etching the second encapsulation layer to form a first dielectric spacer on the sidewalls of the plate electrode.

Example 2u: The method of example 2t, wherein etching the second encapsulation layer further comprises: forming a second dielectric spacer on sidewalls of the first encapsulation layer that is deposited on sidewalls of the individual ones of the plurality of memory devices; and removing the second encapsulation layer from above the first encapsulation layer deposited on the uppermost surface of the individual ones of the plurality of memory devices and from above the etch stop layer.

Example 2v: A method of fabricating a device structure, the method comprising: forming at least a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by a first process comprising: etching a first opening in the etch stop layer; and depositing a first conductive hydrogen barrier layer and a first conductive material in the first opening; depositing an electrode layer on the electrode structure and on the etch stop layer; forming a plurality of memory devices by a second process comprising: depositing a material layer stack comprising a ferroelectric material or a paraelectric material on the electrode layer and a second conductive hydrogen barrier layer above the ferroelectric material or the paraelectric material; and etching the material layer stack; forming a dielectric spacer on sidewalls of individual ones of the plurality of memory devices; forming a mask and etching the electrode layer, wherein the mask covers the plurality of memory devices and wherein etching the electrode layer forms a plate electrode that extends beyond sidewalls of the plurality of memory devices; depositing a second dielectric on the plurality of memory devices and on the dielectric spacer; forming a plurality of via electrodes, wherein individual ones of the plurality of via electrodes are formed on an individual ones of the plurality of memory devices by a third process comprising: forming a second opening in the second dielectric; depositing a third conductive hydrogen barrier layer and a second conductive material in the second opening; forming a hanging trench over the second conductive interconnect; forming a third opening in the second dielectric, and in the etch stop layer; and depositing a conductive material in the third opening and in the hanging trench to form a via structure on the second conductive interconnect and a metal structure on the via structure.

Example 2w: The method of example 2v, wherein forming the dielectric spacer comprises: depositing an encapsulation layer comprising a dielectric material on the plurality of memory devices and on the electrode layer; and etching and removing the encapsulation layer from above the second conductive hydrogen barrier layer and from above the electrode layer.

Example 2x: The method of example 2w, wherein forming the individual ones of the plurality of via electrodes comprises forming the second opening having a first lateral thickness that is greater than a second lateral thickness of the individual ones of the plurality of memory devices.

Example 3a: A device, comprising: a first region comprising: a first conductive interconnect within a first dielectric in a first level, the first conductive interconnect comprising a first lateral thickness; and a second level above the first level, the second level comprising: an electrode structure comprising a first conductive hydrogen barrier layer and a first conductive fill material, wherein the electrode structure comprises a second lateral thickness; an etch stop layer laterally surrounding the electrode structure; a plate electrode on the electrode structure, the plate electrode extending beyond a perimeter of the electrode structure and on the etch stop layer; a second dielectric on the plate electrode and on the etch stop layer; a plurality of trenches within the second dielectric; a plurality of trench capacitors on the plate electrode, wherein individual ones of the plurality of trench capacitors is in individual ones of the plurality of trenches, and wherein the individual ones of the plurality of trench capacitors comprise: a dielectric spacer along a sidewall of the individual ones of the plurality of trenches; a first electrode on a base and on the dielectric spacer along the sidewall of the individual ones of the plurality of trenches, wherein the first electrode is in contact with the plate electrode; a dielectric layer comprising a ferroelectric material or a paraelectric material substantially conformal to the first electrode; and a second electrode in contact with the dielectric layer; a plurality of via electrodes wherein, individual ones of the plurality of via electrodes is on the second electrode of the individual ones of the plurality of trench capacitors, wherein the individual ones of the plurality of via electrodes comprise: a second conductive hydrogen barrier layer comprising a lateral portion in contact with the second electrode and substantially vertical portions connected to the lateral portion; and a second conductive fill material adjacent to the second conductive hydrogen barrier layer; and a second region adjacent to the first region, the second region comprising: a second conductive interconnect within the first dielectric in the first level and wherein the second level further comprises: a metal structure; and a via structure coupled between the second conductive interconnect and the metal structure, wherein at least a first portion of the via structure is adjacent to the etch stop layer, and a second portion of the via structure is adjacent to the second dielectric.

Example 3b: The device of example 3a, further comprising a third dielectric on the second dielectric and portions of the individual ones of the plurality of trench capacitors, wherein the third dielectric comprises a material having 90% of theoretical material density such as but not limited to $Al_xO_y$, $HfO_x$, $AlSiO_x$, $ZrO_x$, $TiO_x$, $AlSiO_x$, $HfSiO_x$, $TaSiO_x$, AlN, ZrN, HfN, or SiN.

Example 3c: The device of example 3b, wherein the metal structure and the plurality of via electrodes are laterally surrounded by the third dielectric.

Example 3d: The device of example 3a, wherein the individual ones of the plurality of trench capacitors are spaced apart by a distance between at least 10 nm.

Example 3e: The device of example 3a, wherein the electrode structure is laterally between a pair of trench capacitors in the plurality of trench capacitors.

Example 3f: The device of example 3a, wherein the electrode structure is directly below a trench capacitor in the plurality of trench capacitors.

Example 3g: The device of example 3a, wherein the plate electrode comprises: a third portion that extends along a first direction on a first plane; a fourth portion that extends parallel to the first direction, the fourth portion on a second plane, the second plane behind the first plane; and a fifth portion that extends orthogonally from the third portion to the fourth portion.

Example 3h: The device of example 3g, wherein the third portion is connected to a first midpoint of the third portion to a second midpoint of the fourth portion.

Example 3i: The device of example 3h, wherein the plate electrode comprises: a first pair of trench capacitors in the plurality of trench capacitors on the third portion; a second pair of trench capacitors in the plurality of trench capacitors on the fourth portion; and at least one trench capacitor in the plurality of trench capacitors on the fifth portion.

Example 3j: The device of example 3a, wherein the individual ones of the plurality of trench capacitors comprise a circular or an elliptical plan view profile.

Example 3k: The device of example 3a, wherein the dielectric spacer comprises silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$.

Example 3l: A device, comprising: a first region comprising: a first conductive interconnect within a first dielectric in a first level, the first conductive interconnect comprising a first lateral thickness; and a second level above the first level, the second level comprising: an electrode structure on the first conductive interconnect, the electrode structure comprising a first conductive hydrogen barrier layer and a first conductive fill material, wherein the electrode structure comprises a second lateral thickness; an etch stop layer laterally surrounding the electrode structure; a plate electrode on the electrode structure, wherein the plate electrode extends beyond a perimeter of the electrode structure and on to the etch stop layer; a second dielectric on the plate electrode; a plurality of trenches within the second dielectric; a plurality of trench capacitors, wherein individual ones of the plurality of trench capacitors is in individual ones of the plurality of trenches, and wherein the individual ones of the plurality of trench capacitors comprise: a dielectric spacer along a sidewall of the individual ones of the plurality of trenches; a first electrode on a base and on the dielectric spacer along the sidewall of the individual ones of the plurality of trenches, wherein the first electrode is in contact with the plate electrode; a dielectric layer comprising a ferroelectric material or a paraelectric material substantially conformal to the first electrode; and a second electrode in contact with the dielectric layer; an encapsulation layer comprising a dielectric material on an uppermost surface and sidewalls of the plate electrode, wherein the encapsulation layer is adjacent to the dielectric spacer; a plurality of via electrodes wherein, individual ones of the plurality of via electrodes is on the second electrode of the individual ones of the plurality of trench capacitors, wherein the individual ones of the plurality of via electrodes comprise: a second conductive hydrogen barrier comprising a lateral portion in contact with the second electrode and substantially vertical portions connected to the lateral portion; and a second conductive fill material adjacent to the second conductive hydrogen barrier; and a second region adjacent to the first region, the second region comprising: a second conductive interconnect within the first dielectric in the first level and wherein the second level further comprises: a metal structure; and a via structure coupled between the second conductive interconnect and the metal structure, wherein at least a first portion of the via structure is adjacent to the etch stop layer, and a second portion of the via structure is adjacent to the second dielectric.

Example 3m: The device of example 3l further comprising a signal electrode on the plate electrode, wherein the signal electrode is between a pair of trench capacitors in the individual ones of the plurality of trench capacitors.

Example 3n: A device, comprising: a first region comprising: a first conductive interconnect within a first dielectric in a first level, the first conductive interconnect comprising a first lateral thickness; and a second level above the first level, the second level comprising: an electrode structure on the first conductive interconnect, the electrode structure comprising a first conductive hydrogen barrier layer and a first conductive fill material, wherein the electrode structure comprises a second lateral thickness: an etch stop layer laterally surrounding the electrode structure; a plate electrode on the electrode structure, wherein the plate electrode extends beyond a perimeter of the electrode structure and on to the etch stop layer; a second dielectric on the plate electrode; a plurality of trenches within the second dielectric; a plurality of trench capacitors, wherein individual ones of the plurality of trench capacitors is in individual ones of the plurality of trenches, and wherein the individual ones of the plurality of trench capacitors comprise: a dielectric spacer along a sidewall of the individual ones of the plurality of trenches; a first electrode on a base and on the dielectric spacer along the sidewall of the individual ones of the plurality of trenches, wherein the first electrode is in contact with the plate electrode; a dielectric layer comprising a ferroelectric material or a paraelectric material substantially conformal to the first electrode; and a second electrode in contact with the dielectric layer; an encapsulation layer comprising a dielectric material on an uppermost surface and sidewalls of the plate electrode, wherein the encapsulation layer is adjacent to the dielectric spacer; a plurality of via electrodes wherein, individual ones of the plurality of via electrodes is on the second electrode of the individual ones of the plurality of trench capacitors, wherein the individual ones of the plurality of via electrodes comprise: a second conductive hydrogen barrier comprising a lateral portion in contact with the second electrode and substantially vertical portions connected to the lateral portion; and a second conductive fill material adjacent to the second conductive hydrogen barrier; and a second region adjacent to the first region, the second region comprising: a second conductive interconnect within the first dielectric in the first level and wherein the second level further comprises: a metal structure; and a via structure coupled between the second conductive interconnect and the metal structure, wherein at least a first portion of the via structure is adjacent to the etch stop layer, and a second portion of the via structure is adjacent to the second dielectric.

Example 3o: The device of example 3n, wherein the encapsulation layer is further on sidewalls of the plate electrode and on the etch stop layer.

Example 3p: The device of example 3n, wherein the encapsulation layer and the dielectric spacer comprise a same material.

Example 3q: The device of example 3n, further comprising a third dielectric on the second dielectric and portions of the individual ones of the plurality of trench capacitors, wherein the third dielectric comprises a material having 90% of theoretical material density such as but not limited to $Al_xO_y$, $HfO_x$, $AlSiO_x$, $ZrO_x$, $TiO_x$, $AlSiO_x$, $HfSiO_x$, $TaSiO_x$, AlN, ZrN, HfN, or SiN.

Example 4a: A method of fabricating a device structure, the method comprising: forming at least a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by etching a first opening in the etch stop layer and depositing a first conductive hydrogen barrier layer and a first conductive material in the first opening; depositing a conductive layer on the electrode structure and on the etch stop layer; forming a mask on the conductive layer; etching the conductive layer to form a plate electrode; depositing a second dielectric on the plate electrode and on the etch stop layer; forming a plurality of trench capacitors on the plate electrode by a process, comprising: forming a plurality of trenches in the second dielectric, wherein individual ones of the plurality of trenches expose the plate electrode; forming a dielectric spacer on sidewalls of the individual ones of the plurality of trenches; depositing a first electrode layer on a base and adjacent to the dielectric spacer, wherein the first electrode layer comprises a first conductive nonlinear polar material; depositing a dielectric layer comprising a perovskite material on the first electrode layer; depositing a second electrode layer on the dielectric layer, wherein the second electrode layer comprises a second conductive nonlinear polar material; forming a plurality of via electrodes, wherein individual ones of the plurality of via electrodes are formed on an individual ones of the plurality of trench capacitors; forming a second opening in the second dielectric and in the etch stop layer, wherein the second opening is formed above the second conductive interconnect; and depositing a conductive material in the second opening to form a via structure on the second conductive interconnect; and forming a metal structure on the via structure.

Example 4b: The method of example 4a, wherein the plate electrode comprises a first perimeter that extends beyond a second perimeter of the electrode structure.

Example 4c: The method of example 4a, wherein the conductive layer is deposited to a thickness of at least 5 nm.

Example 4d: The method of example 4b, wherein forming the plurality of trenches comprises etching the second dielectric to expose portions of an uppermost surface of the plate electrode, wherein the first perimeter extends beyond a third perimeter of the individual ones of the plurality of trenches.

Example 4e: The method of example 4a, wherein forming the plurality of trenches in the second dielectric comprises etching the second dielectric to form tapered sidewalls.

Example 4f: The method of example 4a, wherein forming the dielectric spacer comprises: conformally depositing an insulator layer comprising silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$ on the base and on the sidewalls of the individual ones of the plurality of trenches and etching and removing the insulator layer from the base.

Example 4g: The method of example 4a, wherein depositing the perovskite material comprises depositing one of: bismuth ferrite (BFO) or BFO with a first doping material where in the first doping material is one of lanthanum, or elements from lanthanide series of periodic table; lead zirconium titanate (PZT) or PZT with a second doping material, wherein the second doping material is one of La or Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; a hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxides as Hf(1-x)ExOy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100; or a paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 4h: The method of example 4a, wherein depositing the first electrode layer comprises depositing a first conductive nonlinear polar material comprising one of La—Sr—CoO3, SrRuO3, La—Sr—MnO3, YBa2Cu3O7, Bi2Sr2CaCu2O8, LaNiO3, or DyScO3 and wherein depositing the second electrode layer comprises depositing a second conductive nonlinear polar material comprising one of La—Sr—CoO3, SrRuO3, La—Sr—MnO3, YBa2Cu3O7, Bi2Sr2CaCu2O8, LaNiO3, or DyScO3.

Example 4i: The method of example 4a, wherein depositing the first electrode layer, the second electrode layer and the dielectric layer comprises utilizing one or more of an atomic layer deposition process performed at a first process temperature between 160-400 degrees Celsius, a physical vapor deposition process performed at a second process temperature between 23 degrees C.-and 400 degrees C., or a chemical vapor deposition process performed at a third process temperature between 160 degrees C.-and 400 degrees C.

Example 4j; The method of example 4a, wherein forming the plurality of trench capacitors further comprises performing a chemical mechanical planarization process to form an uppermost surface comprising the second electrode layer surrounded by an annular ring of the dielectric layer, wherein the annular ring of the dielectric layer is further surrounded by the first electrode layer, and wherein the first electrode layer and the dielectric layer are a substantially U-shaped, and the second electrode layer is substantially cylindrical.

Example 4k: The method of example 4a, further comprises: forming a third opening by etching the second dielectric and exposing an uppermost surface of the plate electrode; depositing a liner layer in the third opening and depositing a fourth conductive material in the third opening to form a signal electrode that extends from the uppermost surface of the plate electrode to uppermost surfaces of the plurality of via electrodes.

Example 4l: The method of example 4k, wherein the third opening is formed at one end of the plate electrode.

Example 4m: The method of example 4k, wherein the third opening is formed at one end of the plate electrode.

Example 4n: The method of example 4a, further comprises depositing a third dielectric comprising SiN prior to forming the plurality of via electrodes or hanging trenches.

Example 4o: A method of fabricating a device structure, the method comprising: forming at least a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by etching a first opening in the etch stop layer and depositing a first conductive hydrogen barrier layer and a first conductive material in the first opening; depositing a conductive layer on the electrode structure and on the etch stop layer; forming a mask on the conductive layer; etching the conductive layer to form a plate electrode comprising a length; depositing a second dielectric on the plate electrode and on the etch stop layer; forming a plurality of trench capacitors along the length of the plate electrode by a second process, comprising: forming a plurality of trenches in the second dielectric, wherein individual ones of the plurality of trenches expose the plate electrode; depositing a second conductive hydrogen barrier layer along a base and on sidewalls of the individual ones of the plurality of trenches; depositing a first electrode layer adjacent to the second conductive hydrogen barrier layer, wherein the first electrode layer comprises a first conductive nonlinear polar material; depositing a dielectric layer comprising a perovskite material on the first electrode layer; depositing a second electrode layer on the dielectric layer, wherein the second electrode layer comprises a second conductive nonlinear polar material; and depositing a conductive fill material adjacent to the second electrode layer; depositing a third dielectric on the second dielectric and on the plurality of trench capacitors; forming a plurality of via electrodes, wherein individual ones of the plurality of via electrodes are formed on an individual ones of the plurality of trench capacitors; forming a hanging trench in the third dielectric; forming a second opening in the second dielectric and in the etch stop layer, wherein the second opening is formed above the second conductive interconnect; and depositing a conductive material in the hanging trench and in the second opening to form a via structure on the second conductive interconnect and a metal structure in the third dielectric on the via structure.

Example 4p: The method of example 4o, wherein the third dielectric comprises SiN.

Example 4q: The method of example 4a, wherein depositing the second conductive hydrogen barrier layer comprises utilizing an atomic layer deposition process to blanket deposit the first conductive hydrogen barrier layer on the first conductive interconnect and on sidewalls of the etch stop layer to form a conductive hydrogen barrier layer having a lateral portion and substantially vertical portions connected to the lateral portion, and wherein depositing the first conductive hydrogen barrier layer further comprises depositing a material comprising TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO, or METGLAS series of alloys, wherein the second conductive hydrogen barrier layer laterally surrounds the first electrode layer, the dielectric layer and the second electrode layer.

Example 4r: The method of example 4a, wherein forming the plurality of trench capacitors further comprises performing a chemical mechanical planarization process to form an uppermost surface comprising the second electrode layer surrounded by an annular ring of the dielectric layer, wherein the annular ring of the dielectric layer is further surrounded by the first electrode layer, and wherein the annular ring of the first electrode layer is further surrounded by the second conductive hydrogen barrier layer and wherein the second conductive hydrogen barrier layer, the first electrode layer and the dielectric layer are a substantially U-shaped, and the second electrode layer is substantially cylindrical.

Example 4s: A method of fabricating a device structure, the method comprising: forming at least a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by etching a first opening in the etch stop layer and depositing a first conductive hydrogen barrier layer and a first conductive material in the first opening; depositing a conductive layer on the electrode structure and on the etch stop layer; forming a mask on the conductive layer; etching the conductive layer to form a plate electrode; depositing an encapsulation layer on the plate electrode and on the etch stop layer; depositing a second dielectric on the encapsulation layer; forming a plurality of trench capacitors on the plate electrode by a process, comprising: forming a plurality of trenches in the second dielectric and in the encapsulation layer, wherein individual ones of the plurality of trenches expose the plate electrode; forming a dielectric spacer on sidewalls of the individual ones of the plurality of trenches; depositing a first electrode layer on a base and adjacent to the dielectric spacer, wherein the first electrode layer comprises a first conductive nonlinear polar material; depositing a dielectric layer comprising a perovskite material on the first electrode layer; depositing a second electrode layer on the dielectric layer, wherein the second electrode layer comprises a second conductive nonlinear polar material; forming a via electrode on the individual ones of the plurality of trench capacitors; forming a second opening in the second dielectric, in the encapsulation layer and in the etch stop layer, wherein the second opening is formed above the second conductive interconnect; and depositing a conductive material in the second opening to form a via structure on the second conductive interconnect; and forming a metal structure on the via structure.

Example 4t: The method of example 4s, wherein depositing the encapsulation layer further comprises depositing on sidewalls of the plate electrode.

Example 4u: The method of example 4s, wherein forming the dielectric spacer comprises: conformally depositing an insulator layer comprising silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$ on the base and on the sidewalls of the individual ones of the plurality of trenches and etching and removing the insulator layer from the base.

Example 4v: The method of example 4s, wherein the encapsulation layer and the dielectric spacer comprise a same material.

Example 5a: A device, comprising: a conductive interconnect in a first level, the conductive interconnect comprising a first length along a first direction; and a second level above the first level, the second level comprising a plurality of electrode structures laterally spaced apart on the conductive interconnect along the first length, the plurality of electrode structures comprising a conductive hydrogen barrier material; a third level above the second level, the third level comprising a plurality of plate electrodes, wherein individual ones of the plurality of plate electrodes are on an individual ones of the plurality of electrode structures, wherein the individual ones of the plurality of plate electrodes have a length that extend along a second direction orthogonal to the first direction; a fourth level above the third level, the fourth level comprising: a plurality of memory devices, wherein a first individual ones of the plurality of memory devices are on a first individual one of the plurality of plate electrodes, wherein an individual memory device is on a second individual one of the plurality of plate electrodes, and wherein a second individual ones of the plurality of memory devices are on a third individual one of the plurality of plate electrodes; and an encapsulation layer on sidewalls of the first individual ones of the plurality of memory devices, on sidewall of the individual memory device, and on sidewalls of the second individual ones of the plurality of memory devices.

Example 5b: The device of example 5a, wherein the plurality of memory devices are planar capacitors comprising a bottom electrode, a dielectric layer comprising a perovskite material on the bottom electrode, and a top electrode on the dielectric layer.

Example 5c: The device of example 1, wherein the individual ones of the plurality of memory devices comprises a trench capacitor comprising a perovskite dielectric layer, wherein the trench capacitor comprises an annular structure comprising a central electrode surrounded by a dielectric layer, and wherein the dielectric layer is laterally surrounded by an outer electrode.

Example 5d: The device of example 5a, wherein individual ones of the plate electrodes extend beyond a perimeter of the respective individual ones of the plurality of electrode structures.

Example 5e: The device of example 5a, wherein the second individual one of the plurality of plate electrodes comprises a first length that is less than a second length of the first individual one of the plurality of plate electrodes or a third length of the third individual one of the plurality of plate electrodes.

Example 5f: The device of example 5a, wherein the individual ones of the plate electrodes comprise a first thickness under the individual ones of the plurality of memory devices and a second thickness away from the individual one of the plurality of memory devices.

Example 5g: The device of example 5a, wherein the individual ones of the plurality of electrode structure are directly below a respective memory device in the plurality of memory devices.

Example 5h: A device, comprising: a conductive interconnect in a first dielectric within a first level, the conductive interconnect comprising a first length along a first direction; a second level above the first level, the second level comprising: a plurality of electrode structures, wherein individual ones of the plurality of electrode structures are laterally spaced apart on the conductive interconnect along the first length, the individual ones of the plurality of electrode structures comprising a first conductive hydrogen barrier material; and an etch stop layer laterally surrounding the individual ones of the plurality of electrode structures, wherein the etch stop layer is on the conductive interconnect and on the first dielectric; a third level above the second level, the third level comprising a plurality of plate electrodes, wherein individual ones of the plurality of plate electrodes are on an individual ones of the plurality of electrode structures, wherein the individual ones of the plurality of plate electrodes have a length that extend along a second direction orthogonal to the first direction; a fourth level above the third level, the fourth level comprising: a plurality of memory devices, wherein a first individual ones of the plurality of memory devices are on a first individual one of the plurality of plate electrodes, wherein an individual memory device is on a second individual one of the plurality of plate electrodes, and wherein a second individual ones of the plurality of memory devices are on a third individual one of the plurality of plate electrodes; and an encapsulation layer on sidewalls of the first individual ones of the plurality of memory devices, on the first individual one of the plurality of plate electrodes, on sidewall of the individual memory device, on the second individual one of the plurality of plate electrodes, on sidewalls of the second individual ones of the plurality of memory devices and on the third individual one of the plurality of plate electrodes, wherein the encapsulation layer is substantially aligned with sidewalls of the first individual one of the plurality of plate electrodes, with the first individual one of the plurality of plate electrodes, and with the third individual one of the plurality of plate electrodes; a second dielectric on the encapsulation layer; a plurality of via electrodes wherein, individual ones of the plurality of via electrodes are on the individual ones of the plurality of memory devices, wherein individual ones of the plurality of via electrodes comprise a second conductive hydrogen barrier material.

Example 5i: The device of example 5h, wherein the encapsulation layer is a first encapsulation layer, and the device further comprises a second encapsulation layer, the second encapsulation layer is on sidewalls of the individual ones of the plurality of plate electrodes, on the first encapsulation layer, and on the etch stop layer.

Example 5j: The device of example 5h, wherein the second encapsulation layer extends continuously between the first individual one of the plurality of plate electrodes, the second individual one of the plurality of plate electrodes and the third individual one of the plurality of plate electrodes.

Example 5k: A system, comprising: a transistor comprising a source, gate and a drain; and a device structure coupled with the gate or the drain of the transistor, the device structure comprising: a conductive interconnect in a first dielectric within a first level, the conductive interconnect comprising a first length along a first direction; a second level above the first level, the second level comprising: a plurality of electrode structures, wherein individual ones of the plurality of electrode structures are laterally spaced apart on the conductive interconnect along the first length, the individual ones of the plurality of electrode structures comprising a first conductive hydrogen barrier material; and an etch stop layer laterally surrounding the individual ones of the plurality of electrode structures, wherein the etch stop layer is on the conductive interconnect and on the first dielectric; a third level above the second level, the third level comprising a plurality of plate electrodes, wherein individual ones of the plurality of plate electrodes are on an individual ones of the plurality of electrode structures and on a portion of the etch stop layer, wherein the individual ones of the plurality of plate electrodes have a length that extend along a second direction orthogonal to the first direction; a fourth level above the third level, the fourth level comprising: a plurality of memory devices, wherein a first individual ones of the plurality of memory devices are on a first individual one of the plurality of plate electrodes, wherein an individual memory device is on a second individual one of the plurality of plate electrodes, and wherein a second individual ones of the plurality of memory devices are on a third individual one of the plurality of plate electrodes, wherein encapsulation layer is substantially aligned with sidewalls of the first individual one of the plurality of plate electrodes, with the first individual one of the plurality of plate electrodes and with the third individual one of the plurality of plate electrodes; an encapsulation layer on sidewalls of the first individual ones of the plurality of memory devices, on the first individual one of the plurality of plate electrodes, on sidewall of the individual memory device, on the first individual one of the plurality of plate electrodes, on sidewalls of the second individual ones of the plurality of memory devices and on the third individual one of the plurality of plate electrodes, wherein the encapsulation layer is substantially aligned with sidewalls of the first individual one of the plurality of plate electrodes, with the first individual one of the plurality of plate electrodes, and with the third individual one of the plurality of plate electrodes; a second dielectric on the encapsulation layer; a plurality of via electrodes wherein, individual ones of the plurality of via electrodes are on the individual ones of the plurality of memory devices, wherein individual ones of the plurality of via electrodes comprise a second conductive hydrogen barrier material; and a via structure coupled between the transistor and the conductive interconnect.

Example 6a: A system comprising: a first region comprising: a transistor in a first level, the transistor comprising: a source; a drain; a gate between the source and the drain; a drain contact coupled with the drain; and a gate contact coupled with the gate; a memory coupled to the transistor, wherein the memory comprises: bit-cells, wherein one of the bit-cells comprises: a first conductive interconnect within a first dielectric in a second level, wherein the first conductive interconnect is electrically coupled with the gate contact, and wherein the first conductive interconnect comprises a first lateral thickness; and a third level above the second level, the third level comprising: an electrode structure on the first conductive interconnect, the electrode structure comprising a first conductive hydrogen barrier layer and a first conductive fill material, wherein the electrode structure comprises a second lateral thickness; an etch stop layer laterally surrounding the electrode structure; a plurality of memory devices above the electrode structure, wherein individual ones of the plurality of memory devices comprises a perovskite material; a plate electrode coupled between the plurality of memory devices and the electrode structure, wherein the plate electrode is in direct contact with a respective lower most conductive layer of the individual ones of the plurality of memory devices; an insulative hydrogen barrier layer on at least a sidewall of the individual ones of the plurality of memory devices; and a plurality of via electrodes, wherein individual ones of the plurality of via electrodes are on a respective one of the individual ones of the plurality of memory devices, and wherein the individual ones of the plurality of via electrodes comprise: a second conductive hydrogen barrier layer comprising a lateral portion and substantially vertical portions connected to two ends of the lateral portion; and a second conductive material on the lateral portion and between the substantially vertical portions; a second region adjacent to the first region, the second region comprising: a second conductive interconnect within the second level and wherein the third level further comprises: a metal structure; and a via structure coupled between the second conductive interconnect and the metal structure, wherein at least a sidewall of the via structure is adjacent to the etch stop layer.

Example 6b: The system of example 6a, wherein the electrode structure is directly between a memory device in the plurality of memory devices and the first conductive interconnect.

Example 6c: A system comprising: a first region comprising: a transistor in a first level, the transistor comprising: a source; a drain; a gate between the source and the drain; a drain contact coupled with the drain; and a gate contact coupled with the gate; a memory coupled to the transistor, wherein the memory comprises: bit-cells, wherein one of the bit-cells comprises: a first conductive interconnect within a first dielectric in a second level, wherein the first conductive interconnect is electrically coupled with the gate contact, and wherein the first conductive interconnect comprises a first lateral thickness; and a third level above the second level, the third level comprising: an electrode structure on the first conductive interconnect, the electrode structure comprising a first conductive hydrogen barrier layer and a first conductive fill material, wherein the electrode structure comprises a second lateral thickness; an etch stop layer laterally surrounding the electrode structure; a plate electrode on the electrode structure, the plate electrode extending beyond a perimeter of the electrode structure on the etch stop layer; a second dielectric on the plate electrode and on the etch stop layer; a plurality of trenches within the second dielectric; a plurality of trench capacitors, wherein individual ones of the plurality of trench capacitors are in individual ones of the plurality of trenches, and wherein the individual ones of the plurality of trench capacitors comprise: a dielectric spacer along a sidewall of the individual ones of the plurality of trenches; a first electrode on a base and on the dielectric spacer along the sidewall of the individual ones of the plurality of trenches, wherein the first electrode is in contact with the plate electrode; a dielectric layer comprising a ferroelectric material or a paraelectric material substantially conformal to the first electrode; and a second electrode in contact with the dielectric layer; a plurality of via electrodes wherein, individual ones of the plurality of via electrodes are on the second electrode of the individual ones of the plurality of trench capacitors, wherein individual ones of the plurality of via electrodes comprise: a second conductive hydrogen barrier layer comprising a lateral portion in contact with the second electrode and substantially vertical portions connected to the lateral portion; and a second conductive fill material adjacent to the second conductive hydrogen barrier layer; and a second region adjacent to the first region, the second region comprising: a second conductive interconnect within the second level and wherein the third level further comprises: a metal structure; and a via structure coupled between the second conductive interconnect and the metal structure, wherein at least a first portion of the via structure is adjacent to the etch stop layer.

Example 6d: A system comprising: a transistor in a first level, the transistor comprising: a source; a drain; a gate between the source and the drain; and a drain contact coupled with the drain; and a gate contact coupled with the gate; a memory coupled to the transistor, wherein the memory comprises: bit-cells, wherein one of the bit-cells comprises: a plurality of conductive interconnects laterally spaced apart by a distance, the plurality of conductive interconnects within a first dielectric in a second level, wherein an individual one of the plurality of conductive interconnects is electrically coupled with the gate contact, wherein individual ones of the plurality of conductive interconnects have a first lateral thickness; and a third level above the second level, the third level comprising: an electrode structure on the individual one of the plurality of conductive interconnects that is electrically coupled with the gate contact, wherein the electrode structure comprises a first conductive hydrogen barrier layer and a first conductive fill material, wherein the electrode structure comprises a second lateral thickness, and wherein the second lateral thickness is less than a combined sum of the first lateral thickness and two times the distance; a plurality of memory devices above the electrode structure, wherein individual ones of the plurality of memory devices comprise a perovskite material and a first sidewall; a plate electrode comprising an uppermost surface and second sidewalls, the plate electrode coupled between the plurality of memory devices and the electrode structure, wherein the plate electrode is in direct contact with a respective lower most conductive layer of the individual ones of the plurality of memory devices; an encapsulation layer on the first sidewall and on a portion of an uppermost surface of the individual ones of the plurality of memory devices, and on an uppermost surface of the plate electrode, wherein the encapsulation layer is aligned with the second sidewalls and wherein the encapsulation layer comprises an insulator material; a dielectric spacer on second sidewalls, wherein the dielectric spacer comprises the insulator material; a plurality of via electrodes, wherein individual ones of the plurality of via electrodes are on a respective one of the individual ones of the plurality of memory devices, and wherein the individual ones of the plurality of via electrodes comprise: a second conductive hydrogen barrier layer comprising a lateral portion and substantially vertical portions connected to two ends of the lateral portion; and a second conductive material on the lateral portion and between the substantially vertical portions.

Example 7a: A system comprising: a first region comprising: a transistor in a first level, the transistor comprising: a source; a drain; a gate between the source and the drain; a drain contact coupled with the drain; and a gate contact coupled with the gate; a memory coupled to the transistor, wherein the memory comprises: bit-cells, wherein one of the bit-cells comprises: a first conductive interconnect within a first dielectric in a second level, wherein the first conductive interconnect is coupled with the drain contact, and wherein the first conductive interconnect comprises a first lateral thickness; and a third level above the second level, the third level comprising: an electrode structure on the first conductive interconnect, the electrode structure comprising a first conductive hydrogen barrier layer and a first conductive fill material, wherein the electrode structure comprises a second lateral thickness; an etch stop layer laterally surrounding the electrode structure; a plurality of memory devices above the electrode structure, wherein individual ones of the plurality of memory devices comprises a perovskite material; a plate electrode coupled between the plurality of memory devices and the electrode structure, wherein the plate electrode is in direct contact with a respective lower most conductive layer of the individual ones of the plurality of memory devices; an insulative hydrogen barrier layer on at least a sidewall of the individual ones of the plurality of memory devices; and a plurality of via electrodes, wherein individual ones of the plurality of via electrodes are on a respective one of the individual ones of the plurality of memory devices, and wherein the individual ones of the plurality of via electrodes comprise: a second conductive hydrogen barrier layer comprising a lateral portion and substantially vertical portions connected to two ends of the lateral portion; and a second conductive material on the lateral portion and between the substantially vertical portions; a second region adjacent to the first region, the second region comprising: a second conductive interconnect within the second level and wherein the third level further comprises: a metal structure; and a via structure coupled between the second conductive interconnect and the metal structure, wherein at least a sidewall of the via structure is adjacent to the etch stop layer.

Example 7b: The system of example 7a, wherein the electrode structure is directly between a memory device in the plurality of memory devices and the first conductive interconnect.

Example 7c: A system comprising: a first region comprising: a transistor in a first level, the transistor comprising: a source; a drain; a gate between the source and the drain; a drain contact coupled with the drain; and a gate contact coupled with the gate; a memory coupled to the transistor, wherein the memory comprises: bit-cells, wherein one of the bit-cells comprises: a first conductive interconnect within a first dielectric in a second level, wherein the first conductive interconnect is coupled with the drain contact, and wherein the first conductive interconnect comprises a first lateral thickness; and a third level above the second level, the third level comprising: an electrode structure on the first conductive interconnect, the electrode structure comprising a first conductive hydrogen barrier layer and a first conductive fill material, wherein the electrode structure comprises a second lateral thickness; an etch stop layer laterally surrounding the electrode structure; a plate electrode on the electrode structure, the plate electrode extending beyond a perimeter of the electrode structure on the etch stop layer; a second dielectric on the plate electrode and on the etch stop layer; a plurality of trenches within the second dielectric; a plurality of trench capacitors, wherein individual ones of the plurality of trench capacitors are in individual ones of the plurality of trenches, and wherein the individual ones of the plurality of trench capacitors comprise: a dielectric spacer along a sidewall of the individual ones of the plurality of trenches; a first electrode on a base and on the dielectric spacer along the sidewall of the individual ones of the plurality of trenches, wherein the first electrode is in contact with the plate electrode; a dielectric layer comprising a ferroelectric material or a paraelectric material substantially conformal to the first electrode; and a second electrode in contact with the dielectric layer; a plurality of via electrodes wherein, individual ones of the plurality of via electrodes are on the second electrode of the individual ones of the plurality of trench capacitors, wherein individual ones of the plurality of via electrodes comprise: a second conductive hydrogen barrier layer comprising a lateral portion in contact with the second electrode and substantially vertical portions connected to the lateral portion; and a second conductive fill material adjacent to the second conductive hydrogen barrier layer; and a second region adjacent to the first region, the second region comprising: a second conductive interconnect within the second level and wherein the third level further comprises: a metal structure; and a via structure coupled between the second conductive interconnect and the metal structure, wherein at least a first portion of the via structure is adjacent to the etch stop layer.

Example 7d: A system comprising: a transistor in a first level, the transistor comprising: a source; a drain; a gate between the source and the drain; and a drain contact coupled with the drain; and a gate contact coupled with the gate; a memory coupled to the transistor, wherein the memory comprises: bit-cells, wherein one of the bit-cells comprises: a plurality of conductive interconnects laterally spaced apart by a distance, the plurality of conductive interconnects within a first dielectric in a second level, wherein an individual one of the plurality of conductive interconnects is coupled with the drain contact, wherein individual ones of the plurality of conductive interconnects have a first lateral thickness; and a third level above the second level, the third level comprising: an electrode structure on the individual one of the plurality of conductive interconnects that is coupled with the drain contact, wherein the electrode structure comprises a first conductive hydrogen barrier layer and a first conductive fill material, wherein the electrode structure comprises a second lateral thickness, and wherein the second lateral thickness is less than a combined sum of the first lateral thickness and two times the distance;

a plurality of memory devices above the electrode structure, wherein individual ones of the plurality of memory devices comprise a perovskite material and a first sidewall; a plate electrode comprising an uppermost surface and second sidewalls, the plate electrode coupled between the plurality of memory devices and the electrode structure, wherein the plate electrode is in direct contact with a respective lower most conductive layer of the individual ones of the plurality of memory devices; an encapsulation layer on the first sidewall and on a portion of an uppermost surface of the individual ones of the plurality of memory devices, and on an uppermost surface of the plate electrode, wherein the encapsulation layer is aligned with the second sidewalls and wherein the encapsulation layer comprises an insulator material; a dielectric spacer on second sidewalls, wherein the dielectric spacer comprises the insulator material; a plurality of via electrodes, wherein individual ones of the plurality of via electrodes are on a respective one of the individual ones of the plurality of memory devices, and wherein the individual ones of the plurality of via electrodes comprise: a second conductive hydrogen barrier layer comprising a lateral portion and substantially vertical portions connected to two ends of the lateral portion; and a second conductive material on the lateral portion and between the substantially vertical portions.

Example 8a: A system comprising: a processor comprising a plurality of transistors in a first level, wherein individual ones of the plurality of transistors comprise: a source; a drain; a gate between the source and the drain; and a drain contact coupled with the drain; and a gate contact coupled with the gate; a bridge structure connected between the gate contact of a first transistor in the plurality of transistors to the drain contact of a second transistor in the plurality of transistors; a bit-cell above the first transistor and the second transistor, the bit-cell comprising: a conductive interconnect within a first dielectric in a second level, wherein the conductive interconnect is electrically coupled with the bridge structure; and a third level above the second level, the third level comprising: an electrode structure on the conductive interconnect, the electrode structure comprising: a first conductive hydrogen barrier layer; and a first conductive fill material on the first conductive hydrogen barrier layer, wherein the electrode structure comprises a first lateral thickness; a plurality of memory devices above the electrode structure, wherein individual ones of the plurality of memory devices comprise: a bottom electrode; a top electrode; and a nonlinear polar dielectric between the top electrode and the bottom electrode; an insulative hydrogen barrier layer on at least a sidewall of the individual ones of the plurality of memory devices; and a plate electrode coupled between the plurality of memory devices and the electrode structure, wherein the plate electrode is in direct contact with a respective lower most conductive layer of the individual ones of the plurality of memory devices; a plurality of via electrodes, wherein individual ones of the plurality of via electrodes are on a respective one of the individual ones of the plurality of memory devices, and wherein the individual ones of the plurality of via electrodes comprise: a second conductive hydrogen barrier layer comprising a lateral portion and substantially vertical portions connected to two ends of the lateral portion; and a second conductive fill material on the lateral portion and between the substantially vertical portions.

Example 8b: The system of example 8b, wherein the top electrode and the bottom electrode comprise one of La—Sr—CoO$_3$, SrRuO$_3$, La—Sr—MnO$_3$, YBa$_2$Cu$_3$O$_7$, Bi$_2$Sr$_2$CaCu$_2$O$_8$, LaNiO$_3$, or DyScO3.

Example 8c: The system of example 8a, wherein the conductive interconnect extends longitudinally along a first direction, orthogonal to a second direction from the first transistor to the second transistor, and wherein the plate electrode extends longitudinally along a third direction orthogonal to the first direction, but parallel to the second direction.

Example 8d: A system comprising: a processor comprising a plurality of transistors in a first level, wherein individual ones of the plurality of transistors comprise: a source; a drain; a gate between the source and the drain; and a drain contact coupled with the drain; and a gate contact coupled with the gate; a bridge structure connected between the gate contact of a first transistor in the plurality of transistors to the drain contact of a second transistor in the plurality of transistors; a bit-cell above the first transistor and the second transistor, the bit-cell comprising: a conductive interconnect within a first dielectric in a second level, wherein the conductive interconnect is electrically coupled with the bridge structure; and a third level above the second level, the third level comprising: an electrode structure on the conductive interconnect, the electrode structure comprising: a first conductive hydrogen barrier layer; and a first conductive fill material on the first conductive hydrogen barrier layer, wherein the electrode structure comprises a first lateral thickness; an etch stop layer laterally surrounding the electrode structure; a plate electrode on the electrode structure, the plate electrode extending beyond a perimeter of the electrode structure on the etch stop layer; a second dielectric on the plate electrode and on the etch stop layer; a plurality of trenches within the second dielectric; a plurality of trench capacitors, wherein individual ones of the plurality of trench capacitors are in individual ones of the plurality of trenches, and wherein the individual ones of the plurality of trench capacitors comprise: a dielectric spacer along a sidewall of the individual ones of the plurality of trenches; a first electrode on a base and on the dielectric spacer along the sidewall of the individual ones of the plurality of trenches, wherein the first electrode is in contact with the plate electrode; a dielectric layer comprising a ferroelectric material or a paraelectric material substantially conformal to the first electrode; and a second electrode in contact with the dielectric layer; a plurality of via electrodes, wherein individual ones of the plurality of via electrodes are on the second electrode of the individual ones of the plurality of trench capacitors, and wherein the individual ones of the plurality of via electrodes comprise: a second conductive hydrogen barrier layer comprising a lateral portion in contact with the second electrode and substantially vertical portions connected to the lateral portion; and a second conductive fill material adjacent to the second conductive hydrogen barrier layer.

Example 8e: A system comprising: a processor comprising a plurality of transistors in a first level, wherein individual ones of the plurality of transistors comprise: a source; a drain; a gate between the source and the drain; and a drain contact coupled with the drain; and a gate contact coupled with the gate; a bridge structure connected between the gate contact of a first transistor in the plurality of transistors to the drain contact of a second transistor in the plurality of transistors; a bit-cell above the first transistor and the second transistor, the bit-cell comprising: a plurality of conductive interconnects laterally spaced apart by a distance, the plurality of conductive interconnects within a first dielectric in a second level, wherein an individual one of the plurality of conductive interconnects is coupled with the bridge structure, wherein individual ones of the plurality of conductive interconnects have a first lateral thickness; and a third level above the second level, the third level comprising: an electrode structure on the individual one of the plurality of conductive interconnects that is electrically coupled with the bridge structure, wherein the electrode structure comprises a first conductive hydrogen barrier layer and a first conductive fill material, wherein the electrode structure comprises a second lateral thickness, and wherein the second lateral thickness is less than a combined sum of the first lateral thickness and two times the distance; an etch stop layer laterally surrounding the electrode structure; a plate electrode on the electrode structure, the plate electrode extending beyond a perimeter of the electrode structure on the etch stop layer; a second dielectric on the plate electrode and on the etch stop layer; a plurality of trenches within the second dielectric; a plurality of trench capacitors, wherein individual ones of the plurality of trench capacitors are in individual ones of the plurality of trenches, and wherein the individual ones of the plurality of trench capacitors comprise: a dielectric spacer along a sidewall of the individual ones of the plurality of trenches; a first electrode on a base and on the dielectric spacer along the sidewall of the individual ones of the plurality of trenches, wherein the first electrode is in contact with the plate electrode; a dielectric layer comprising a ferroelectric material or a paraelectric material substantially conformal to the first electrode; and a second electrode in contact with the dielectric layer; a plurality of via electrodes wherein, individual ones of the plurality of via electrodes are on the second electrode of the individual ones of the plurality of trench capacitors, wherein individual ones of the plurality of via electrodes comprise: a second conductive hydrogen barrier layer comprising a lateral portion in contact with the second electrode and substantially vertical portions connected to the lateral portion; and a second conductive fill material adjacent to the second conductive hydrogen barrier layer.

Example 8f: The system of example 8e further comprising a signal electrode on the plate electrode, wherein the signal electrode is between a pair of trench capacitors in the individual ones of the plurality of trench capacitors, and wherein the signal electrode extends from and uppermost surface of the plate electrode to an uppermost surface of the plurality of via electrodes.

What is claimed is:

1. A method of fabricating a device structure, the method comprising:
    forming at least a first conductive interconnect in a first dielectric in a memory region and a second conductive interconnect in the first dielectric in a logic region;
    depositing an etch stop layer on the first dielectric and on the first conductive interconnect and on the second conductive interconnect;
    forming an electrode structure on the first conductive interconnect by a first process comprising:
        etching a first opening in the etch stop layer; and
        depositing a first conductive hydrogen barrier layer and a first conductive material in the first opening;
    depositing an electrode layer on the electrode structure and on the etch stop layer;
    forming a plurality of memory devices by depositing a material layer stack comprising a ferroelectric material or a paraelectric material on the electrode layer and etching the material layer stack, etching to form the plurality of memory devices comprises partially recessing the electrode layer to form the electrode layer having a variable thickness;
    depositing an encapsulation layer on the plurality of memory devices and on the electrode layer;
    forming a mask over the plurality of memory devices and the electrode layer;
    using the mask to etch the electrode layer to form a plate electrode extending beyond sidewalls of the plurality of memory devices;
    depositing a second dielectric on the plurality of memory devices, on the encapsulation layer and on the etch stop layer;
    forming a plurality of via electrodes, wherein individual ones of the plurality of via electrodes are formed on individual ones of the plurality of memory devices by a second process comprising:
        forming a second opening in the second dielectric and in the encapsulation layer;
        depositing a second conductive hydrogen barrier layer and a second conductive material in the second opening;
    forming a hanging trench over the second conductive interconnect;
    forming a third opening in the second dielectric and in the etch stop layer; and
    depositing a third conductive material in the third opening and in the hanging trench to form a via structure on the second conductive interconnect and a metal structure on the via structure.

2. The method of claim 1, wherein depositing the material layer stack comprises:
    depositing the ferroelectric material comprising one of:
        bismuth ferrite (BFO) or BFO with a first doping material, wherein the first doping material is one of lanthanum or elements from lanthanide series of periodic table;
        lead zirconium titanate (PZT) or PZT with a second doping material, wherein the second doping material is one of La or Nb;
        a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
        a perovskite material which includes one of: $BaTiO_3$, $PbTiO_3$, $KNbO_3$, or $NaTaO_3$; a hexagonal ferroelectric which includes one of:
        $YMnO_3$, or $LuFeO_3$;
        hexagonal ferroelectrics of a type $h-RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
        hafnium (Hf), zirconium (Zr), aluminum (Al), silicon (Si), their oxides, or their alloyed oxides; hafnium oxides as $Hf_{(1-x)}E_xO_y$, where E includes one of: Al, Ca, Ce, Dy, Er, Gd, Ge, La, Sc, Si, Sr, Sn, Zr, or Y; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$;
        y doped $HfO_2$, where y includes one of: Al, Ca, Ce, Dy, Er, Gd, Ge, La, Sc, Si, Sr, Sn, or Y;

niobate type compounds LiNbO₃, LiTaO₃, lithium iron tantalum oxy fluoride, barium strontium niobate, sodium barium niobate, or potassium strontium niobate;

an improper ferroelectric material which includes one of: [PTO/STO]n or [LAO/STO]n, where 'n' is between 1 and 100; or depositing the paraelectric material comprising SrTiO₃, Ba$_{(x)}$Sr$_{(y)}$TiO₃ (where x is −0.05, and y is 0.95), HfZrO₂, Hf—Si—O, La-substituted PbTiO₃, or a PMN-PT based relaxor ferroelectric.

3. The method of claim 1, wherein partially recessing the electrode layer comprises forming the electrode layer comprising a minimum thickness and a maximum thickness, wherein a ratio of minimum thickness to maximum thickness is at least 1:2, and wherein the maximum thickness is below a memory device of the plurality of memory devices.

4. The method of claim 1, wherein a first uppermost surface of the electrode layer is curved away from an edge of the individual ones of the plurality of memory devices.

5. The method of claim 1, wherein depositing the encapsulation layer comprises conformally depositing a material comprising silicon nitride, carbon doped silicon nitride, Al$_x$O$_y$, HfO$_x$, ZrO$_x$, TaO$_x$, TiO$_x$, AlSiO$_x$, HfSiO$_x$, or TaSiO$_x$ on the plurality of memory devices and on the electrode layer.

6. The method of claim 4 further comprises depositing the encapsulation layer on the sidewalls of the individual ones of the plurality of memory devices, wherein depositing the encapsulation layer causes portions of the encapsulation layer deposited on the sidewalls of the individual ones of the plurality of memory devices to merge.

7. The method of claim 1, further comprising forming the individual ones of the plurality of memory devices that are spaced apart by a distance that is equal to or greater than 4 times a thickness of the encapsulation layer.

8. The method of claim 1 further comprising etching the encapsulation layer to form an etched encapsulation layer prior to etching the electrode layer, and then using the etched encapsulation layer to etch the electrode layer to form the plate electrode having a first perimeter that is substantially aligned with a second perimeter of the encapsulation layer.

9. The method of claim 1, wherein the plate electrode extends beyond a third perimeter of the electrode structure.

10. The method of claim 1, further comprising:
forming a fourth opening by etching the second dielectric and the encapsulation layer and exposing an uppermost surface of the plate electrode;
depositing a liner layer in the fourth opening and depositing a fourth conductive material in the fourth opening to form a signal electrode.

11. The method of claim 10, wherein the fourth opening is formed at one end of the plate electrode.

12. The method of claim 10, wherein the fourth opening is formed between a pair of memory devices in the plurality of memory devices.

13. The method of claim 1, wherein etching the first opening comprises forming the first opening with a first lateral thickness that is less than a second lateral thickness of the first conductive interconnect, and wherein etching the material layer stack further comprises forming individual ones of the plurality of memory devices having a third lateral thickness that is greater than the first lateral thickness.

14. The method of claim 1, wherein depositing the first conductive hydrogen barrier layer comprises utilizing a atomic layer deposition process to blanket deposit the first conductive hydrogen barrier layer on the first conductive interconnect and on sidewalls of the etch stop layer to form a conductive hydrogen barrier layer having a lateral portion and substantially vertical portions connected to the lateral portion, and wherein depositing the first conductive hydrogen barrier layer further comprises depositing a material comprising TiAlN, with greater than 30 atomic percent AlN, TaN with greater than 30 atomic percent N₂, TiSiN with greater than 20 atomic percent SiN, TaC, TiC, WC, WN, carbonitrides of Ta, Ti, or W; TiO, Ti₂O, WO₃, SnO₂, indium tin oxide, indium, gallium, zinc, and oxygen, zinc oxide, or METGLAS series of alloys.

15. The method of claim 1, wherein forming the electrode structure further comprises:
depositing the first conductive hydrogen barrier layer on the first conductive interconnect and on sidewalls of the first opening;
depositing the first conductive material on the first conductive hydrogen barrier layer; and
performing a chemical mechanical planarization process to form the electrode structure that is substantially comprised of the first conductive material with a peripheral boundary comprising the first conductive hydrogen barrier layer, wherein the first conductive material is planarized to form a second uppermost surface that is substantially co-planar with a third uppermost surface of the etch stop layer; and
wherein depositing the electrode layer comprises depositing on the electrode structure and the etch stop layer that are substantially co-planar with each other.

16. A method of fabricating a device structure, the method comprising:
forming at least a first conductive interconnect in a first dielectric in a memory region and a second conductive interconnect in the first dielectric in a logic region;
depositing an etch stop layer on the first dielectric and on the first conductive interconnect and on the second conductive interconnect;
forming an electrode structure on the first conductive interconnect by a first process comprising:
etching a first opening in the etch stop layer; and
depositing a first conductive hydrogen barrier layer and a first conductive material in the first opening;
depositing an electrode layer on the electrode structure and on the etch stop layer;
forming a plurality of memory devices by depositing a material layer stack comprising a ferroelectric material or a paraelectric material on the electrode layer and etching the material layer stack, etching to form the plurality of memory devices comprises partially recessing the electrode layer to form the electrode layer having a variable thickness;
forming a first encapsulation layer on the plurality of memory devices and on the electrode layer;
forming a mask over the plurality of memory devices and the electrode layer;
using the mask to etch the first encapsulation layer and the electrode layer to form a plate electrode extending beyond a sidewall of individual ones of the plurality of memory devices;
depositing a second encapsulation layer on the first encapsulation layer;
depositing a second dielectric on the plurality of memory devices, and on the second encapsulation layer;
forming a plurality of via electrodes, wherein individual ones of the plurality of via electrodes are formed on the individual ones of the plurality of memory devices by a second process comprising:

forming a second opening in the second dielectric and in the first encapsulation layer;
depositing a second conductive hydrogen barrier layer and a second conductive material in the second opening;
forming a hanging trench over the second conductive interconnect;
forming a third opening in the second dielectric and in the etch stop layer in the logic region; and
depositing a third conductive material in the third opening and in the hanging trench to form a via structure on the second conductive interconnect and a metal structure on the via structure.

17. The method of claim 16, wherein depositing the second encapsulation layer further comprises blanket depositing on the first encapsulation layer above an uppermost surface of the individual ones of the plurality of memory devices and on the etch stop layer in the logic region, and wherein forming the plurality of via electrodes further comprises etching the second encapsulation layer prior to etching the first encapsulation layer, and wherein forming the third opening further comprises etching the second encapsulation layer prior to etching the etch stop layer.

18. The method of claim 16, wherein forming the first encapsulation layer further comprises depositing the first encapsulation layer on the sidewall of the individual ones of the plurality of memory devices and wherein the method further comprises etching the first encapsulation layer to form a first dielectric spacer on sidewalls of the plate electrode.

19. The method of claim 16, wherein the method further comprises:
etching the second encapsulation layer and forming a second dielectric spacer on sidewalls of the first encapsulation layer that is deposited on sidewalls of the individual ones of the plurality of memory devices, and forming a third dielectric spacer on sidewalls of the plate electrode; and
removing the second encapsulation layer from above the first encapsulation layer deposited on an uppermost surface of the individual ones of the plurality of memory devices and from above the etch stop layer.

20. A method of fabricating a device structure, the method comprising:
forming at least a first conductive interconnect in a first dielectric in a memory region and a second conductive interconnect in the first dielectric in a logic region;
depositing an etch stop layer on the first dielectric and on the first conductive interconnect and on the second conductive interconnect;
forming an electrode structure on the first conductive interconnect by a first process comprising:
etching a first opening in the etch stop layer; and
depositing a first conductive hydrogen barrier layer and a first conductive material in the first opening;
depositing an electrode layer on the electrode structure and on the etch stop layer;
forming a plurality of memory devices by a second process comprising:
depositing a material layer stack comprising a ferroelectric material or a paraelectric material on the electrode layer and a second conductive hydrogen barrier layer above the ferroelectric material or the paraelectric material; and
etching the material layer stack, wherein etching to form the plurality of memory devices comprises partially recessing the electrode layer to form the electrode layer having a variable thickness;
forming a dielectric spacer on sidewalls of individual ones of the plurality of memory devices;
forming a mask and etching the electrode layer, wherein the mask covers the plurality of memory devices and wherein etching the electrode layer forms a plate electrode that extends beyond sidewalls of the plurality of memory devices;
depositing a second dielectric on the plurality of memory devices and on the dielectric spacer;
forming a plurality of via electrodes, wherein individual ones of the plurality of via electrodes are formed on individual ones of the plurality of memory devices by a third process comprising:
forming a second opening in the second dielectric;
depositing a third conductive hydrogen barrier layer and a second conductive material in the second opening;
forming a hanging trench over the second conductive interconnect;
forming a third opening in the second dielectric, and in the etch stop layer in the logic region; and
depositing a third conductive material in the third opening and in the hanging trench to form a via structure on the second conductive interconnect and a metal structure on the via structure.

21. The method of claim 20, wherein forming the dielectric spacer comprises:
depositing an encapsulation layer comprising a dielectric material on the plurality of memory devices and on the electrode layer; and
etching and removing the encapsulation layer from above the second conductive hydrogen barrier layer and from above the electrode layer.

* * * * *